US012604457B2

(12) United States Patent
Masuda et al.

(10) Patent No.: US 12,604,457 B2
(45) Date of Patent: Apr. 14, 2026

(54) SEMICONDUCTOR MEMORY DEVICE

(71) Applicant: Kioxia Corporation, Tokyo (JP)

(72) Inventors: Takafumi Masuda, Kawasaki (JP); Mutsumi Okajima, Yokkaichi (JP); Nobuyoshi Saito, Tokyo (JP); Keiji Ikeda, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 389 days.

(21) Appl. No.: 18/459,978

(22) Filed: Sep. 1, 2023

(65) Prior Publication Data

US 2024/0081042 A1    Mar. 7, 2024

(30) Foreign Application Priority Data

Sep. 5, 2022    (JP) ................................. 2022-141093

(51) Int. Cl.
H10B 12/00        (2023.01)
(52) U.S. Cl.
CPC ............. H10B 12/30 (2023.02); H10B 12/02 (2023.02)
(58) Field of Classification Search
CPC ........ H10B 12/30; H10B 12/02; H10B 41/70; H10B 12/03
See application file for complete search history.

(56) References Cited

U.S. PATENT DOCUMENTS

| | | | |
|---|---|---|---|
| 9,514,792 B2 | 12/2016 | Kajigaya | |
| 9,698,272 B1 | 7/2017 | Ikeda et al. | |
| 9,806,082 B2 | 10/2017 | Tanaka et al. | |
| 10,950,295 B2 | 3/2021 | Tanaka et al. | |
| 11,227,920 B2 | 1/2022 | Yamazaki | |
| 11,238,919 B2 | 2/2022 | Wada | |
| 2020/0211631 A1 | 7/2020 | Karda et al. | |
| 2020/0227416 A1 | 7/2020 | Lilak et al. | |
| 2020/0227418 A1 | 7/2020 | Kim et al. | |
| 2020/0251151 A1* | 8/2020 | Kang ..................... H10B 12/03 |
| 2020/0411523 A1* | 12/2020 | Shin ..................... H10B 12/02 |
| 2022/0310612 A1 | 9/2022 | Okajima | |
| 2024/0038280 A1 | 2/2024 | Masuda et al. | |

FOREIGN PATENT DOCUMENTS

| | | |
|---|---|---|
| JP | 2022-147872 A | 10/2022 |
| JP | 2024-017785 A | 2/2024 |

OTHER PUBLICATIONS

U.S. Appl. No. 18/184,792, filed Mar. 16, 2023, Kioxia Corp.

* cited by examiner

*Primary Examiner* — Edward Chin
(74) *Attorney, Agent, or Firm* — Foley & Lardner LLP

(57) ABSTRACT

A semiconductor memory device comprises: a first memory layer; and a first via wiring and a second via wiring extending in a first direction, and having different positions from each other in a second direction. The first memory layer comprises: a first transistor electrically connected to the first via wiring; a memory portion electrically connected to the first transistor; a first wiring electrically connected to the first transistor; a second transistor electrically connected to the second via wiring and the first wiring; a first electrode electrically connected to the second transistor; and a second electrode electrically connected to the first wiring and first electrode. A length of the second electrode in the first direction is larger than one or both of a length of the first wiring in the first direction and a length of the first conductive layer in the first direction.

20 Claims, 77 Drawing Sheets

FIG. 6

120A $R_{MC}$ $R_{TrL}$ $R_{HU}$

SEMICONDUCTOR MEMORY DEVICE

CROSS-REFERENCE TO RELATED APPLICATIONS

This application is based upon and claims the benefit of Japanese Patent Application No. 2022-141093, filed on Sep. 5, 2022, the entire contents of which are incorporated herein by reference.

BACKGROUND

Field

Embodiments relate to a semiconductor memory device.

Description of the Related Art

As degree-of-integration of semiconductor memory devices continues to rise, study is underway into how three-dimensionality of the semiconductor memory devices may be further promoted.

BRIEF DESCRIPTION OF THE DRAWINGS

FIG. 6 is a schematic cross-sectional view showing a part of a configuration of the same semiconductor memory device;

FIG. 13 is a schematic cross-sectional view for explaining the same method of manufacturing;

FIG. 58 is a schematic cross-sectional view for explaining the same method of manufacturing;

FIG. 60 is a schematic cross-sectional view for explaining the same method of manufacturing;

FIG. 62 is a schematic cross-sectional view for explaining the same method of manufacturing;

FIG. 64 is a schematic cross-sectional view for explaining the same method of manufacturing;

FIG. 67 is a schematic cross-sectional view for explaining the same method of manufacturing;

FIG. 81 is a schematic cross-sectional view for explaining the same method of manufacturing;

FIG. 83 is a schematic cross-sectional view for explaining the same method of manufacturing;

Figure 85:
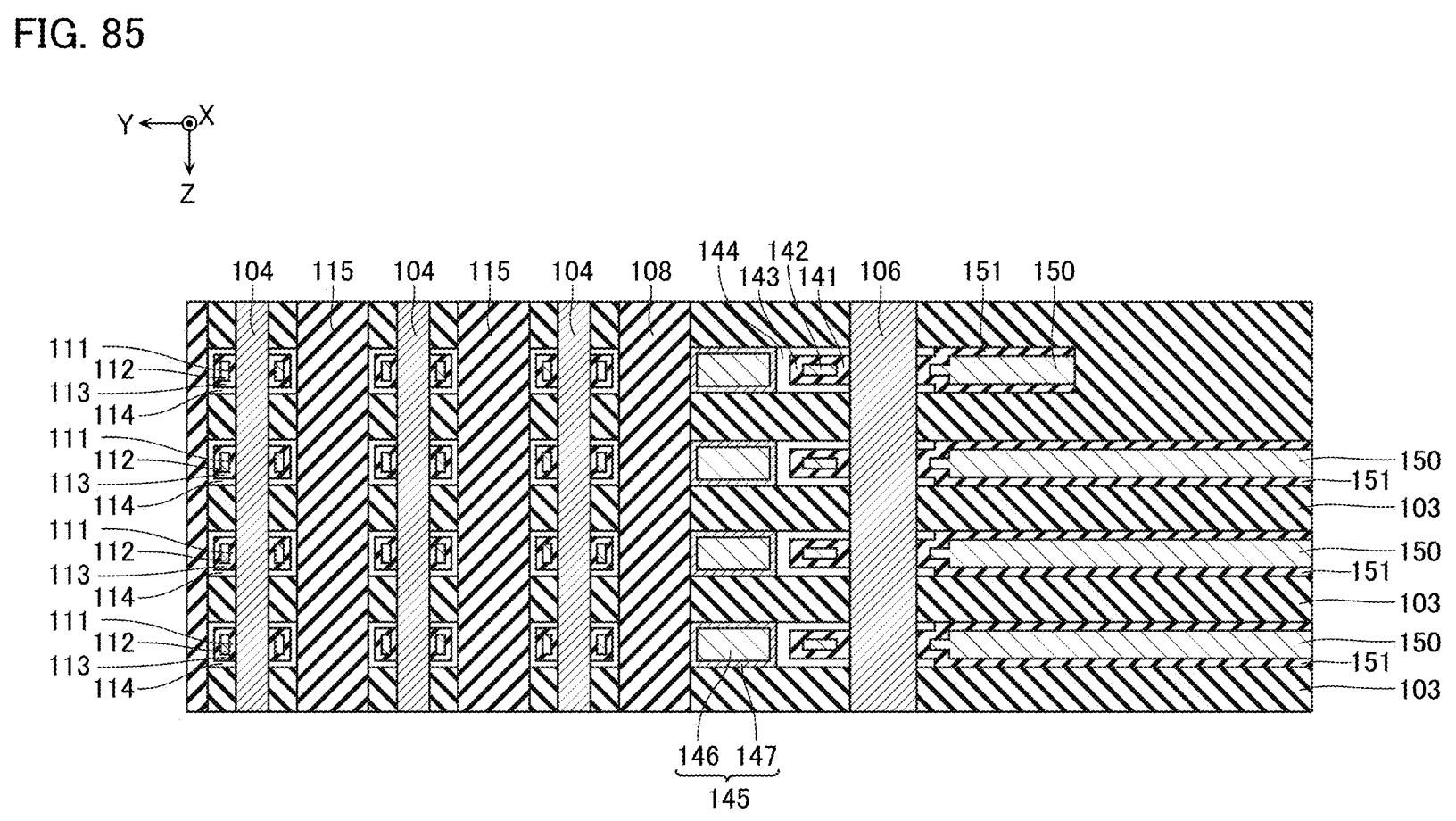

FIG. 85 is a schematic cross-sectional view for explaining the same method of manufacturing;

DETAILED DESCRIPTION

Figure 1:
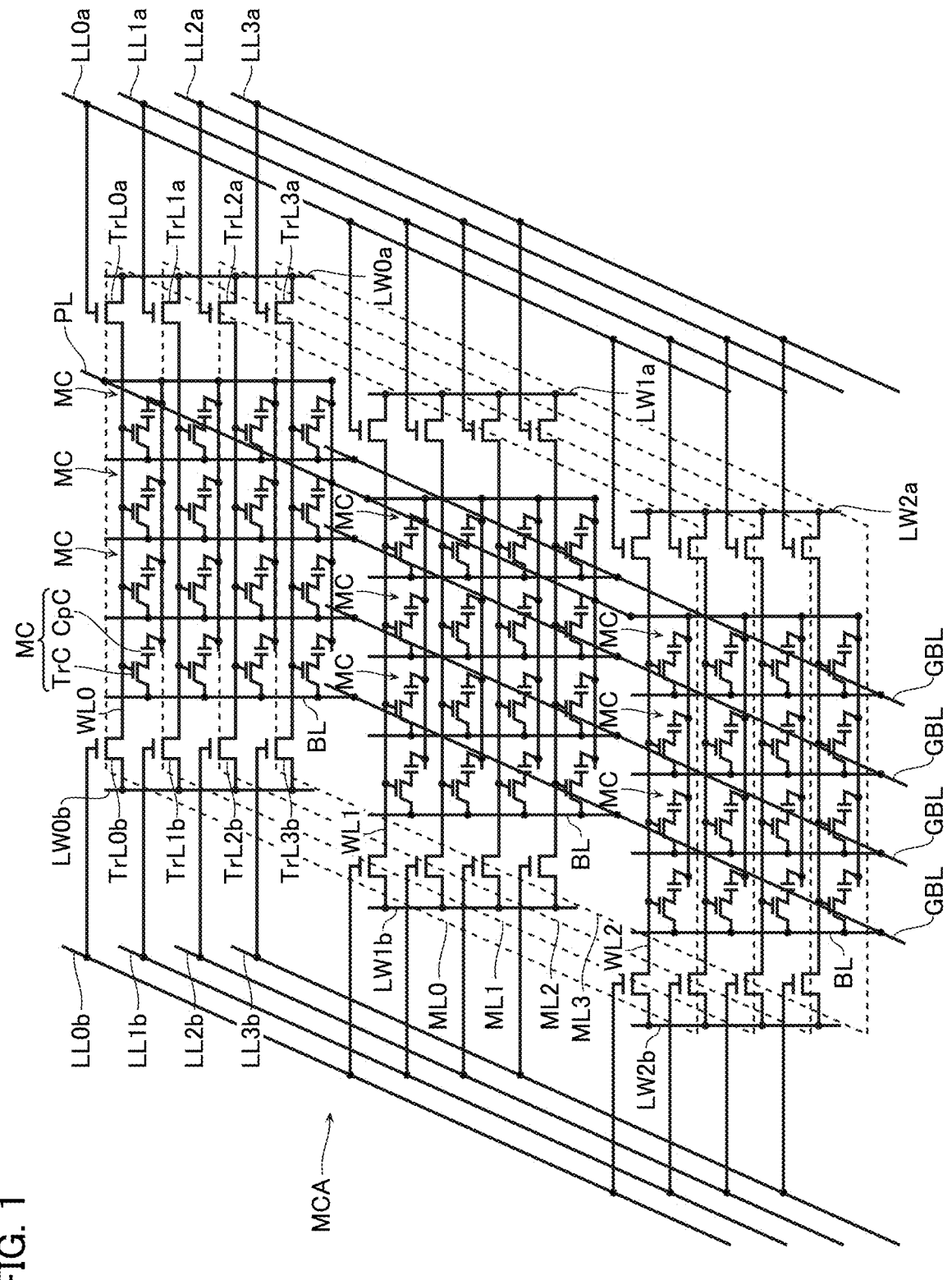
FIG. 1 is a schematic circuit diagram showing configurations of a semiconductor memory device according to a first embodiment.

A semiconductor memory device according to an embodiment comprises: a substrate; a first memory layer separated from the substrate in a first direction intersecting a surface of the substrate; and a first via wiring and a second via wiring that extend in the first direction, and have different positions from each other in a second direction intersecting the first direction. The first memory layer comprises: a first transistor which is electrically connected to the first via wiring; a memory portion which is electrically connected to the first transistor; a first wiring which is electrically connected to the first transistor, and extends in the second direction; a second transistor which is electrically connected to the second via wiring, and is electrically connected to the first wiring; a first electrode which is electrically connected to the second transistor; and a second electrode which is electrically connected to the first wiring and the first electrode. The first electrode includes a first conductive layer and a second conductive layer that are arranged in the first direction. The second conductive layer includes a conductive oxide. A length of the second electrode in the first direction is larger than one or both of a length of the first wiring in the first direction and a length of the first conductive layer in the first direction.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, parts of configurations, and so on, thereof will sometimes be omitted. Moreover, portions that are common to a plurality of embodiments will be assigned with the same symbols, and descriptions thereof sometimes omitted.

Moreover, when a "semiconductor memory device" is referred to in the present specification, it will sometimes mean a memory die, and will sometimes mean a memory system including a control die, of the likes of a memory chip, a memory card, or an SSD (Solid State Drive). Furthermore, it will sometimes mean a configuration including a host computer, of the likes of a smartphone, a tablet terminal, or a personal computer.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even when the second transistor is in an OFF state.

Moreover, in the present specification, a certain direction parallel to an upper surface of a substrate will be referred to as an X-direction, a direction parallel to the upper surface of the substrate and perpendicular to the X-direction will be referred to as a Y-direction, and a direction perpendicular to the upper surface of the substrate will be referred to as a Z-direction.

Moreover, in the present specification, sometimes, a direction lying along a certain plane will be referred to as a first direction, a direction intersecting the first direction along this certain plane will be referred to as a second direction, and a direction intersecting this certain plane will be referred to as a third direction. These first direction, second direction, and third direction may correspond to any of the X-direction, the Y-direction, and the Z-direction, but need not correspond to these directions.

Moreover, in the present specification, expressions such as "above" or "below" will be defined with reference to the substrate. For example, an orientation of moving away from the substrate along the above-described Z-direction will be referred to as above, and an orientation of coming closer to the substrate along the Z-direction will be referred to as below. Moreover, when a lower surface or a lower end is referred to for a certain configuration, this will be assumed to mean a surface or an end portion on a substrate side of this configuration, and when an upper surface or an upper end is referred to for a certain configuration, this will be assumed to mean a surface or an end portion on an opposite side to the substrate of this configuration. Moreover, a surface intersecting the X-direction or the Y-direction will be referred to as a side surface, and so on.

Moreover, in the present specification, when a "center position" of a certain configuration is referred to, it may mean a position of the center of a circumscribed circle of this configuration, or may mean the center of gravity on an image of this configuration, for example.

First Embodiment

[Circuit Configuration]

FIG. 1 is a schematic circuit diagram showing configurations of a semiconductor memory device according to a first embodiment. As shown in FIG. 1, the semiconductor memory device according to the present embodiment comprises a memory cell array MCA. The memory cell array MCA comprises: a plurality of memory layers ML0 to ML3; a plurality of bit lines BL connected to these plurality of memory layers ML0 to ML3; a plurality of global bit lines GBL electrically connected to the plurality of bit lines BL; and a plate line PL connected to the plurality of memory layers ML0 to ML3.

The memory layers ML0 to ML3 each comprise: a plurality of word lines WL0 to WL2 (hereafter, sometimes referred to as "word lines WL"); and pluralities of memory cells MC connected to these plurality of word lines WL0 to WL2. The memory cells MC each comprise a transistor TrC and a capacitor CpC. A source electrode of the transistor TrC is connected to the bit line BL. A drain electrode of the transistor TrC is connected to the capacitor CpC. A gate electrode of the transistor TrC is connected to any of the word lines WL0 to WL2. One electrode of the capacitor CpC is connected to the drain electrode of the transistor TrC. The other electrode of the capacitor CpC is connected to the plate line PL.

Note that each of the plurality of bit lines BL is connected to a plurality of the memory cells MC corresponding to the plurality of memory layers ML0 to ML3. Moreover, each of the plurality of bit lines BL is connected to the global bit line GBL.

In addition, the memory layers ML0 to ML3 respectively comprise pluralities of transistors TrL0a, TrL0b, TrL1a, TrL1b, TrL2a, TrL2b, TrL3a, TrL3b (hereafter, sometimes referred to as "transistors TrL") provided correspondingly to the plurality of word lines WL0 to WL2. Drain electrodes of the transistors TrL are each connected to any of the word lines WL0 to WL2. Source electrodes of the transistors TrL are respectively connected to word line select lines LW0a, LW0b, LW1a, LW1b, LW2a, LW2b (hereafter, sometimes referred to as "word line select lines LW"). Gate electrodes of the transistors TrL are respectively connected to layer select lines LL0a, LL0b, LL1a, LL1b, LL2a, LL2b, LL3a, LL3b (hereafter, sometimes referred to as "layer select lines LL").

Note that the word line select lines LW are connected to a plurality of the transistors TrL corresponding to the plurality of memory layers ML0 to ML3. Moreover, the layer select lines LL0a, LL1a, LL2a, LL3a are respectively commonly connected to all of the transistors TrL0a, TrL1a, TrL2a, TrL3a corresponding to the memory layers ML0 to ML3. Similarly, the layer select lines LL0b, LL1b, LL2b, LL3b are respectively commonly connected to all of the transistors TrL0b, TrL1b, TrL2b, TrL3b corresponding to the memory layers ML0 to ML3.

[Structure of Memory Cell Array MCA]

Figure 2:
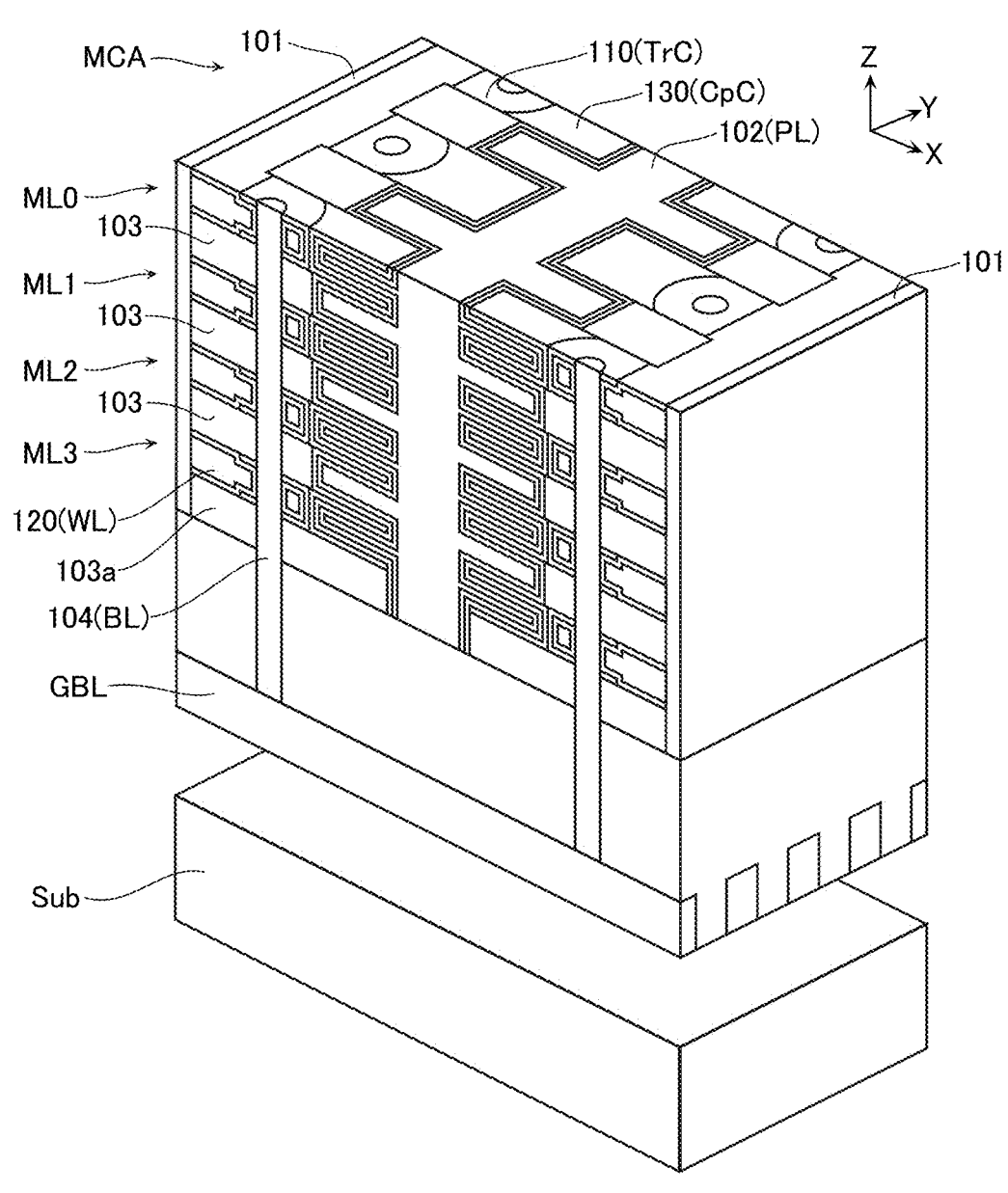
FIG. 2 is a schematic perspective view showing a part of a configuration of the same semiconductor memory device.
Figure 3:
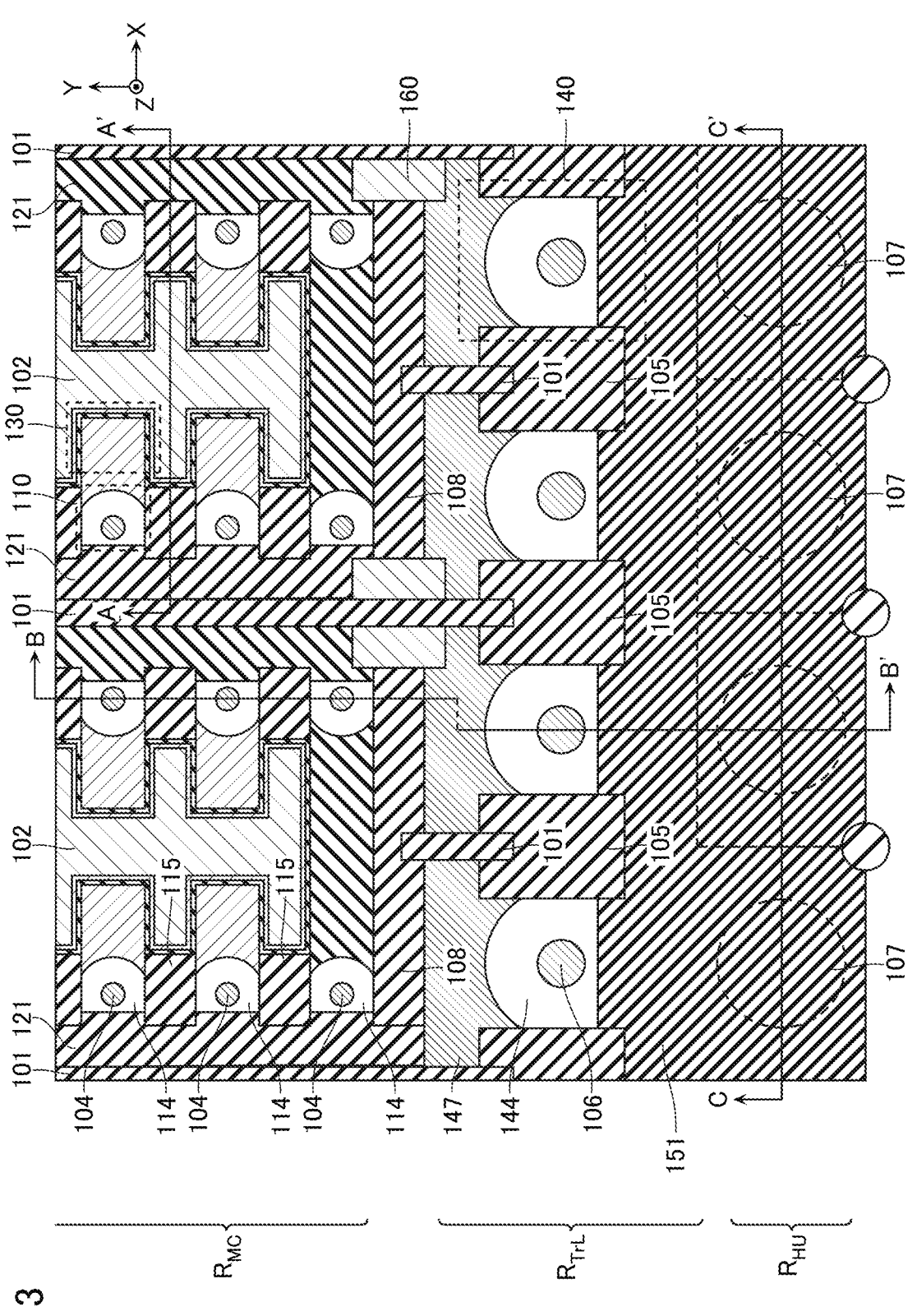
FIG. 3 is a schematic cross-sectional view showing a part of a configuration of the same semiconductor memory device.
Figure 4:
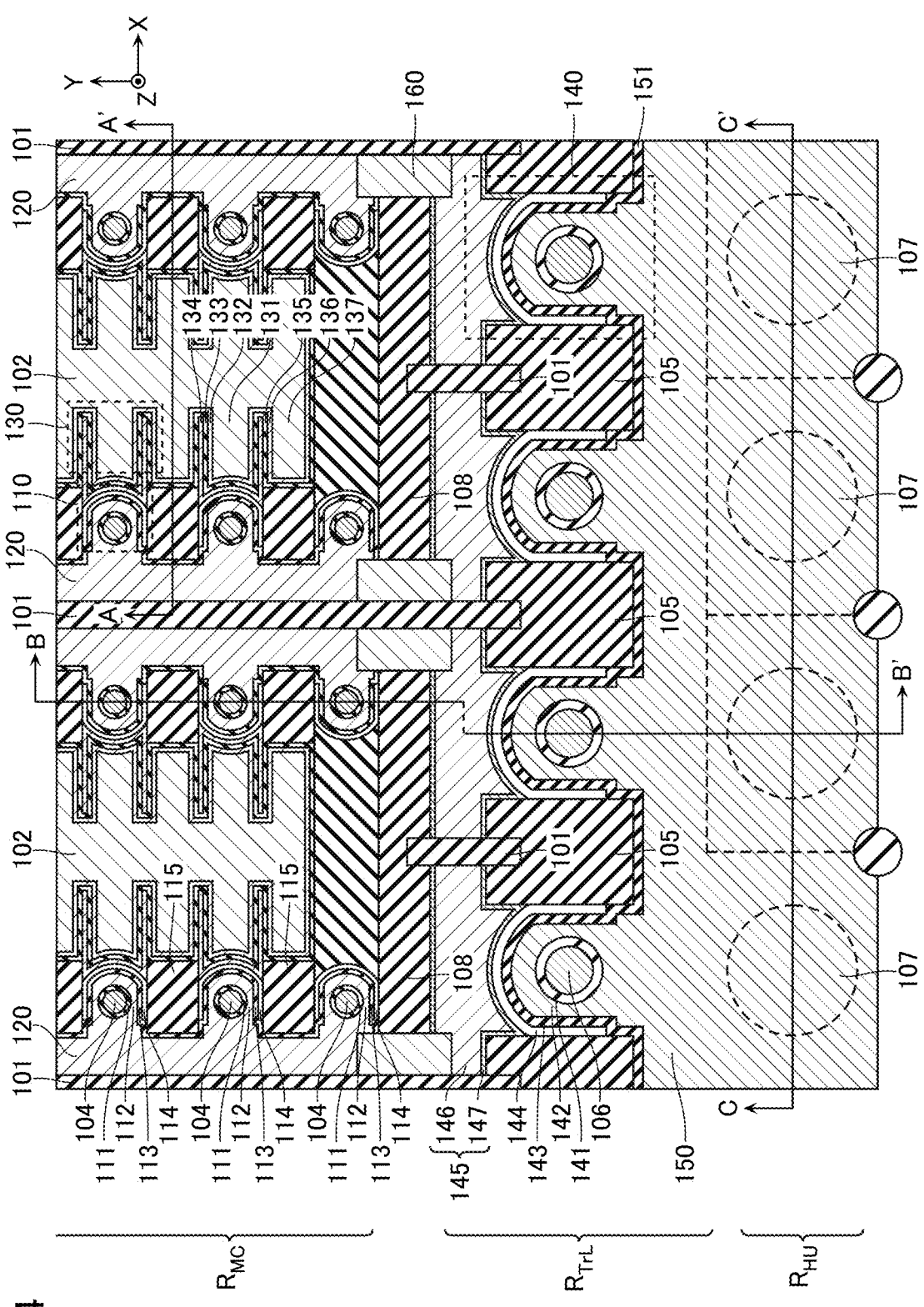
FIG. 4 is a schematic cross-sectional view showing a part of a configuration of the same semiconductor memory device.
Figure 5:
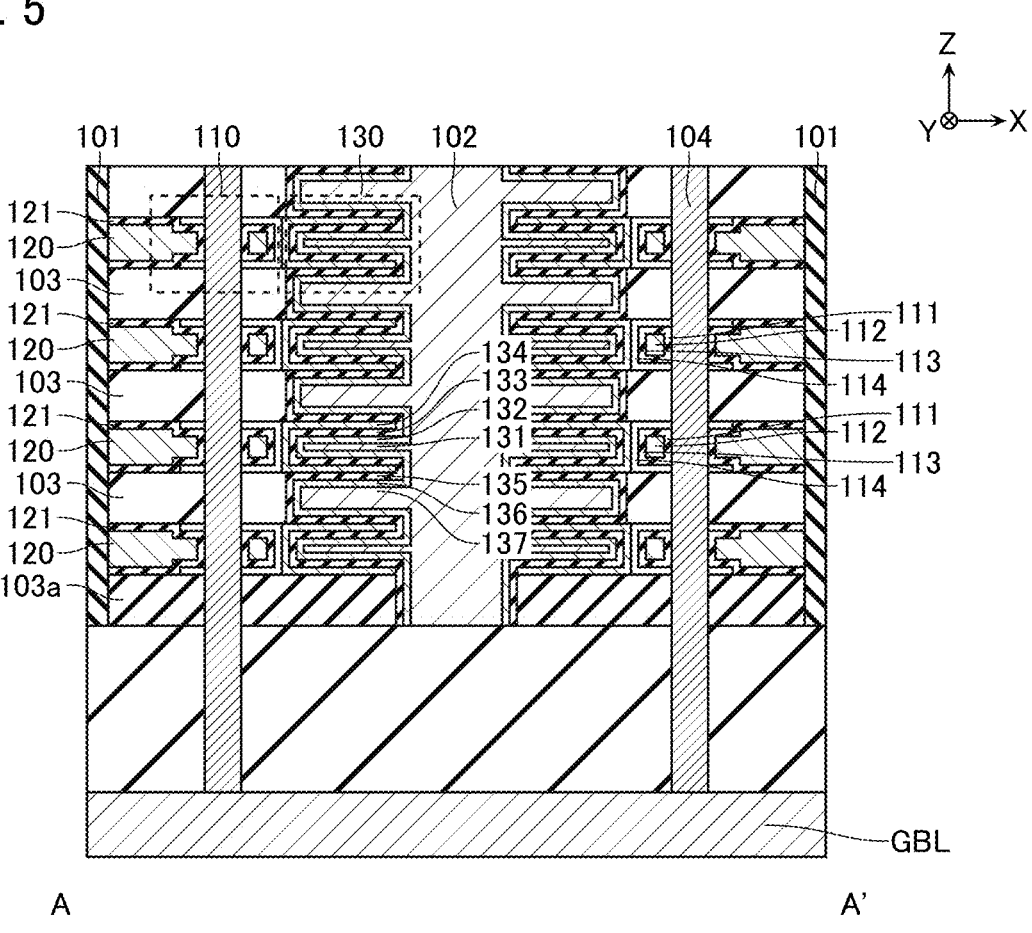
FIG. 5 is a schematic cross-sectional view showing a part of a configuration of the same semiconductor memory device.
Figure 6:
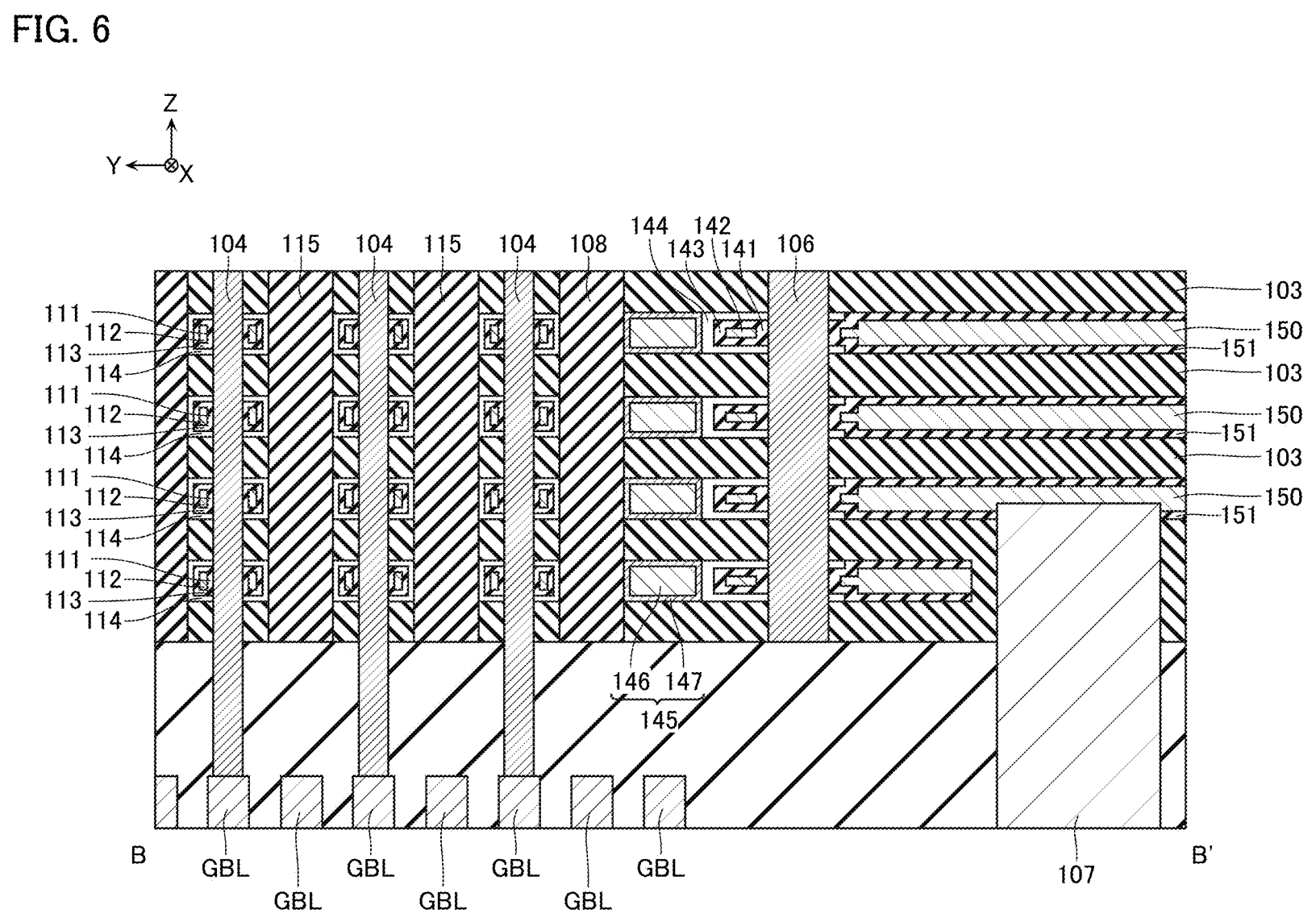
Figure 7:
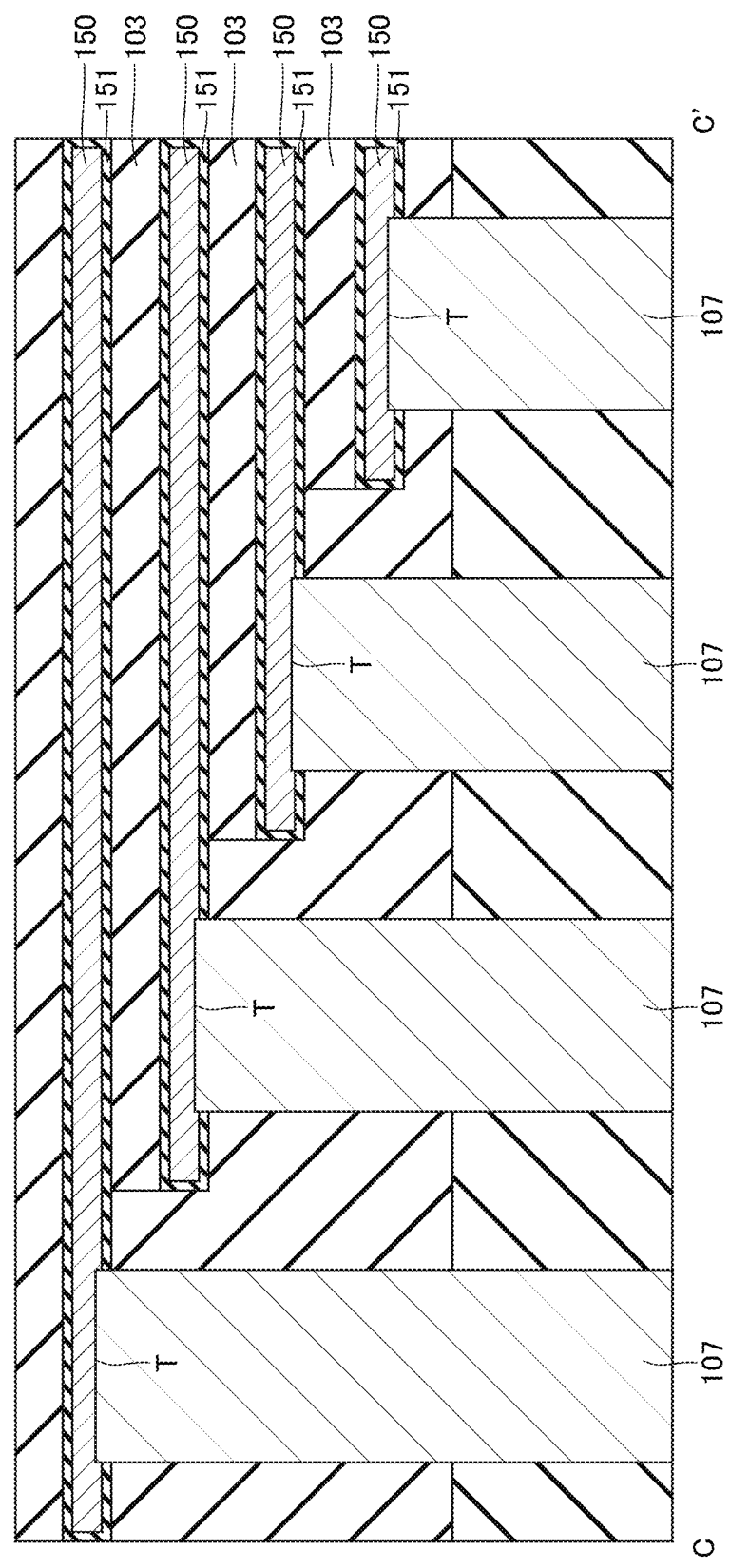
FIG. 7 is a schematic cross-sectional view showing a part of a configuration of the same semiconductor memory device.

FIG. 2 is a schematic perspective view showing a part of a configuration of the semiconductor memory device according to the first embodiment. FIGS. 3 and 4 are schematic XY cross-sectional views showing a part of a configuration of the same semiconductor memory device. Note that FIGS. 3 and 4 show XY cross sections at different height positions from each other. FIG. 5 is a schematic XZ cross-sectional view in which the configurations shown in FIGS. 3 and 4 have been cut along the line A-A' and viewed along a direction of the arrows. FIG. 6 is a schematic YZ cross-sectional view in which the configurations shown in FIGS. 3 and 4 have been cut along the line B-B' and viewed along a direction of the arrows. FIG. 7 is a schematic XZ cross-sectional view in which the configurations shown in FIGS. 3 and 4 have been cut along the line C-C' and viewed along a direction of the arrows.

FIG. 2 shows: a part of a semiconductor substrate Sub; and the memory cell array MCA which is provided above the semiconductor substrate Sub.

The semiconductor substrate Sub includes the likes of silicon (Si) containing P type impurities such as boron (B), for example. An unillustrated insulating layer and an unillustrated electrode layer are provided on an upper surface of the semiconductor substrate Sub. The upper surface of the semiconductor substrate Sub, the unillustrated insulating layer, and the electrode layer configure a control circuit for controlling the semiconductor memory device according to the first embodiment. For example, a region directly below the memory cell array MCA is provided with a sense amplifier circuit. The sense amplifier circuit is connected to the global bit line GBL. The sense amplifier circuit detects change in voltage or flow of current of the global bit line GBL in a read operation, and thereby enables data stored in a selected memory cell MC to be read in the read operation.

The memory cell array MCA comprises: the plurality of memory layers ML0 to ML3 which are arranged in the Z-direction; and the plurality of global bit lines GBL which are provided below these memory layers ML0 to ML3. Moreover, insulating layers 103 of the likes of silicon oxide ($SiO_2$) are respectively provided between the plurality of memory layers ML0 to ML3.

The memory layers ML0 to ML3 comprise a memory cell region $R_{MC}$, a transistor region $R_{TrL}$, and a hook-up region $R_{HU}$ that are arranged in the Y-direction, as shown in FIG. 3. Note that although FIG. 3 illustrates the transistor region $R_{TrL}$ and the hook-up region $R_{HU}$ that are provided on a negative side in the Y-direction with respect to the memory cell region $R_{MC}$, the transistor region $R_{TrL}$ and the hook-up region $R_{HU}$ are provided also on a positive side in the Y-direction with respect to the memory cell region $R_{MC}$.

The memory cell region $R_{MC}$ is provided with a plurality of insulating layers 101 and a plurality of conductive layers 102 arranged alternately in the X-direction. As shown in FIG. 2, the plurality of insulating layers 101 and the plurality of conductive layers 102 extend in the Y-direction and the Z-direction, and divide the memory layers ML0 to ML3 in the X-direction.

The insulating layer 101 includes the likes of silicon oxide ($SiO_2$), for example.

The conductive layer 102 includes the likes of a stacked structure of titanium nitride (TiN) and tungsten (W), for example. The conductive layer 102 functions as the plate line PL (FIG. 1), for example.

In addition, the memory cell region $R_{MC}$ is provided with a plurality of via wirings 104 that are provided between the insulating layer 101 and the conductive layer 102. The plurality of via wirings 104 are arranged in the Y-direction, and extend in the Z-direction penetrating the plurality of memory layers ML0 to ML3.

The via wiring 104 includes the likes of a stacked structure of a conductive oxide, titanium nitride (TiN), and tungsten (W), for example. Note that the via wiring 104 may include ruthenium (Ru), iridium (Ir), or another metal, instead of the conductive oxide. Moreover, the via wiring 104 may include solely a conductive oxide, or may include solely ruthenium (Ru), iridium (Ir), or another metal. The via wiring 104 functions as the bit line BL (FIG. 1), for example. A plurality of the bit lines BL are provided correspondingly to the plurality of transistors TrC included in the memory layers ML0 to ML3.

Note that in the following description, when a "conductive oxide" is referred to, the conductive oxide will be assumed to include indium tin oxide (ITO), indium zinc oxide (IZO), ruthenium oxide ($RuO_2$), iridium oxide ($IrO_2$), or another conductive material including oxygen, for example.

In the memory cell region $R_{MC}$, the memory layers ML0 to ML3 comprise: a plurality of transistor structures 110 provided correspondingly to the plurality of via wirings 104; a conductive layer 120 provided between the plurality of transistor structures 110 and the insulating layer 101; and a plurality of capacitor structures 130 provided between the plurality of transistor structures 110 and the conductive layer 102.

As shown in FIGS. 4 and 5, for example, the transistor structure 110 comprises: an insulating layer 111 provided on an outer peripheral surface of the via wiring 104; a conductive layer 112 provided on an outer peripheral surface of the insulating layer 111; an insulating layer 113 provided on an upper surface, a lower surface, and an outer peripheral surface of the conductive layer 112; and a semiconductor layer 114 provided on an upper surface, a lower surface, both side surfaces in the Y-direction, and a side surface on one side (a conductive layer 102 side) in the X-direction of the insulating layer 113.

In an XY cross section of the kind exemplified in FIG. 4, the outer peripheral surface of the insulating layer 111 may be formed along a circle centered on a center position of the via wiring 104, for example. Moreover, side surfaces on one side (the conductive layer 102 side) in the X-direction of the conductive layer 112, the insulating layer 113, and the semiconductor layer 114 may be formed along circles centered on the center position of the via wiring 104. Moreover, both side surfaces in the Y-direction of the conductive layer 112, the insulating layer 113, and the semiconductor layer 114 may be formed linearly along a side surface of an insulating layer 115.

The insulating layer 111 includes the likes of silicon oxide ($SiO_2$), for example. The insulating layer 111 surrounds the outer peripheral surface of the via wiring 104 over its entire periphery.

The conductive layer 112 functions as the gate electrode of the transistor TrC (FIG. 1), for example. The conductive layer 112 includes the likes of a stacked structure of titanium nitride (TiN) and tungsten (W), for example. The conductive layer 112 surrounds the outer peripheral surface of the insulating layer 111 over its entire periphery. As shown in FIG. 4, a plurality of the conductive layers 112 arranged in the Y-direction are commonly connected to the conductive layer 120 extending in the Y-direction.

The insulating layer 113 functions as a gate insulating film of the transistor TrC (FIG. 1), for example. The insulating layer 113 includes the likes of silicon oxide ($SiO_2$), for example. The insulating layer 113 covers both side surfaces in the Y-direction and a side surface on one side (the conductive layer 102 side) in the X-direction of the conductive layer 112.

The semiconductor layer 114 functions as a channel region of the transistor TrC (FIG. 1), for example. The semiconductor layer 114 may be, for example, a semiconductor including: at least one element of gallium (Ga) and aluminum (Al); indium (In); zinc (Zn); and oxygen (O), or may be, for example, another oxide semiconductor. The semiconductor layer 114 covers both side surfaces in the Y-direction and a side surface on one side (the conductive layer 102 side) in the X-direction of the conductive layer 112, via the insulating layer 113. As shown in FIG. 5, a plurality of the semiconductor layers 114 arranged in the Z-direction are commonly connected to the via wiring 104 extending in the Z-direction.

As shown in FIG. 3, the insulating layer 115 of the likes of silicon oxide ($SiO_2$) is provided between two semiconductor layers 114 adjacent in the Y-direction. The insulating layer 115 extends in the Z-direction penetrating the plurality of memory layers ML0 to ML3.

The conductive layer 120 functions as the word line WL (FIG. 1), for example. The conductive layer 120 extends in the Y-direction, and is connected to the plurality of the conductive layers 112 arranged in the Y-direction, as shown in FIG. 4, for example. The conductive layer 120 comprises the likes of a stacked structure of titanium nitride (TiN) and tungsten (W), for example. Note that as shown in FIG. 5, an upper surface and a lower surface of the conductive layer 120 are covered by an insulating layer 121 of the likes of silicon oxide ($SiO_2$). The insulating layer 121 is connected to the insulating layer 111 and the insulating layer 113.

As shown in FIGS. 4 and 5, for example, the capacitor structure 130 comprises: a conductive layer 131; a conductive layer 132 provided on an upper surface, a lower surface, both side surfaces in the Y-direction, and a side surface on one side (a transistor structure 110 side) in the X-direction of the conductive layer 131; an insulating layer 133 provided on an upper surface, a lower surface, both side surfaces in the Y-direction, and a side surface on one side (the transistor structure 110 side) in the X-direction of the conductive layer 132; a conductive layer 134 provided on an upper surface, a lower surface, both side surfaces in the Y-direction, and a side surface on one side (the transistor structure 110 side) in the X-direction of the insulating layer 133; an insulating layer 135 provided on an upper surface, a lower surface, and both side surfaces in the Y-direction of the conductive layer 134; a conductive layer 136 provided on an upper surface, a lower surface, and both side surfaces in the Y-direction of the insulating layer 135; and a conductive layer 137 provided on an upper surface, a lower surface, and both side surfaces in the Y-direction of the conductive layer 136.

The conductive layers 131, 132, 136, 137 function as one electrode of the capacitor CpC (FIG. 1). The conductive layers 131, 137 include the likes of tungsten (W), for example. The conductive layers 132, 136 include the likes of titanium nitride (TiN), for example. The conductive layers 131, 132, 136, 137 are connected to the conductive layer 102.

The insulating layers 133, 135 function as an insulating layer of the capacitor CpC (FIG. 1). The insulating layers 133, 135 may be alumina ($Al_2O_3$) or another insulating metal oxide, for example.

The conductive layer 134 functions as the other electrode of the capacitor CpC (FIG. 1), for example. The conductive layer 134 includes the likes of the above-described conductive oxide, for example. The conductive layer 134 is insulated from the conductive layers 131, 132, 136, 137 via the insulating layers 133, 135. The conductive layer 134 is connected to a side surface in the X-direction of the semiconductor layer 114.

As shown in FIG. 4, for example, the transistor region $R_{TrL}$ is provided with a plurality of the insulating layers 101. Moreover, the transistor region $R_{TrL}$ is provided with a plurality of insulating layers 105 arranged in the X-direction correspondingly to the plurality of insulating layers 101. The plurality of insulating layers 101 and the plurality of insulating layers 105 extend in the Z-direction, and divide the memory layers ML0 to ML3 in the X-direction.

The insulating layer 105 includes the likes of silicon oxide ($SiO_2$), for example.

Moreover, in the transistor region $R_{TrL}$, via wirings 106 are provided one each to each of regions separated by the insulating layers 101 and the insulating layers 105. The plurality of via wirings 106 are arranged in the X-direction, and extend in the Z-direction penetrating the plurality of memory layers ML0 to ML3 (refer to FIG. 6).

The via wiring 106 includes the likes of a stacked structure of the above-described conductive oxide, titanium nitride (TiN), and tungsten (W), for example. Note that the via wiring 106 may include ruthenium (Ru), iridium (Ir), or another metal, instead of the conductive oxide. Moreover, the via wiring 106 may include solely a conductive oxide, or may include solely ruthenium (Ru), iridium (Ir), or another metal. The via wiring 106 functions as the word line select line LW (FIG. 1), for example. A plurality of the word line select lines LW are provided correspondingly to the plurality of transistors TrL included in the memory layers ML0 to ML3.

In the transistor region $R_{TrL}$, the memory layers ML0 to ML3 comprise: a plurality of transistor structures 140 provided correspondingly to the plurality of via wirings 106; a conductive layer 145 provided between the plurality of transistor structures 140 and the memory cell region $R_{MC}$;

and a conductive layer 150 provided between the plurality of transistor structures 140 and the hook-up region $R_{HU}$.

As shown in FIGS. 4 and 6, for example, the transistor structure 140 comprises: an insulating layer 141 provided on an outer peripheral surface of the via wiring 106; a conductive layer 142 provided on an outer peripheral surface of the insulating layer 141; an insulating layer 143 provided on an upper surface, a lower surface, and an outer peripheral surface of the conductive layer 142; and a semiconductor layer 144 provided on an upper surface, a lower surface, both side surfaces in the X-direction, and a side surface on one side (a memory cell region $R_{MC}$ side) in the Y-direction of the insulating layer 143.

In an XY cross section of the kind exemplified in FIG. 4, the outer peripheral surface of the insulating layer 141 may be formed along a circle centered on a center position of the via wiring 106, for example. Moreover, side surfaces on one side (the memory cell region $R_{MC}$ side) in the Y-direction of the conductive layer 142, the insulating layer 143, and the semiconductor layer 144 may be formed along circles centered on the center position of the via wiring 106. Moreover, both side surfaces in the X-direction of the conductive layer 142, the insulating layer 143, and the semiconductor layer 144 may be formed linearly along a side surface of the insulating layer 105.

The insulating layer 141 includes the likes of silicon oxide ($SiO_2$), for example. The insulating layer 141 surrounds the outer peripheral surface of the via wiring 106 over its entire periphery.

The conductive layer 142 functions as the gate electrode of the transistor TrL (FIG. 1), for example. The conductive layer 142 includes the likes of a stacked structure of titanium nitride (TiN) and tungsten (W), for example. The conductive layer 142 surrounds the outer peripheral surface of the insulating layer 141 over its entire periphery. As shown in FIG. 4, a plurality of the conductive layers 142 arranged in the X-direction are commonly connected to the conductive layer 150 extending in the X-direction.

The insulating layer 143 functions as a gate insulating film of the transistor TrL (FIG. 1), for example. The insulating layer 143 includes the likes of silicon oxide ($SiO_2$), for example. The insulating layer 143 covers both side surfaces in the X-direction and a side surface on one side (the memory cell region $R_{MC}$ side) in the Y-direction of the conductive layer 142.

The semiconductor layer 144 functions as a channel region of the transistor TrL (FIG. 1), for example. The semiconductor layer 144 may be, for example, a semiconductor including: at least one element of gallium (Ga) and aluminum (Al); indium (In); zinc (Zn); and oxygen (O), or may be, for example, another oxide semiconductor. The semiconductor layer 144 covers both side surfaces in the X-direction and a side surface on one side (the conductive layer 102 side) in the Y-direction of the conductive layer 142, via the insulating layer 143. As shown in FIG. 6, a plurality of the semiconductor layers 144 arranged in the Z-direction are commonly connected to the via wiring 106 extending in the Z-direction.

The conductive layer 145 comprises, for example: a conductive layer 147 including the above-described conductive oxide; and a conductive layer 146 including a metal such as a stacked structure of titanium nitride (TiN) and tungsten (W). Resistivity of a material included in the conductive layer 146 is smaller than resistivity of a material included in the conductive layer 147. The conductive layer 145 functions as the drain electrode of the transistor TrL (FIG. 1), for example. In the example of FIG. 6, the conductive layer 147 is provided on upper and lower surfaces of the conductive layer 146. Moreover, in the example of FIGS. 4 and 6, the conductive layer 147 is provided between the conductive layer 146 and the semiconductor layer 144, and contacts the conductive layer 146 and semiconductor layer 144.

The conductive layer 150 functions as the layer select line LL (FIG. 1), for example. As shown in FIG. 4, for example, the conductive layer 150 extends in the X-direction, and is connected to the plurality of the conductive layers 142 arranged in the X-direction. The conductive layer 150 comprises the likes of a stacked structure of titanium nitride (TiN) and tungsten (W), for example. Note that, as shown in FIG. 6, an upper surface and a lower surface of the conductive layer 150 are covered by an insulating layer 151 (FIG. 6) of the likes of silicon oxide ($SiO_2$). The insulating layer 151 is connected to the insulating layer 141 and the insulating layer 143.

The hook-up region $R_{HU}$ comprises a plurality of terrace portions T corresponding to a plurality of the conductive layers 150, as shown in FIG. 7. The terrace portion T is a region of a lower surface of the conductive layer 150 that, viewing from below, does not overlap another conductive layer 150. The plurality of conductive layers 150 are each provided with at least one terrace portion T.

Moreover, the hook-up region $R_{HU}$ is provided with a plurality of contact electrodes 107 arranged in the X-direction. As shown in FIG. 7, the contact electrode 107 extends in the Z-direction and has an upper end connected to the terrace portion T of the conductive layer 150. Moreover, the plurality of contact electrodes 107 arranged in the X-direction are respectively connected to conductive layers 150 provided at different height positions. The contact electrode 107 includes the likes of a stacked structure of titanium nitride (TiN) and tungsten (W), for example.

Moreover, as shown in FIG. 2, the plurality of global bit lines GBL are provided below the memory layers ML0 to ML3. The global bit lines GBL extend in the X-direction and are arranged in the Y-direction. The global bit line GBL includes the likes of a stacked structure of titanium nitride (TiN) and tungsten (W), for example. The global bit lines GBL are respectively connected to lower ends of pluralities of the via wirings 104 arranged in the X-direction. Moreover, an insulating layer 103a is provided between the memory layers ML0 to ML3 and the global bit line GBL. The insulating layer 103a may include a material different from that of the other insulating layers 103, for example.

[Structure between Memory Cell Region $R_{MC}$ and Transistor Region $R_{TrL}$]

As shown in FIGS. 4 and 6, an insulating layer 108 of the likes of silicon oxide ($SiO_2$) is provided between the memory cell region $R_{MC}$ and the transistor region $R_{TrL}$. The insulating layer 108 extends in the X-direction and the Z-direction, and divides the memory layers ML0 to ML3 in the Y-direction. Moreover, as shown in FIG. 4, a connecting electrode 160 is provided between the insulating layer 108 and the insulating layer 101. In the semiconductor memory device according to the present embodiment, the conductive layer 120 and the conductive layer 146 are connected via the connecting electrode 160.

Figure 8:
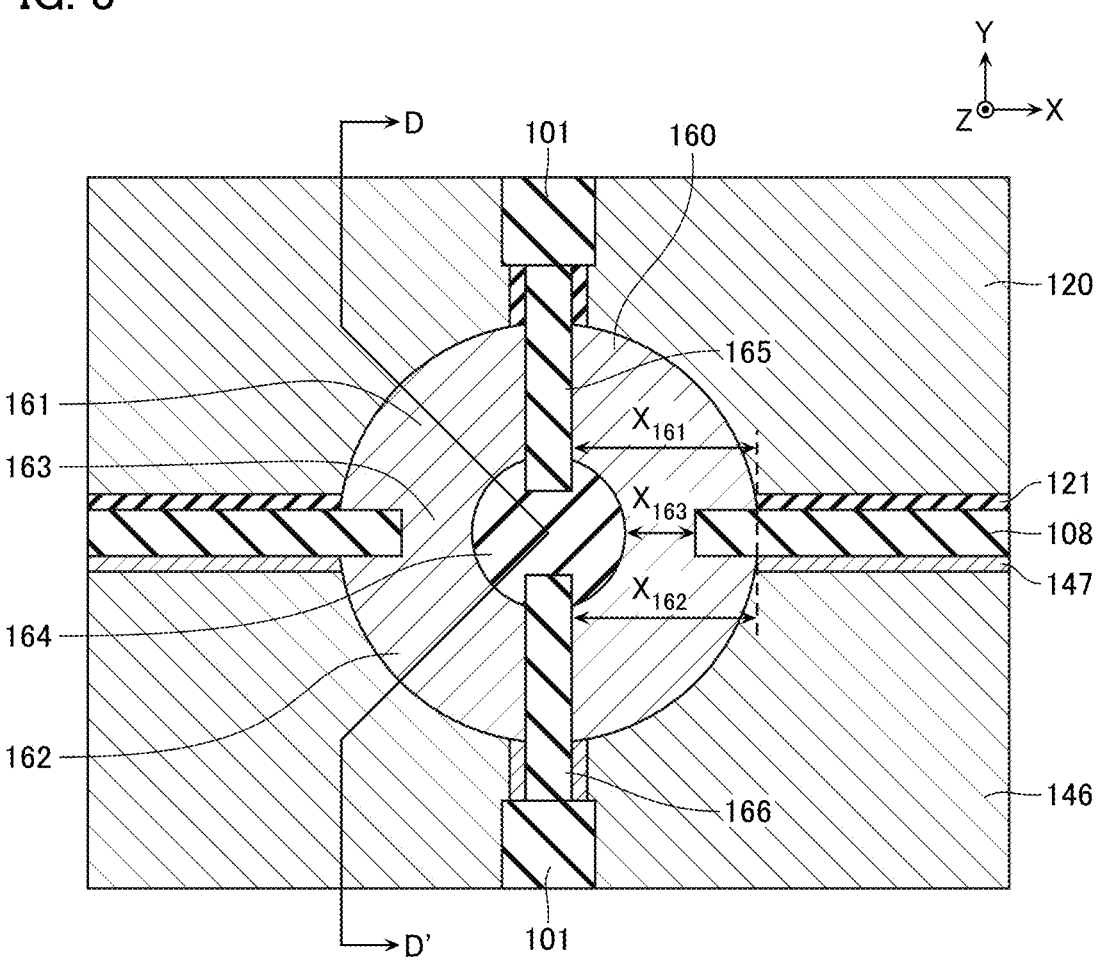
FIG. 8 is a schematic cross-sectional view showing a part of a configuration of the same semiconductor memory device.
Figure 9:
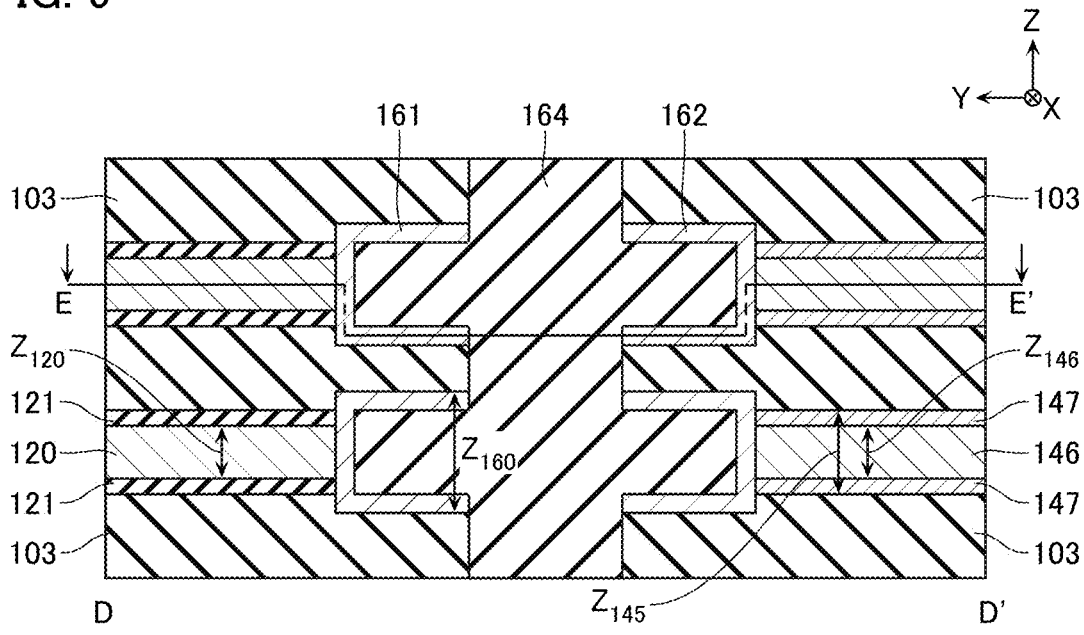
FIG. 9 is a schematic cross-sectional view showing a part of a configuration of the same semiconductor memory device.

FIG. 8 is a schematic XY cross-sectional view showing configurations between the memory cell region $R_{MC}$ and the transistor region $R_{TrL}$. FIG. 9 is a schematic cross-sectional view in which the configurations shown in FIG. 8 have been cut along the line D-D' and viewed along a direction of the arrows. Note that FIG. 8 corresponds to the configurations shown in FIG. 9 having been cut along the line E-E' and viewed along a direction of the arrows.

As shown in FIG. 8, an insulating layer 164 of the likes of silicon oxide ($SiO_2$) is provided between two insulating layers 108 adjacent in the X-direction. As shown in FIG. 9, the insulating layer 164 extends in the Z-direction penetrating the plurality of memory layers ML0 to ML3.

Moreover, in the example of FIG. 8, the insulating layer 101 extending in the Y-direction has a break therein in a vicinity of the insulating layer 164, and the insulating layer 101 and the insulating layer 164 have insulating layers 165, 166 of the likes of silicon oxide ($SiO_2$) provided therebetween. The insulating layer 165 is provided in the memory cell region $R_{MC}$. The insulating layer 166 is provided in the transistor region $R_{TrL}$. The insulating layers 165, 166 each extend in the Y-direction and the Z-direction, and divide the memory layers ML0 to ML3 in the X-direction. Note that lengths in the X-direction of the insulating layers 165, 166 may differ from lengths in the X-direction of the insulating layer 101. Moreover, center positions in the X-direction of the insulating layers 165, 166 may differ from a center position in the X-direction of the insulating layer 101.

Moreover, in the example illustrated, the memory layers ML0 to ML3 comprise the connecting electrode 160 which is provided on each of a positive side and a negative side in the X-direction with respect to the insulating layers 164, 165, 166.

In the example illustrated, the connecting electrode 160 is provided in a portion where the insulating layers 108, 164, 165, 166 are not provided, within a range of a circle centered on a center position of the insulating layer 164. Note that a radius of this circle is large enough to reach the insulating layer 108, and small enough not to reach the insulating layer 101.

The connecting electrode 160 comprises: a portion 161 provided in the memory cell region $R_{MC}$; a portion 162 provided in the transistor region $R_{TrL}$; and a portion 163 provided between the portion 161 and the portion 162. The portion 161 contacts the conductive layer 120. A contact surface between the portion 161 and the conductive layer 120 comprises a shape along the above-described circle. The portion 162 contacts the conductive layer 146. A contact surface between the portion 162 and the conductive layer 146 comprises a shape along the above-described circle. A length $X_{163}$ in the X-direction of the portion 163 is smaller than a length $X_{161}$ in the X-direction of the portion 161 and a length $X_{162}$ in the X-direction of the portion 162.

Moreover, as shown in FIG. 9, a length $Z_{160}$ in the Z-direction of the connecting electrode 160 (a distance from an upper surface to a lower surface of the connecting electrode 160) is larger than a length $Z_{120}$ in the Z-direction of the conductive layer 120 (a distance from an upper surface to a lower surface of the conductive layer 120). Moreover, the length $Z_{160}$ in the Z-direction of the connecting electrode 160 is larger than a length $Z_{146}$ in the Z-direction of the conductive layer 146 (a distance from an upper surface to a lower surface of the conductive layer 146). Furthermore, in the example illustrated, the length $Z_{160}$ in the Z-direction of the connecting electrode 160 is larger than a length $Z_{145}$ in the Z-direction of the conductive layer 145 (a distance from an upper surface to a lower surface of the conductive layer 147).

[Method of Manufacturing]

Figure 10:
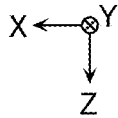
FIG. 10 is a schematic cross-sectional view for explaining a method of manufacturing the same semiconductor memory device.
Figure 10:
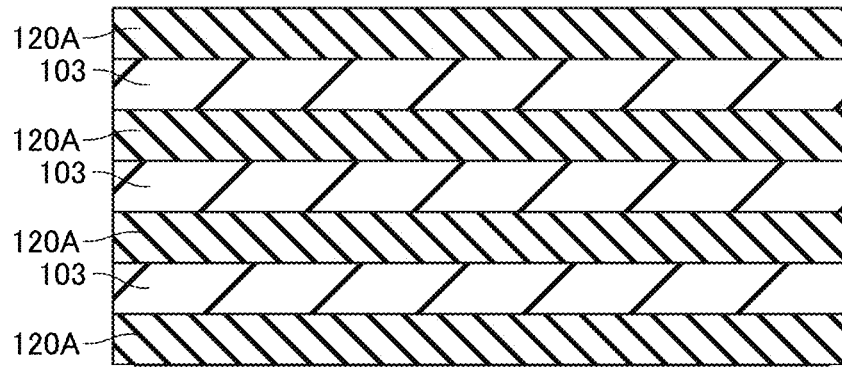

FIGS. 10 to 85 are schematic cross-sectional views for explaining a method of manufacturing the semiconductor memory device according to the first embodiment. FIGS. 11, 12, 14, 16, 23, 24, 26, 29, 31, 33, 35, 37, 39, 44, 46, 48, 50, 52, 56, 57, 59, 61, 63, 65, 66, 70, 79, 80, 82, and 84 show cross sections corresponding to FIG. 4. FIGS. 10, 25, 27, 28, 30, 32, 34, 36, 38, 40 to 43, 45, 47, 49, 51, and 53 show cross sections corresponding to FIG. 5. FIGS. 13, 15, 58, 60, 62, 64, 67, 81, 83, and 85 show cross sections corresponding to FIG. 6. FIGS. 17, 19, 21, 54, 68, 71, 73, 75, and 77 show cross sections corresponding to FIG. 8. FIGS. 18, 20, 22, 55, 69, 72, 74, 76, and 78 show cross sections corresponding to FIG. 9.

Note that the semiconductor memory device according to the first embodiment is formed by having the memory cell array MCA and a peripheral circuit which is connected to the memory cell array MCA, manufactured on separate wafers, and by having these wafers bonded. As a result, a vertical relationship of configurations in the memory cell array MCA is sometimes reversed between the case where the semiconductor substrate Sub shown in FIG. 2 is taken as reference, and the case where the wafer having the memory cell array MCA formed therein is taken as reference. In FIGS. 10 to 85, the X-direction, the Y-direction, and the Z-direction are illustrated matching the configurations in the memory cell array MCA.

In the same method of manufacturing, as shown in FIG. 10, for example, the plurality of insulating layers 103 and a plurality of sacrifice layers 120A are alternately formed. The sacrifice layer 120A includes the likes of silicon nitride ($Si_3N_4$), for example. This step is performed by the likes of CVD (Chemical Vapor Deposition), for example.

Figure 11:
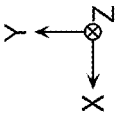
FIG. 11 is a schematic cross-sectional view for explaining the same method of manufacturing.

Next, as shown in FIG. 11, for example, parts of the plurality of insulating layers 103 and the plurality of sacrifice layers 120A are removed in the hook-up region $R_{HU}$, to form a plurality of terrace portions TA corresponding to the plurality of sacrifice layers 120A. The terrace portion TA is a region of an upper surface of the sacrifice layer 120A that, viewing from above, does not overlap another sacrifice layer 120A.

In this step, for example, a resist exposing a part of the hook-up region $R_{HU}$ is formed above a structure of the kind shown in FIG. 10. Next, the sacrifice layer 120A is selectively removed by a method such as RIE (Reactive Ion Etching). Next, the insulating layer 103 is selectively removed by a method such as RIE. As a result, a part of an upper surface of the second sacrifice layer 120A counting from above, is exposed.

Next, a part of the resist is removed by a method such as wet etching. Next, the sacrifice layer 120A is selectively removed by a method such as RIE. Next, the insulating layer 103 is selectively removed by a method such as RIE. As a result, parts of upper surfaces of the second and the third sacrifice layers 120A counting from above, are exposed.

Removal of a part of the resist, selective removal of the sacrifice layer 120A, and selective removal of the insulating layer 103 are likewise repeatedly performed thereafter. As a result, parts of upper surfaces of all of the sacrifice layers 120A are exposed, and the plurality of terrace portions TA are formed. Note that after formation of the plurality of terrace portions TA, insulating layers of the likes of silicon oxide ($SiO_2$) are formed in a region above the plurality of terrace portions TA, as shown in FIG. 13.

Figure 12:
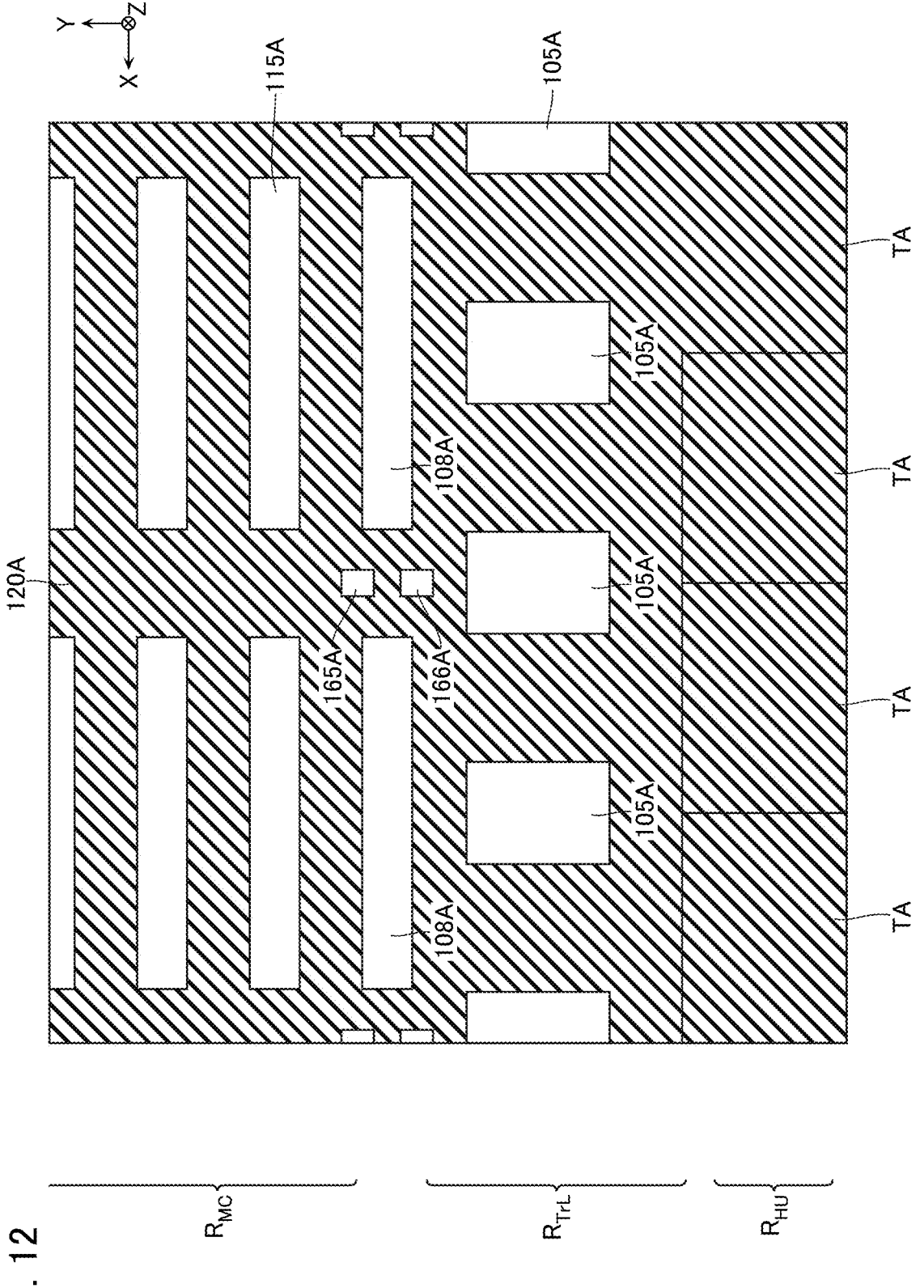
FIG. 12 is a schematic cross-sectional view for explaining the same method of manufacturing.
Figure 13:
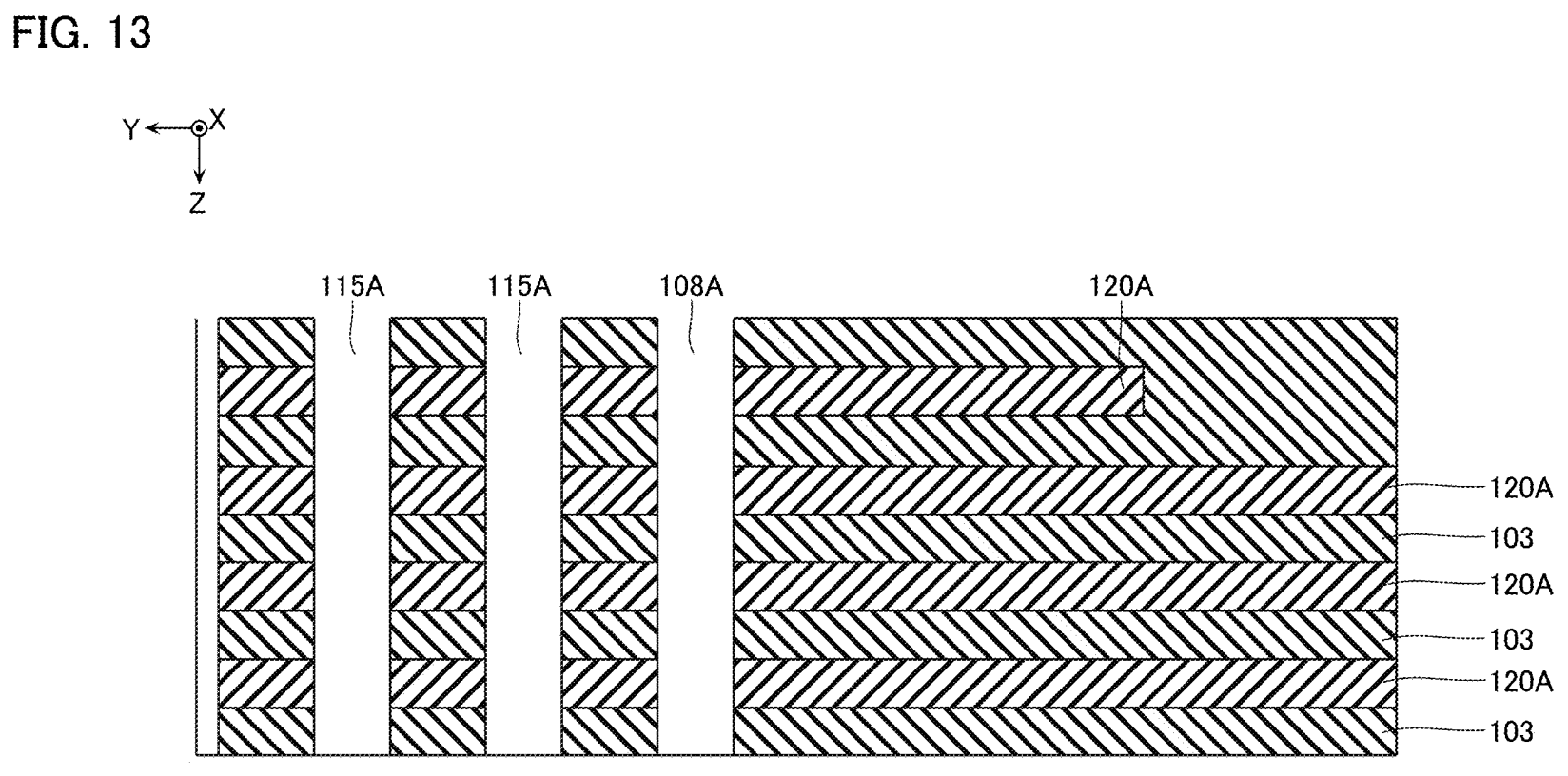

Next, as shown in FIGS. 12 and 13, for example, openings 105A, 108A, 115A, 165A, 166A are respectively formed at positions corresponding to the insulating layers 105, 108, 115, 165, 166. The openings 105A, 108A, 115A, 165A, 166A each extend in the Z-direction and penetrate the plurality of insulating layers 103 and the plurality of sacrifice layers 120A arranged in the Z-direction, as shown in FIG. 13. This step is performed by the likes of RIE, for example.

Figure 14:
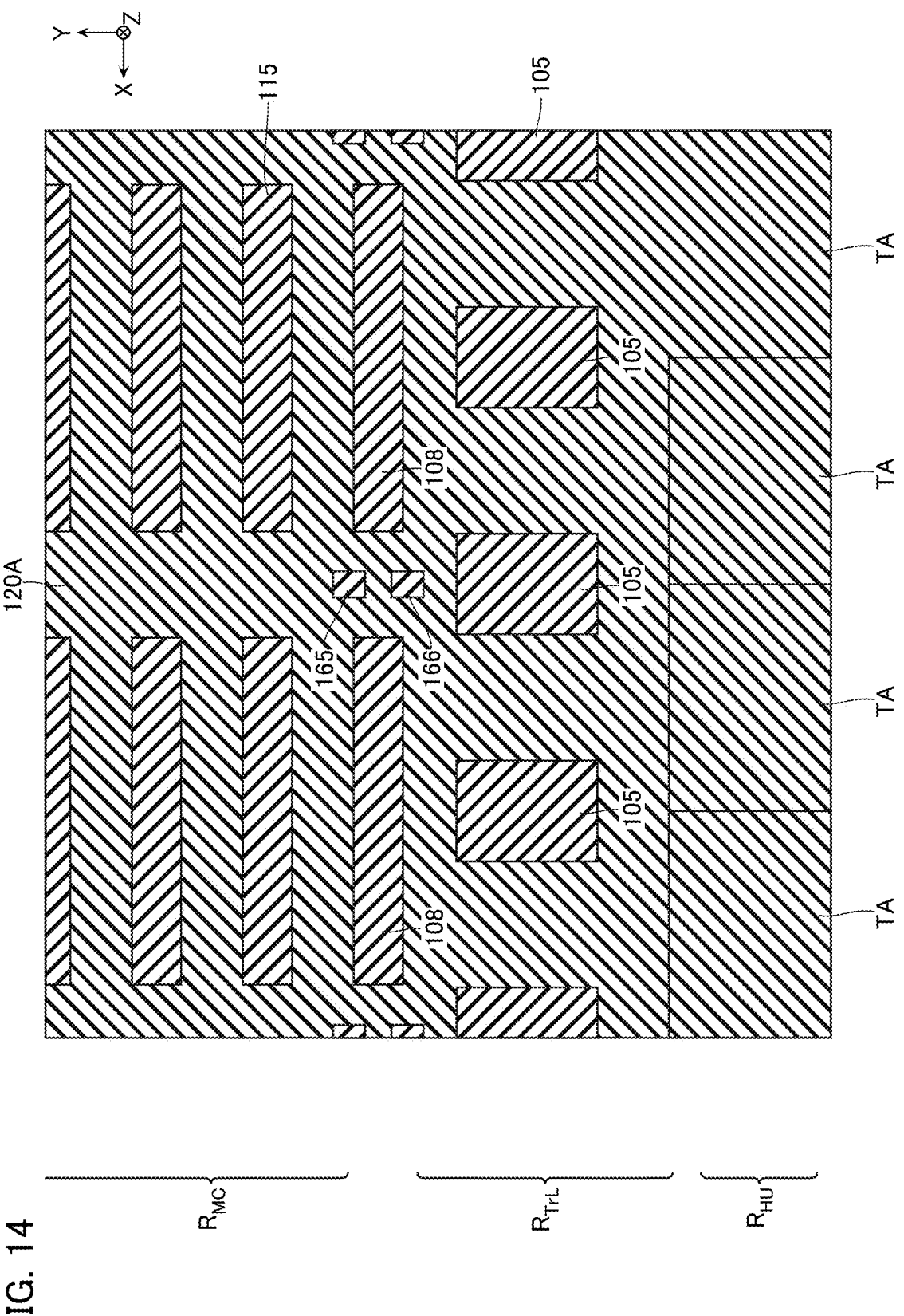
FIG. 14 is a schematic cross-sectional view for explaining the same method of manufacturing.
Figure 15:
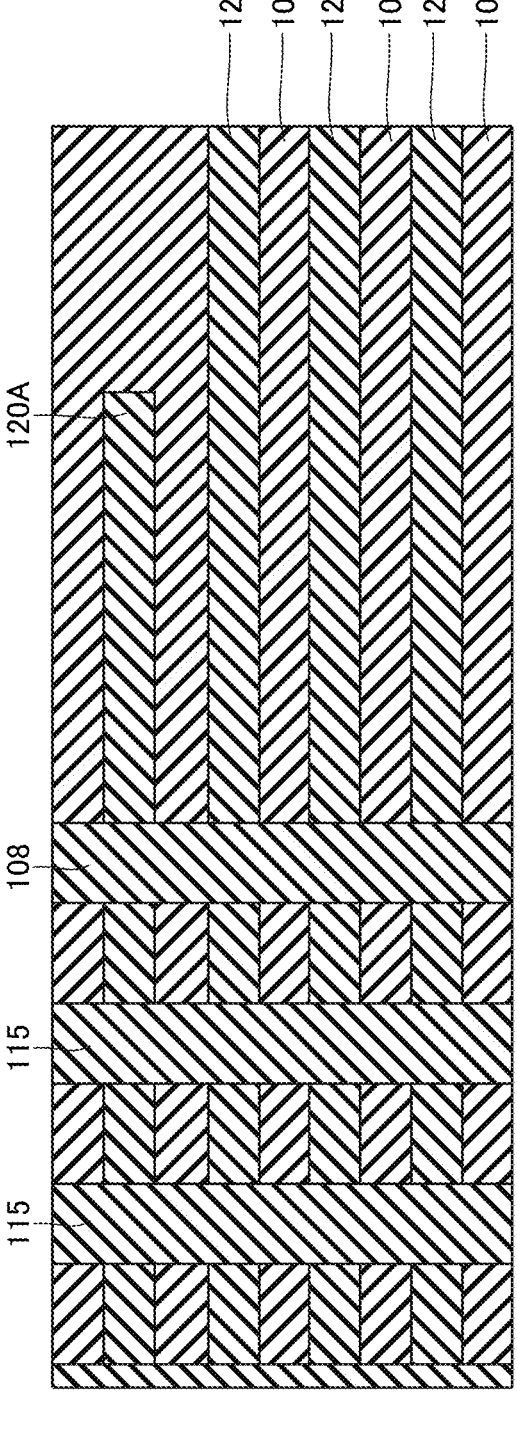
FIG. 15 is a schematic cross-sectional view for explaining the same method of manufacturing.

Next, as shown in FIGS. 14 and 15, for example, the insulating layers 105, 108, 115, 165, 166 are formed. This step is performed by the likes of CVD, for example.

Figure 16:
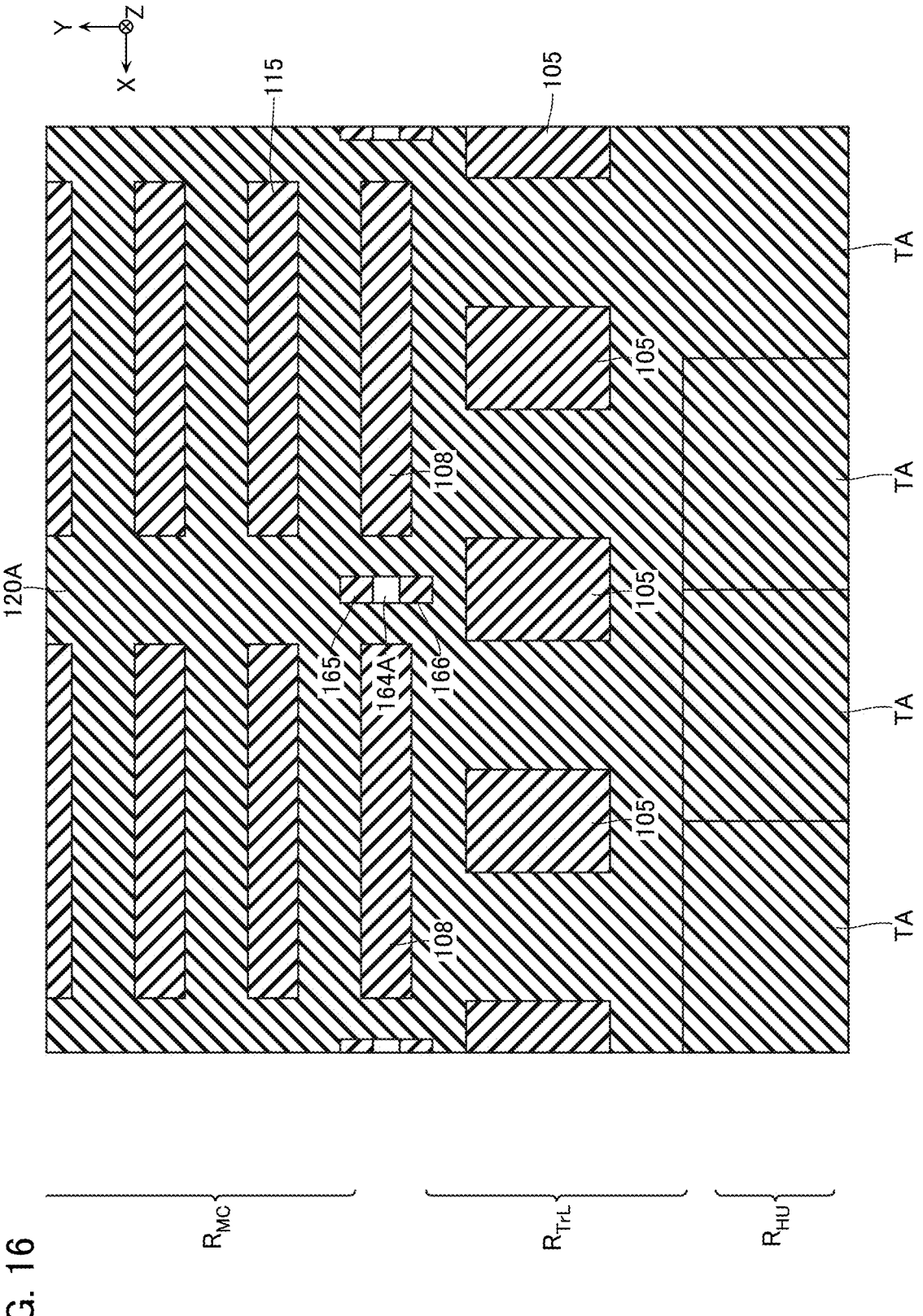
FIG. 16 is a schematic cross-sectional view for explaining the same method of manufacturing.
Figure 17:
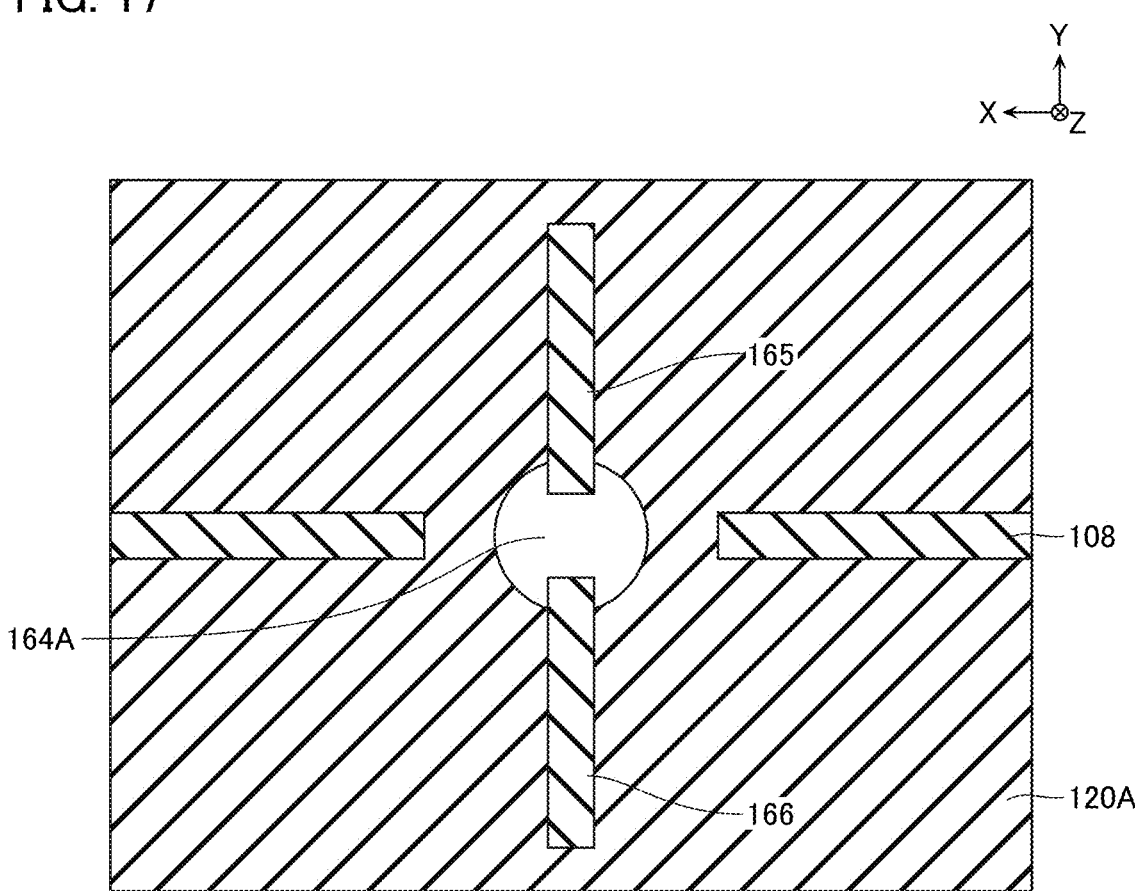
FIG. 17 is a schematic cross-sectional view for explaining the same method of manufacturing.
Figure 18:
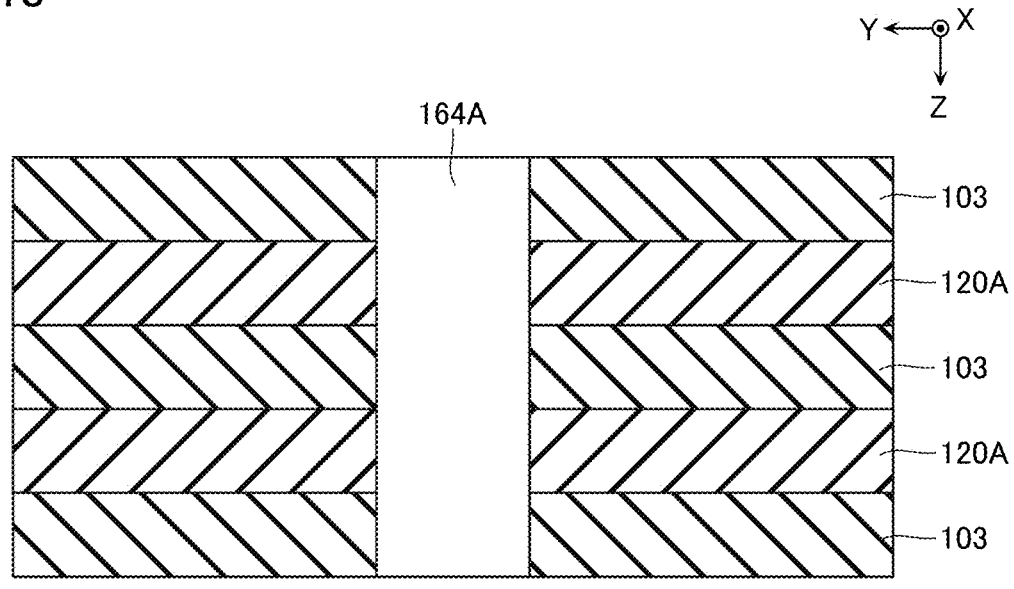
FIG. 18 is a schematic cross-sectional view for explaining the same method of manufacturing.

Next, as shown in FIGS. 16 to 18, for example, an opening 164A is formed at a position corresponding to the insulating layer 164. The opening 164A extends in the Z-direction and penetrates the plurality of insulating layers 103 and the plurality of sacrifice layers 120A arranged in the Z-direction, as shown in FIG. 18. This step is performed by the likes of RIE, for example. Note that parts of the insulating layers 165, 166 are exposed in an inner peripheral surface of the opening 164A. Moreover, the insulating layer 108 is not exposed in the inner peripheral surface of the opening 164A. That is, the opening 164A is formed at a position separated from the insulating layer 108.

Figure 19:
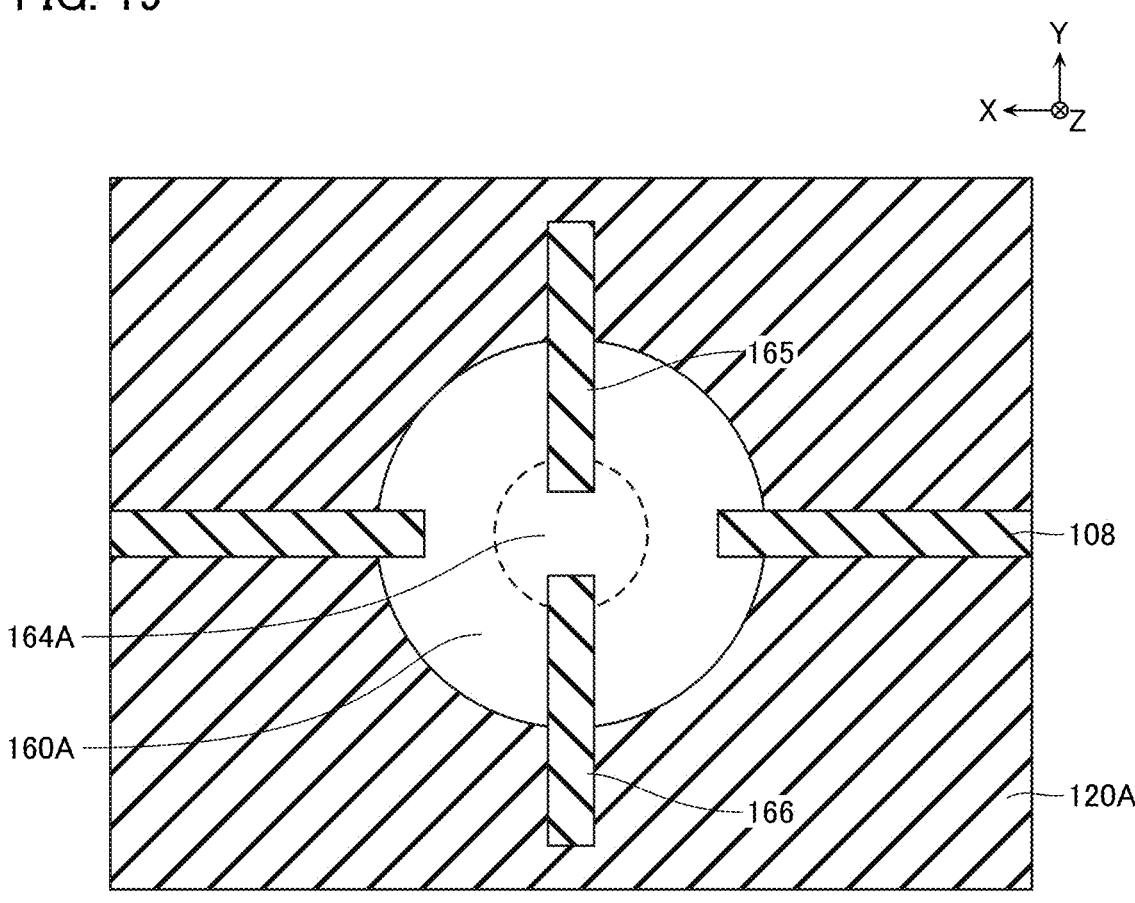
FIG. 19 is a schematic cross-sectional view for explaining the same method of manufacturing.
Figure 20:
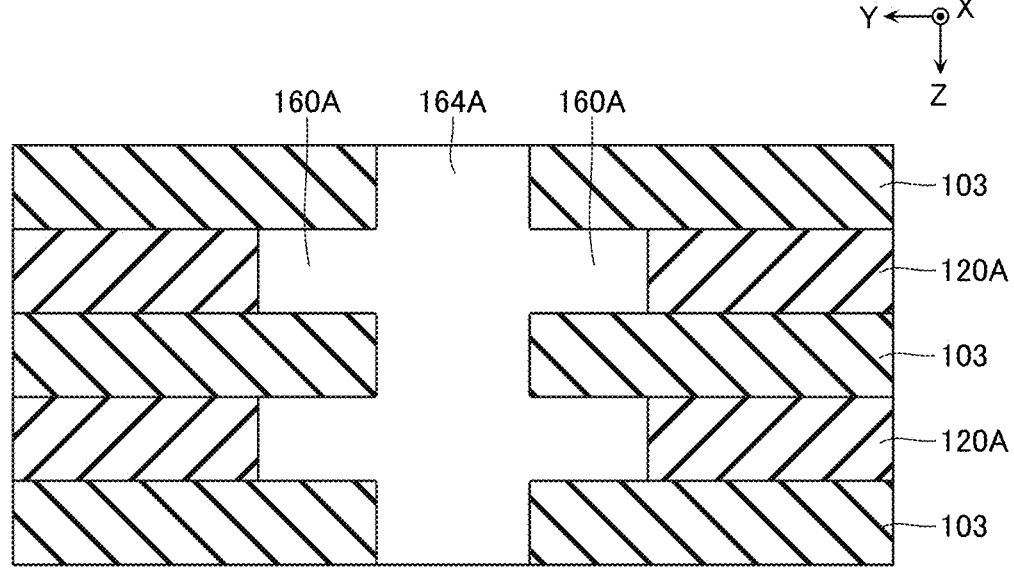
FIG. 20 is a schematic cross-sectional view for explaining the same method of manufacturing.

Next, as shown in FIGS. 19 and 20, for example, a part of the sacrifice layer 120A is selectively removed via the opening 164A. In this step, a part of the insulating layer 108 is exposed inside the opening 164A. This step is performed by the likes of wet etching, for example. Note that in the drawings, an opening formed in a portion where the sacrifice layer 120A had been provided, is indicated as an opening 160A.

Figure 21:
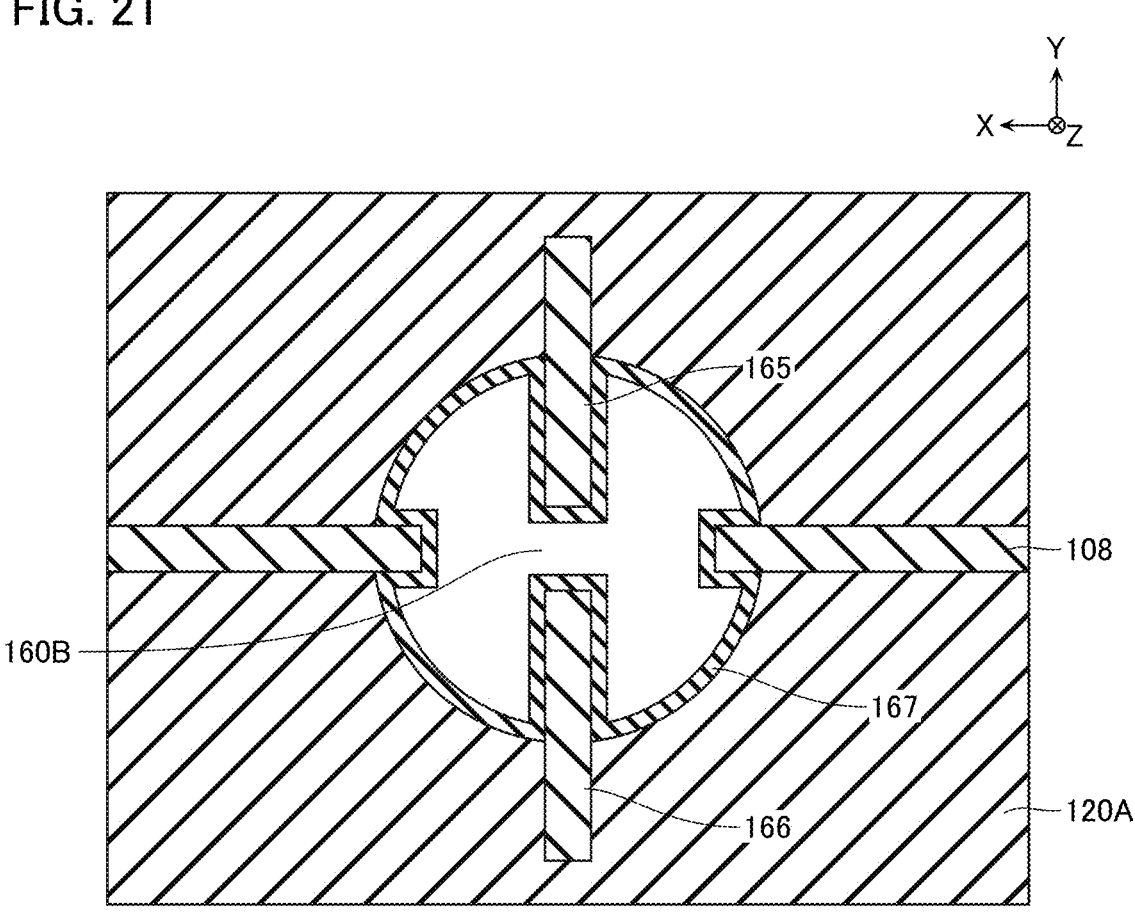
FIG. 21 is a schematic cross-sectional view for explaining the same method of manufacturing.
Figure 22:
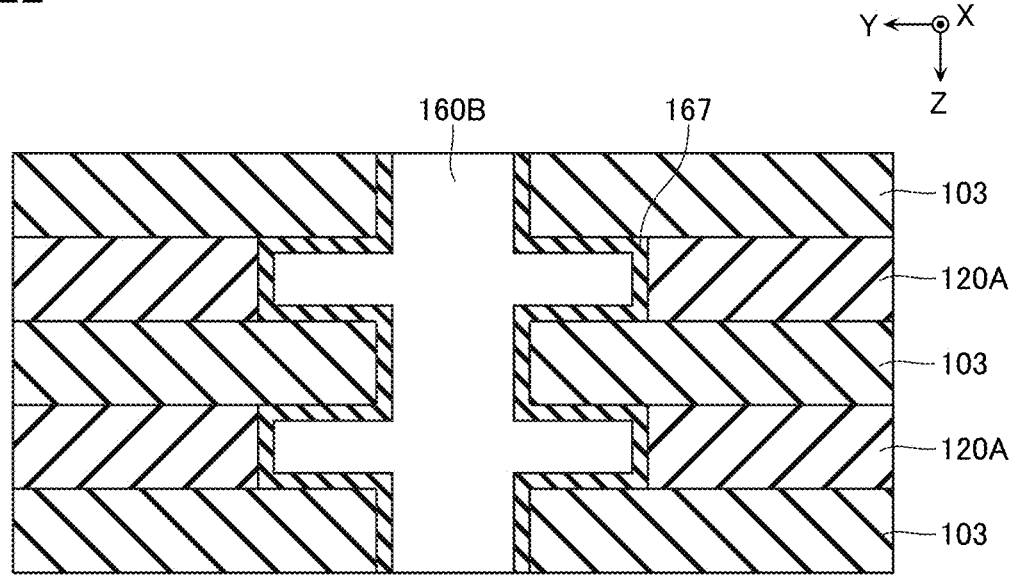
FIG. 22 is a schematic cross-sectional view for explaining the same method of manufacturing.
Figure 23:
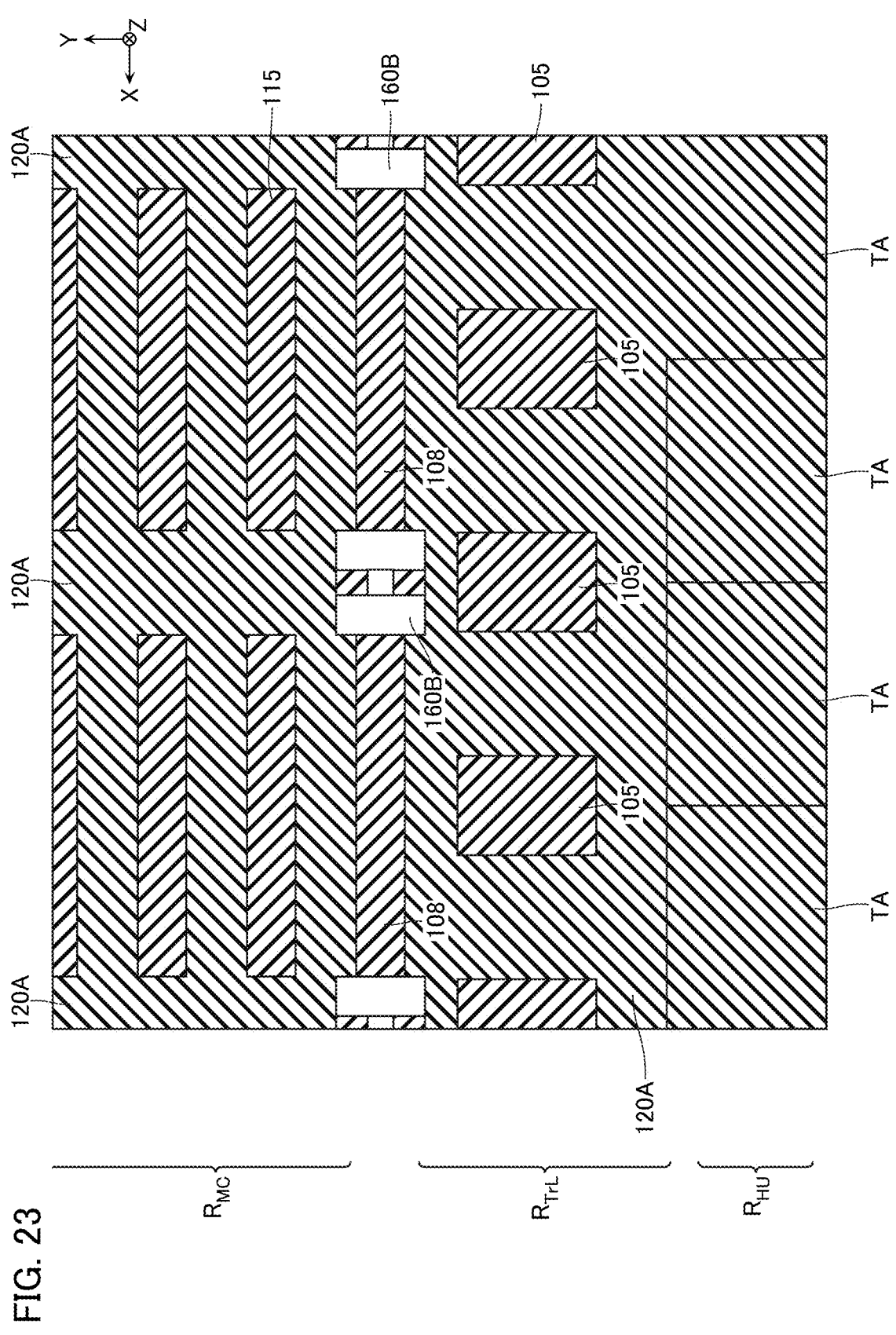
FIG. 23 is a schematic cross-sectional view for explaining the same method of manufacturing.

Next, as shown in FIGS. 21 to 23, for example, a sacrifice layer 167 is formed on upper and lower surfaces of the insulating layer 103 and a side surface of the sacrifice layer 120A exposed in the opening 160A, and on the inner peripheral surface of the opening 164A. The sacrifice layer 167 includes the likes of silicon oxide ($SiO_2$), for example. This step is performed by the likes of ALD (Atomic Layer Deposition), for example. Moreover, a sacrifice layer 160B is formed inside the openings 164A, 160A. The sacrifice layer 160B includes the likes of silicon (Si), for example. This step is performed by the likes of CVD, for example.

Figure 24:
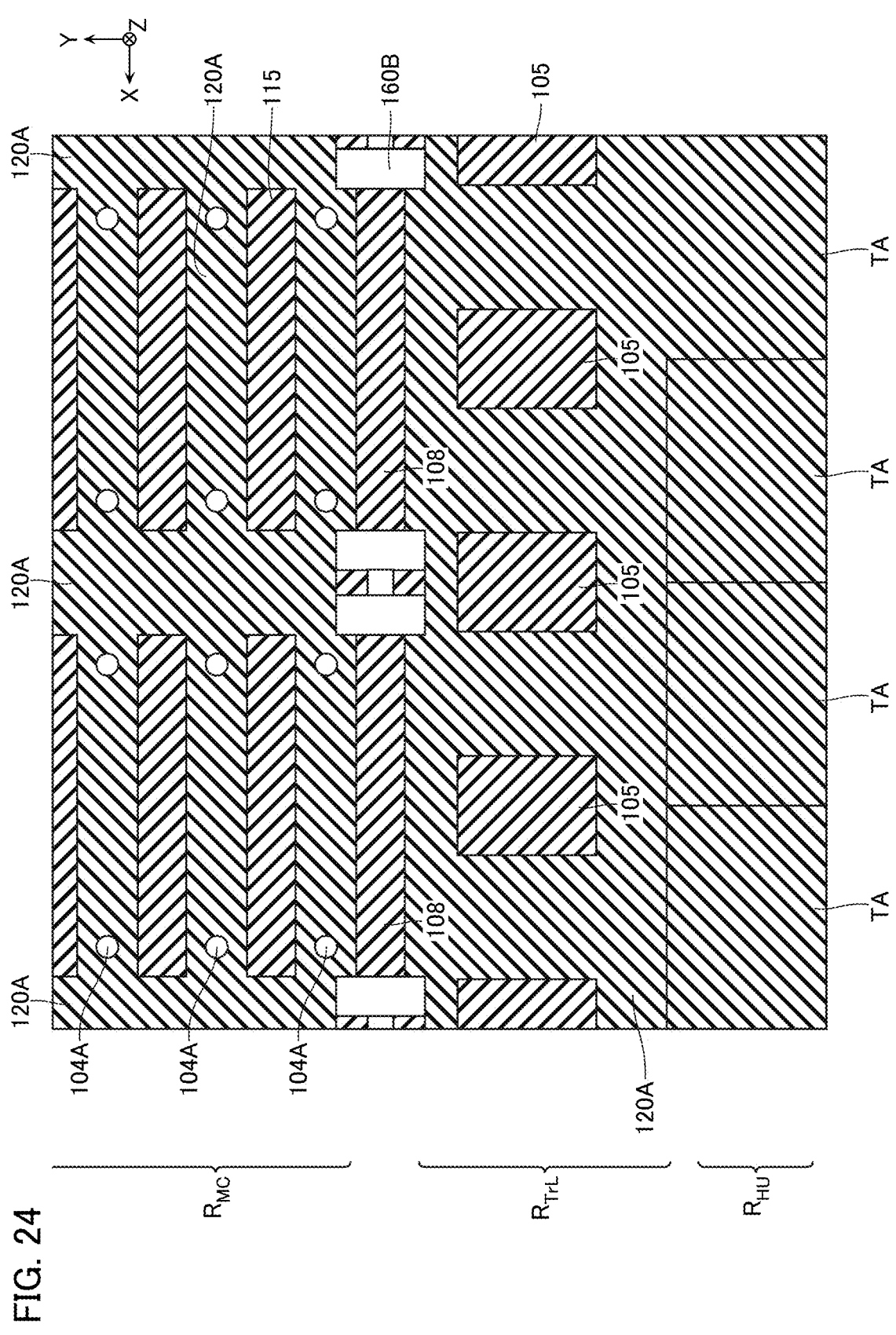
FIG. 24 is a schematic cross-sectional view for explaining the same method of manufacturing.
Figure 25:
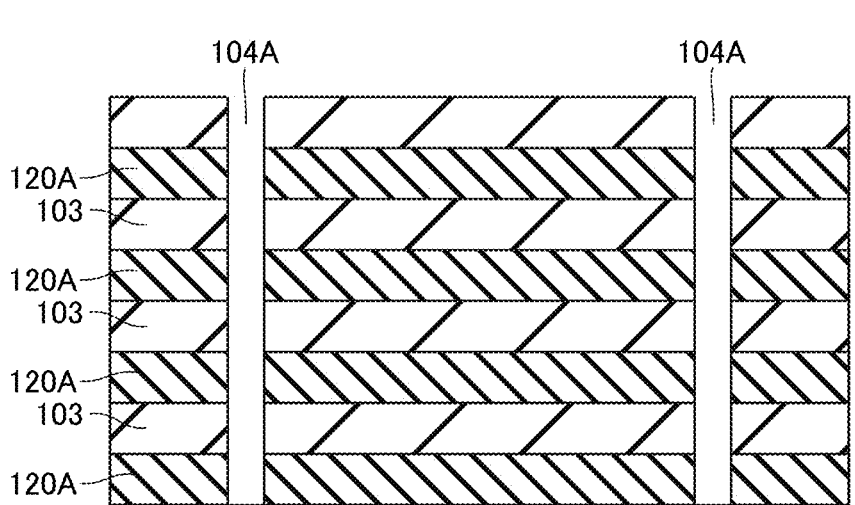
FIG. 25 is a schematic cross-sectional view for explaining the same method of manufacturing.
Figure 25:
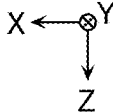

Next, as shown in FIGS. 24 and 25, for example, an opening 104A is formed at a position corresponding to the via wiring 104. The opening 104A extends in the Z-direction and penetrates the plurality of insulating layers 103 and the plurality of sacrifice layers 120A arranged in the Z-direction, as shown in FIG. 25. This step is performed by the likes of RIE, for example.

Figure 26:
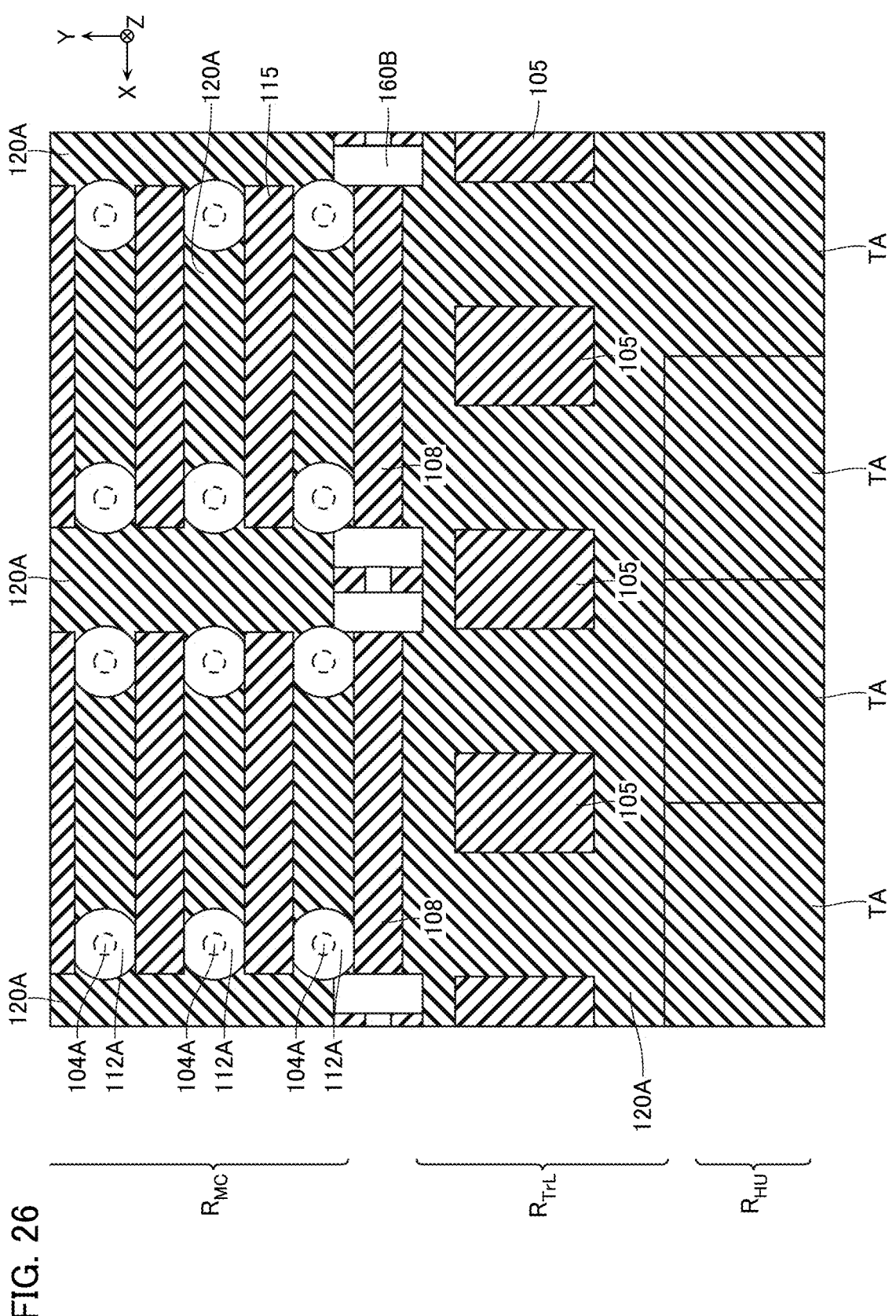
FIG. 26 is a schematic cross-sectional view for explaining the same method of manufacturing.
Figure 27:
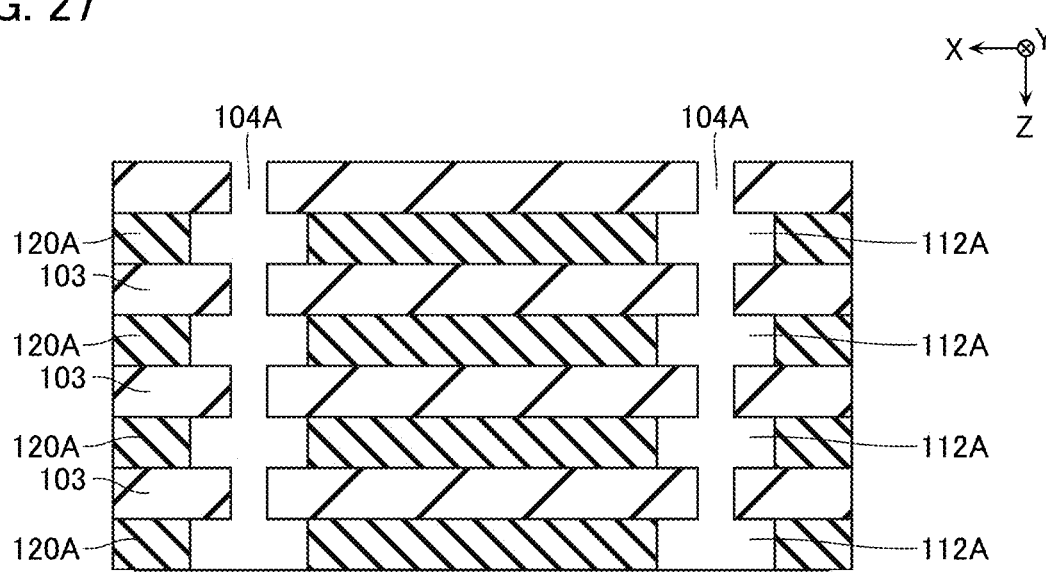
FIG. 27 is a schematic cross-sectional view for explaining the same method of manufacturing.

Next, as shown in FIGS. 26 and 27, for example, a part of the sacrifice layer 120A is selectively removed via the opening 104A. In this step, a side surface in the Y-direction of the insulating layer 115 is exposed inside the opening 104A, whereby the sacrifice layer 120A is divided in the X-direction. This step is performed by the likes of wet etching, for example. Note that in the drawings, an opening formed in a portion where the sacrifice layer 120A had been provided, is indicated as an opening 112A.

Figure 28:
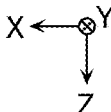
FIG. 28 is a schematic cross-sectional view for explaining the same method of manufacturing.
Figure 28:
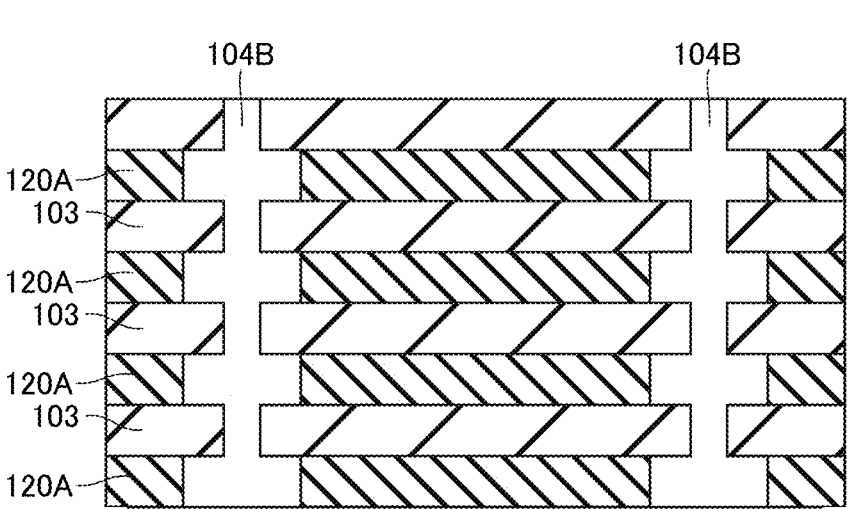

Next, as shown in FIG. 28, for example, a sacrifice layer 104B is formed inside the openings 104A, 112A. The sacrifice layer 104B includes the likes of silicon (Si), for example. This step is performed by the likes of CVD, for example.

Figure 29:
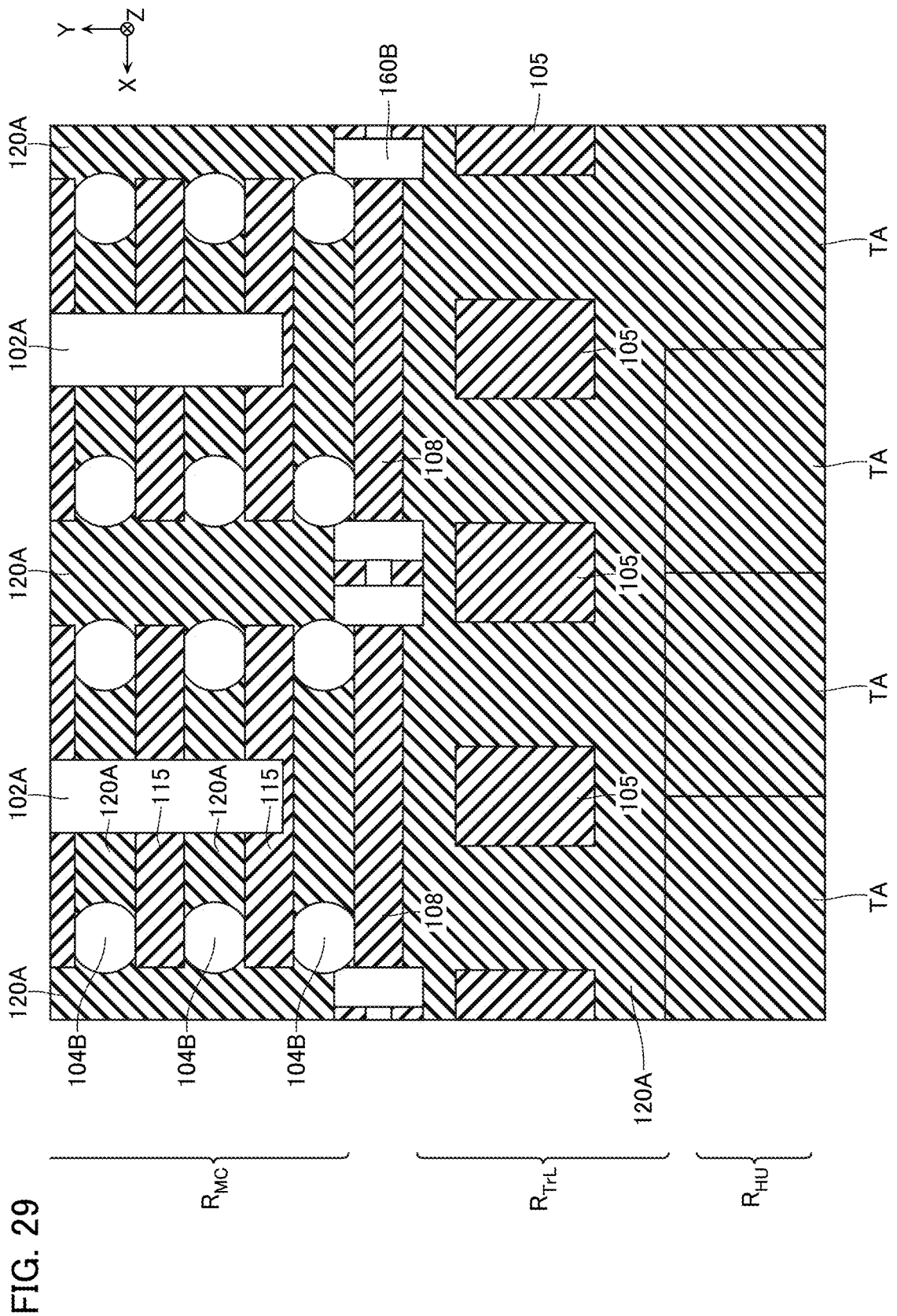
FIG. 29 is a schematic cross-sectional view for explaining the same method of manufacturing.
Figure 30:
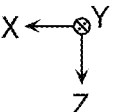
FIG. 30 is a schematic cross-sectional view for explaining the same method of manufacturing.
Figure 30:
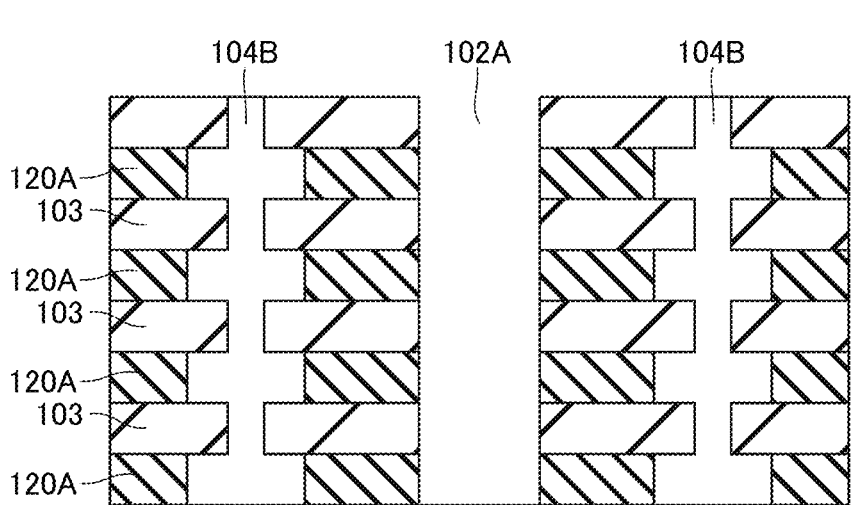

Next, as shown in FIGS. 29 and 30, for example, an opening 102A is formed at a position corresponding to the conductive layer 102. The opening 102A extends in the Z-direction and penetrates the plurality of insulating layers 103 and the plurality of sacrifice layers 120A arranged in the Z-direction, to divide these configurations in the X-direction, as shown in FIG. 30. This step is performed by the likes of RIE, for example.

Figure 31:
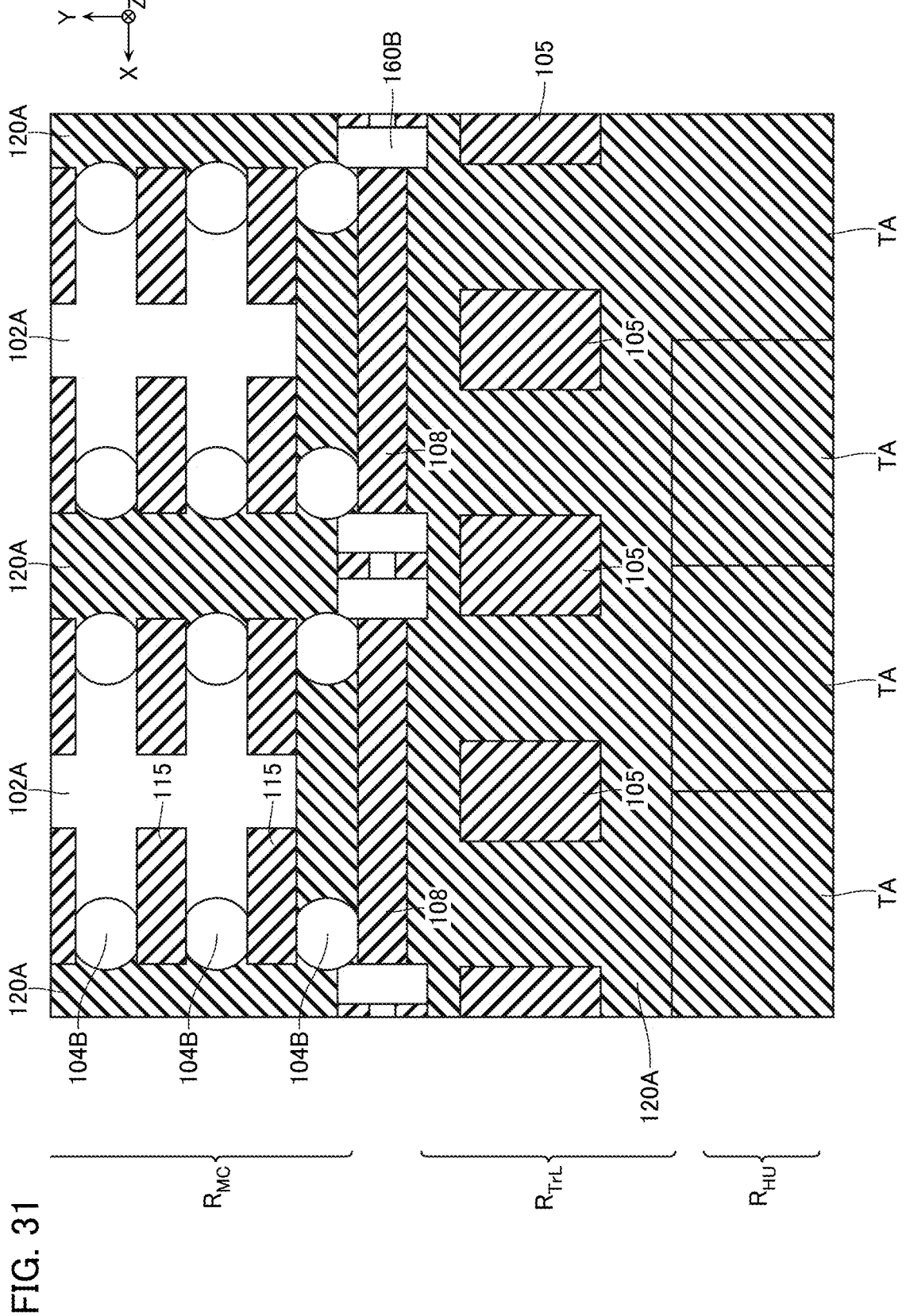
FIG. 31 is a schematic cross-sectional view for explaining the same method of manufacturing.
Figure 32:
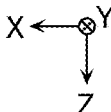
FIG. 32 is a schematic cross-sectional view for explaining the same method of manufacturing.
Figure 32:
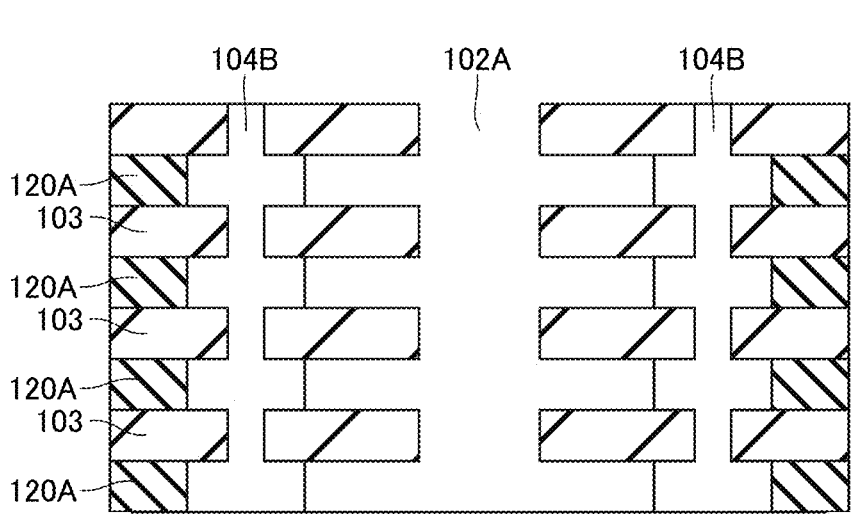

Next, as shown in FIGS. 31 and 32, for example, a part of the sacrifice layer 120A is selectively removed via the opening 102A. In this step, a side surface in the X-direction of the sacrifice layer 104B is exposed inside the opening 102A. This step is performed by the likes of wet etching, for example.

Figure 33:
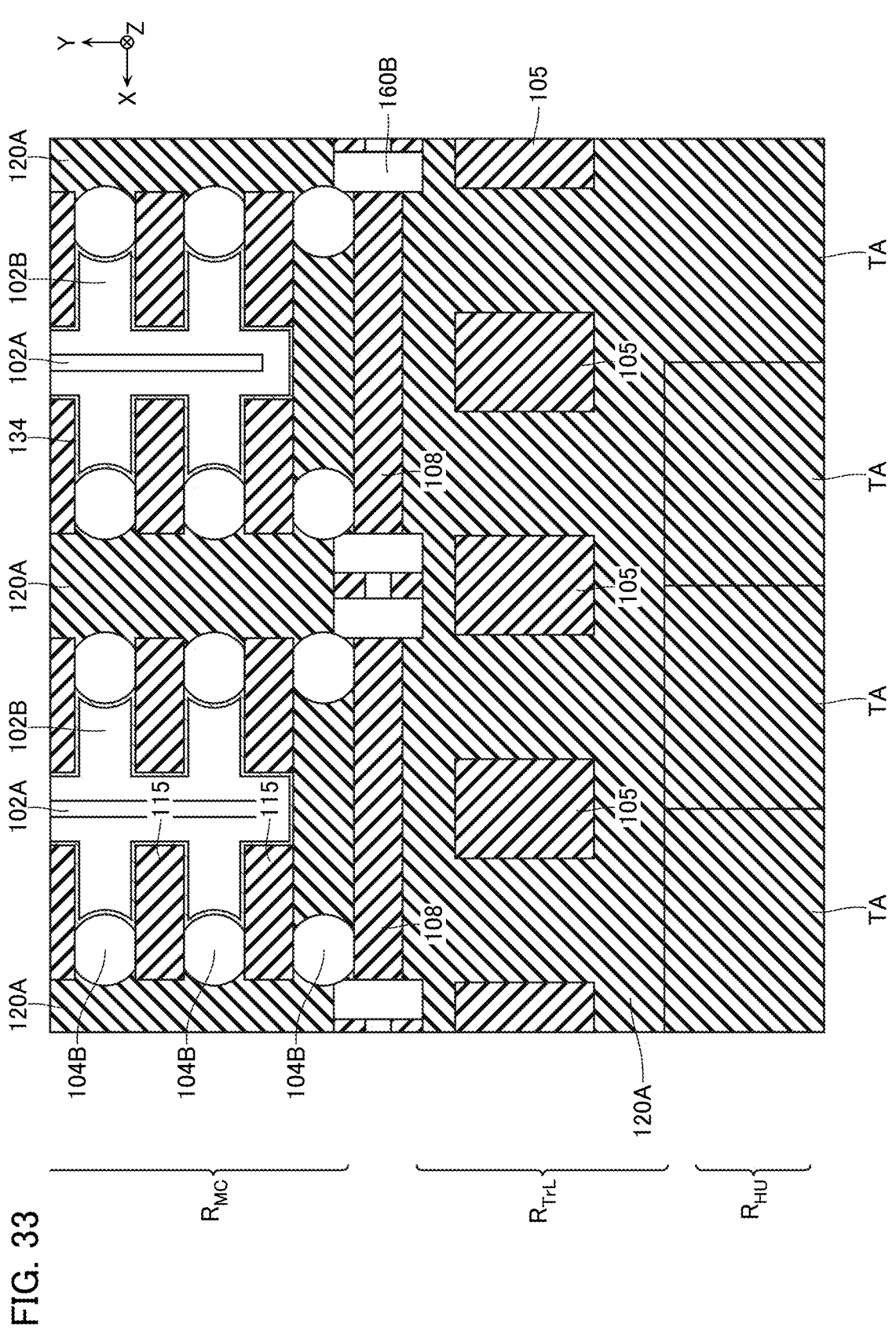
FIG. 33 is a schematic cross-sectional view for explaining the same method of manufacturing.
Figure 34:
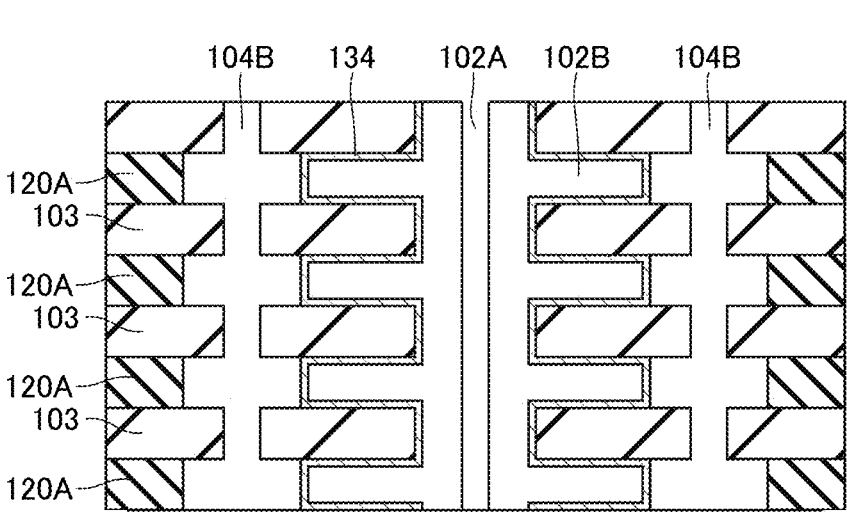
FIG. 34 is a schematic cross-sectional view for explaining the same method of manufacturing.
Figure 34:
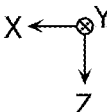

Next, as shown in FIGS. 33 and 34, for example, the conductive layer 134 is formed on a side surface on one side (an opening 102A side) in the X-direction of the sacrifice layer 104B, a side surface on one side (the opening 102A side) in the X-direction and both side surfaces in the Y-direction of the insulating layer 115, and an upper surface, a lower surface, and a side surface on one side (the opening 102A side) in the X-direction of the insulating layer 103 (FIG. 34), via the opening 102A. In addition, a sacrifice layer 102B is formed inside the opening 102A. The sacrifice layer 102B includes the likes of silicon (Si), for example. In this step, as shown in FIG. 34, for example, a region between two insulating layers 103 adjacent in the Z-direction is filled in by the sacrifice layer 102B. On the other hand, a region between two insulating layers 103 adjacent in the X-direction is not filled in by the sacrifice layer 102B. This step is performed by the likes of ALD and CVD, for example.

Figure 35:
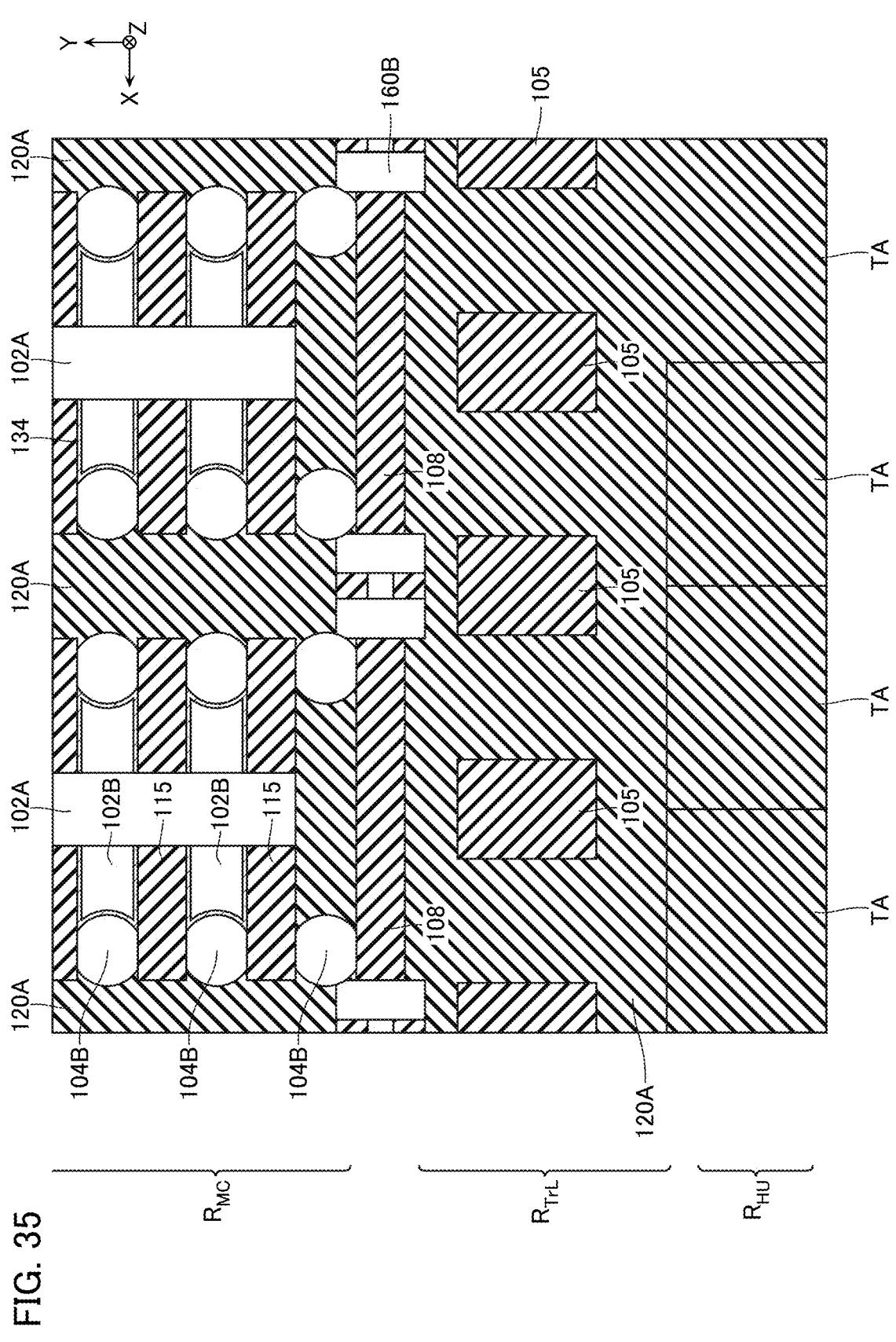
FIG. 35 is a schematic cross-sectional view for explaining the same method of manufacturing.
Figure 36:
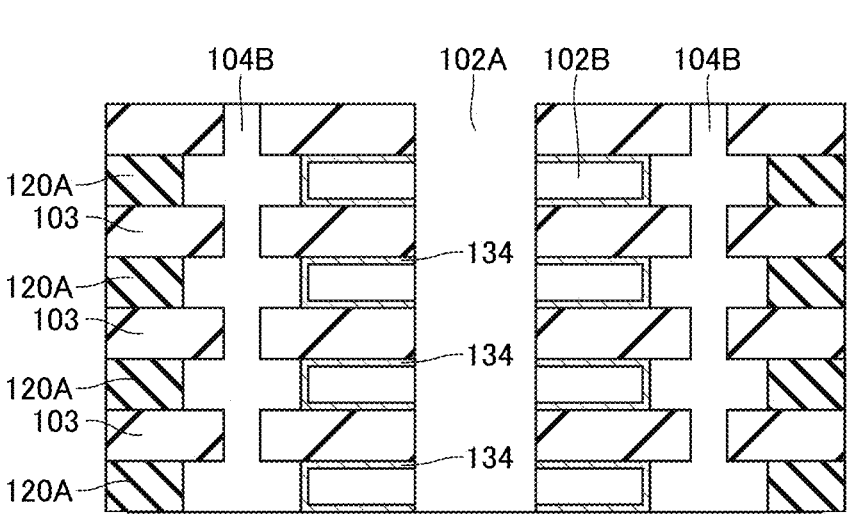
FIG. 36 is a schematic cross-sectional view for explaining the same method of manufacturing.
Figure 36:
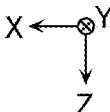

Next, as shown in FIGS. 35 and 36, for example, parts of the sacrifice layer 102B and the conductive layer 134 are removed via the opening 102A. In this step, for example, a part of the sacrifice layer 102B is removed, whereby a portion provided on side surfaces in the X-direction of the insulating layer 115 (FIG. 35) and insulating layer 103 (FIG. 36), of the conductive layer 134, is exposed, and this portion is removed. This step is performed by the likes of wet etching, for example.

Figure 37:
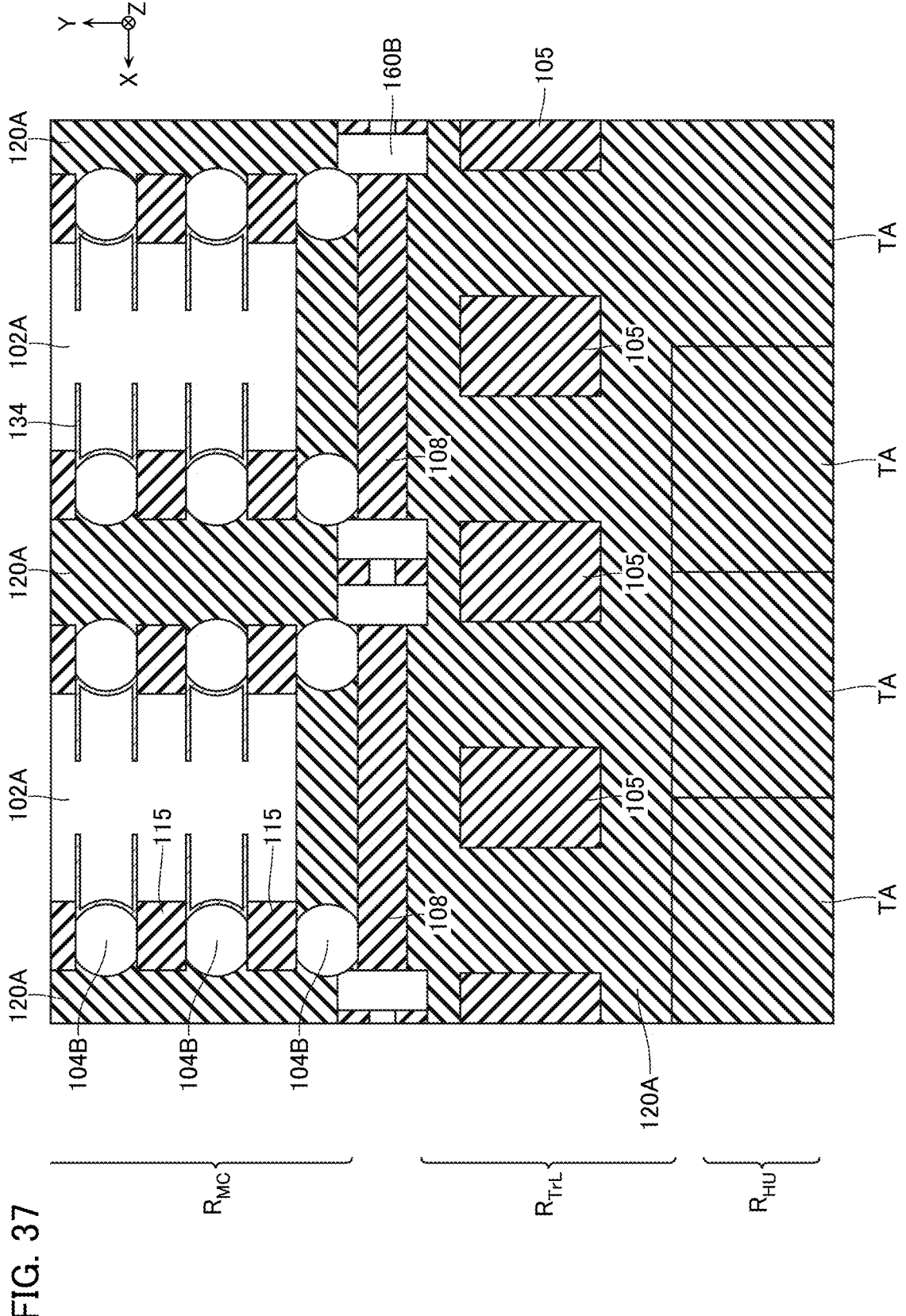
FIG. 37 is a schematic cross-sectional view for explaining the same method of manufacturing.
Figure 38:
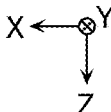
FIG. 38 is a schematic cross-sectional view for explaining the same method of manufacturing.
Figure 38:
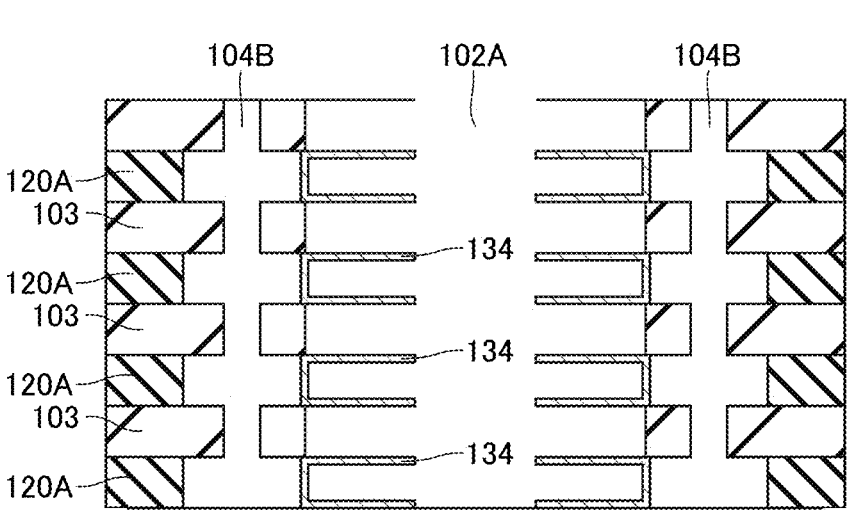

Next, as shown in FIGS. 37 and 38, for example, the sacrifice layer 102B, a part of the insulating layer 115 (FIG. 37), and a part of the insulating layer 103 (FIG. 38) are removed via the opening 102A. In this step, the sacrifice layer 102B is completely removed. Moreover, the insulating layer 115 (FIG. 37) and the insulating layer 103 (FIG. 38) are removed in a range limited enough to prevent the sacrifice layer 104B from being exposed in the opening 102A. This step is performed by the likes of wet etching, for example.

Figure 39:
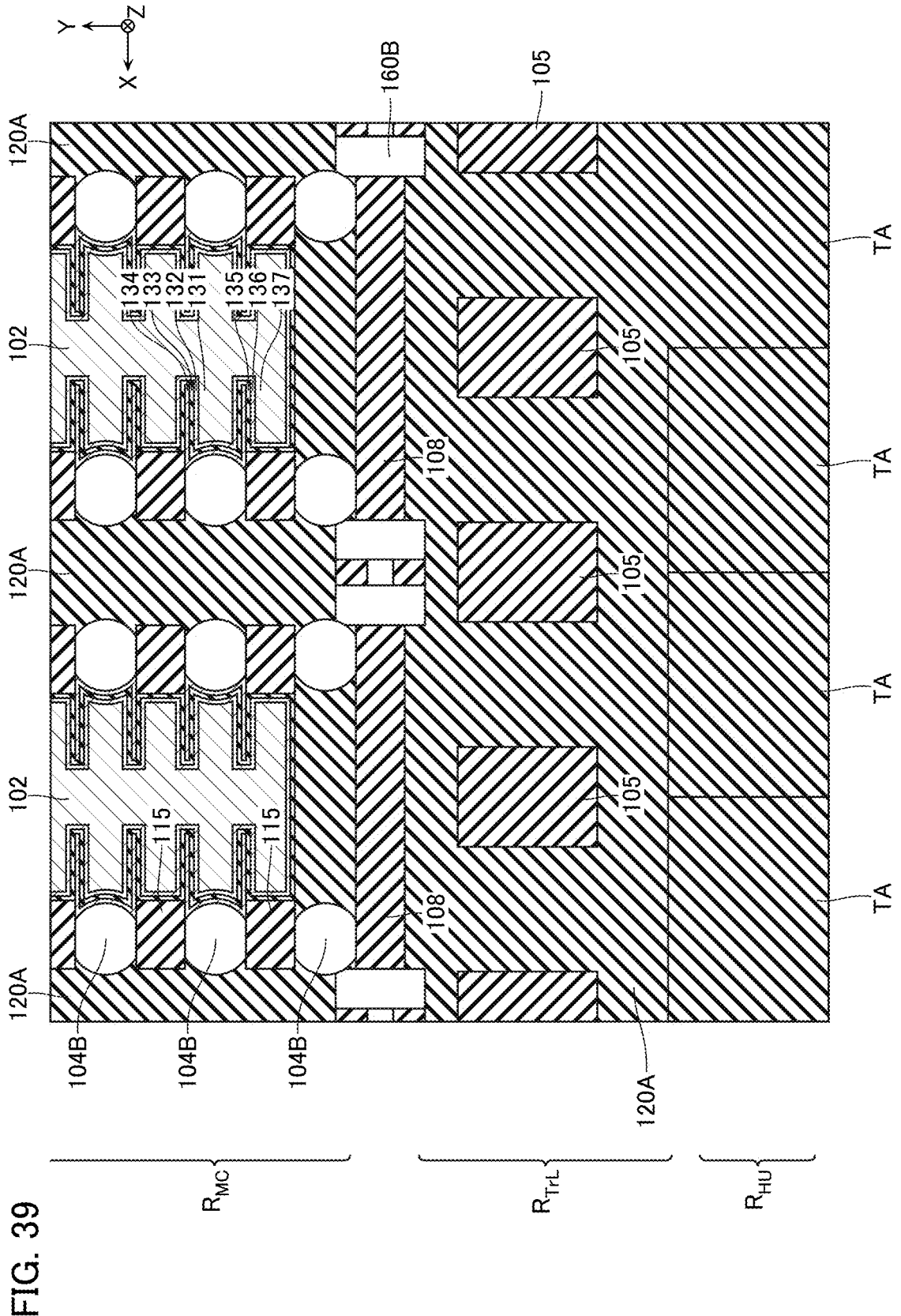
FIG. 39 is a schematic cross-sectional view for explaining the same method of manufacturing.
Figure 40:
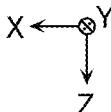
FIG. 40 is a schematic cross-sectional view for explaining the same method of manufacturing.
Figure 40:
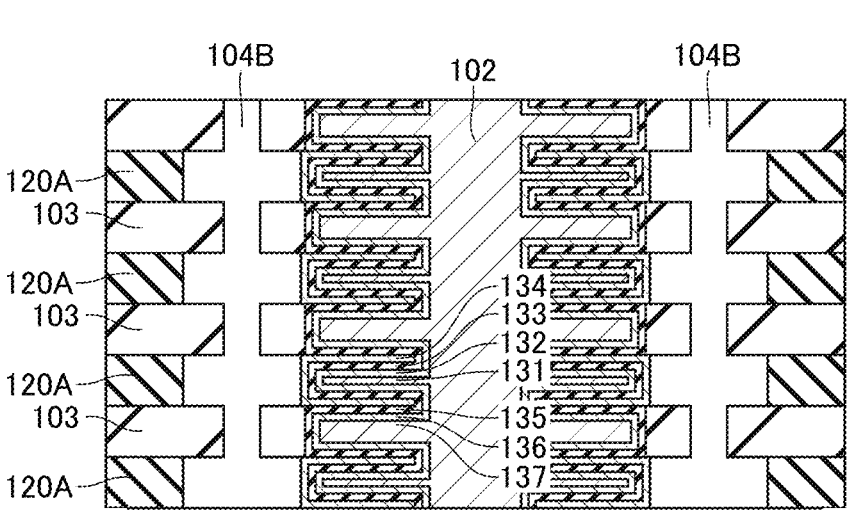

Next, as shown in FIGS. 39 and 40, for example, the insulating layers 133, 135, conductive layers 132, 136, and conductive layers 131, 137, 102 are formed on an upper surface, a lower surface, a side surface on one side (the opening 102A side) in the X-direction, and both side surfaces in the Y-direction of the conductive layer 134, via the opening 102A. This step is performed by the likes of CVD, for example.

Figure 41:
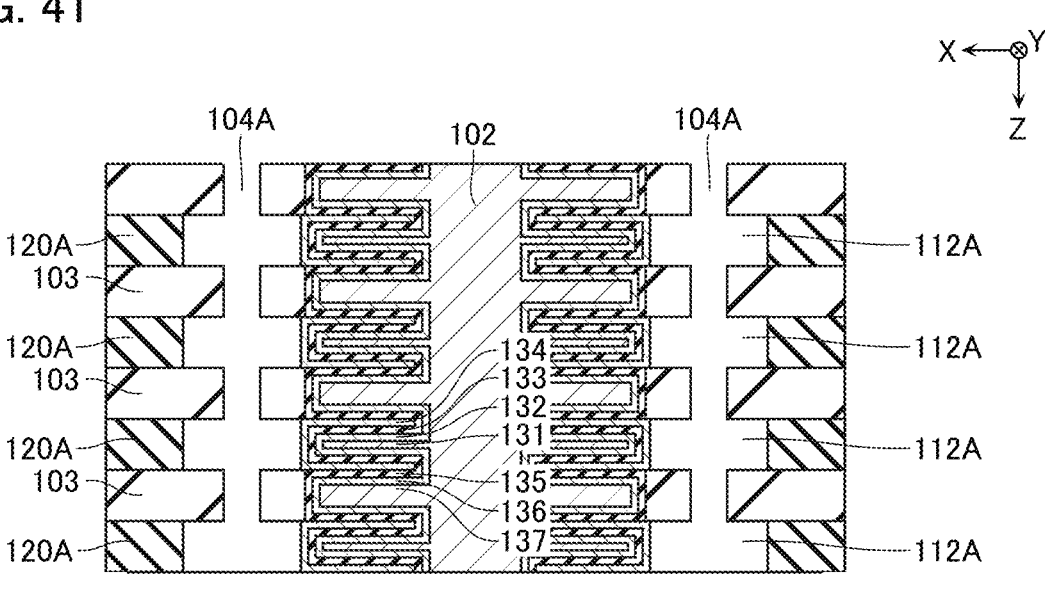
FIG. 41 is a schematic cross-sectional view for explaining the same method of manufacturing.

Next, as shown in FIG. 41, for example, the sacrifice layer 104B is removed. This step is performed by the likes of wet etching, for example.

Figure 42:
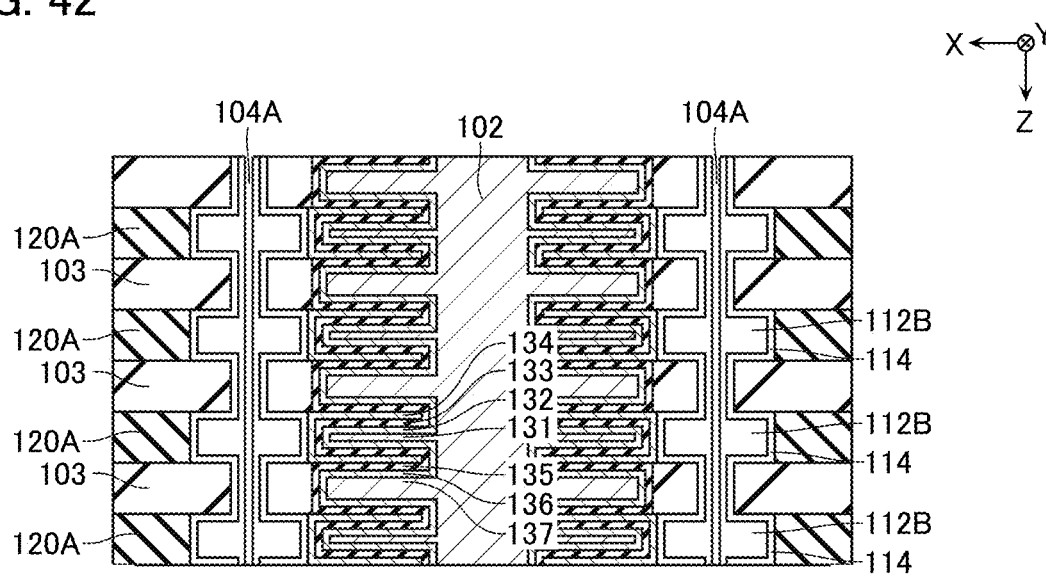
FIG. 42 is a schematic cross-sectional view for explaining the same method of manufacturing.

Next, as shown in FIG. 42, for example, the semiconductor layer 114 is formed on side surfaces in the X-direction of the sacrifice layer 120A and the conductive layer 134, side surfaces in the Y-direction of the insulating layer 115, and an upper surface and a lower surface of the insulating layer 103, via the opening 104A. In addition, a sacrifice layer 112B is formed in the opening 112A. In this step, the opening 112A is filled in by the sacrifice layer 112B. On the other hand, the opening 104A is not filled in by the sacrifice layer 112B. This step is performed by the likes of ALD and CVD, for example.

Figure 43:
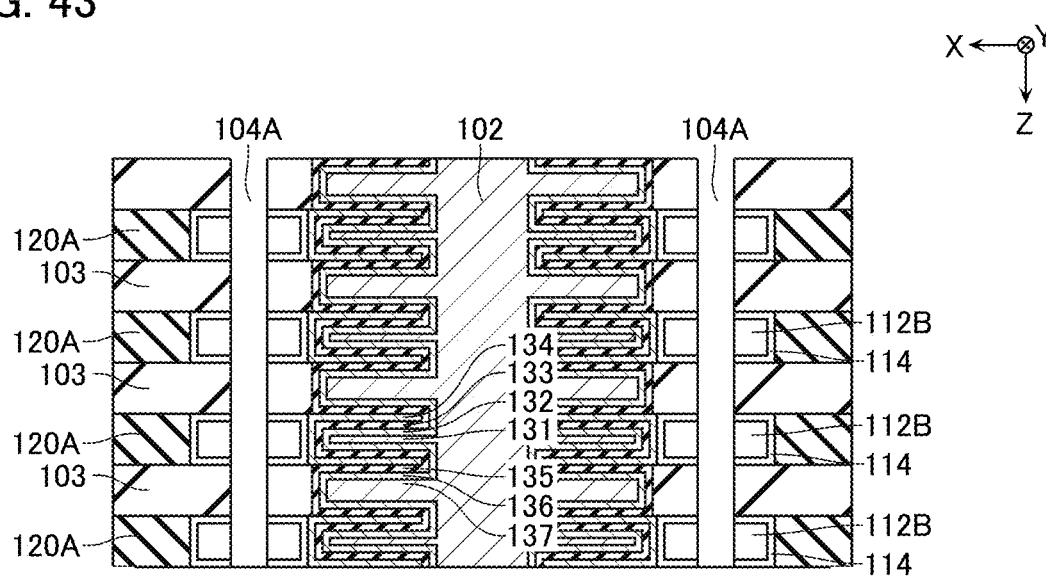
FIG. 43 is a schematic cross-sectional view for explaining the same method of manufacturing.

Next, as shown in FIG. 43, for example, parts of the sacrifice layer 112B and the semiconductor layer 114 are removed via the opening 104A. In this step, for example, a part of the sacrifice layer 112B is removed, whereby a portion provided on an inner peripheral surface of the insulating layer 103, of the semiconductor layer 114 is exposed, and this portion is removed. This step is performed by the likes of wet etching, for example.

Figure 44:
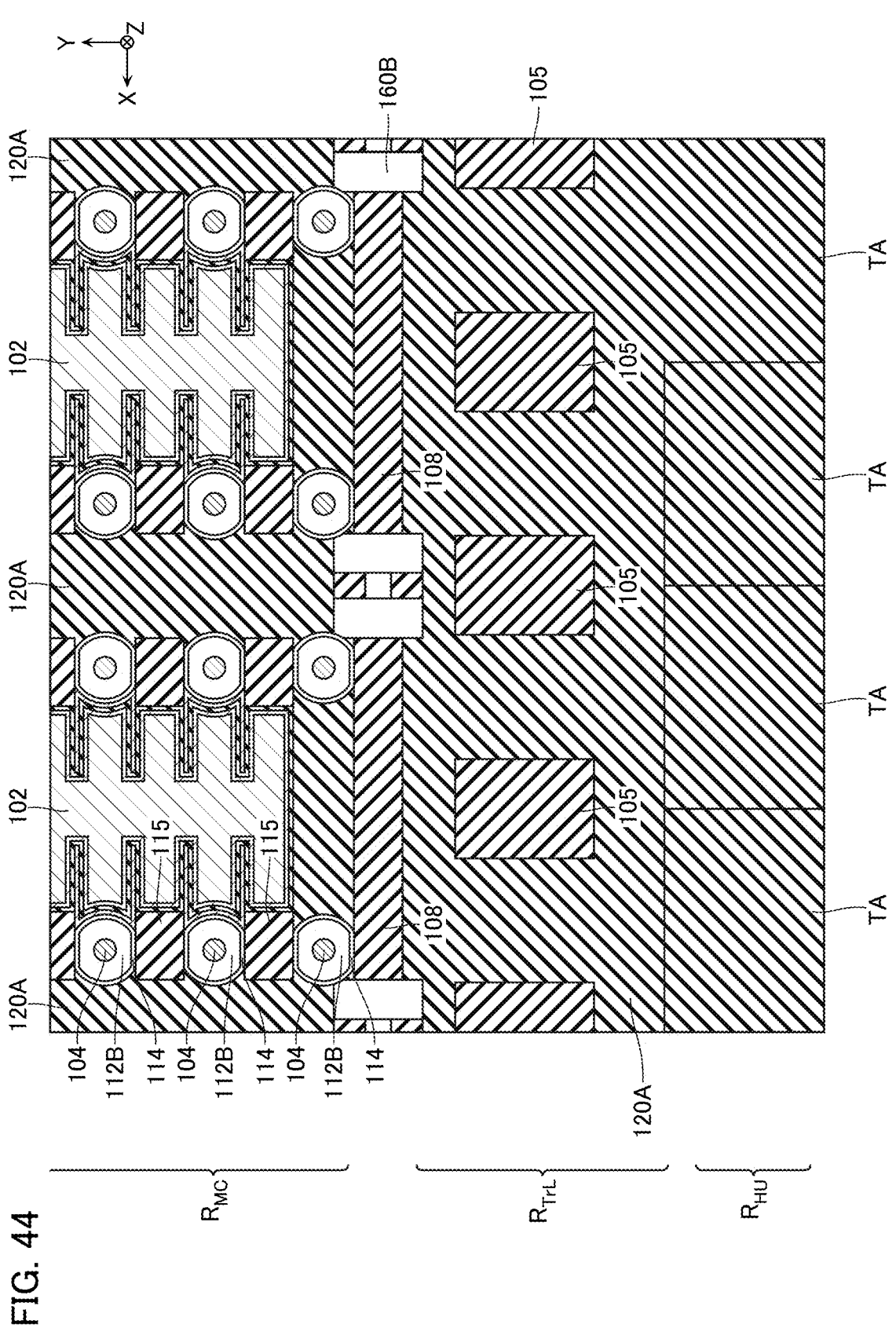
FIG. 44 is a schematic cross-sectional view for explaining the same method of manufacturing.
Figure 45:
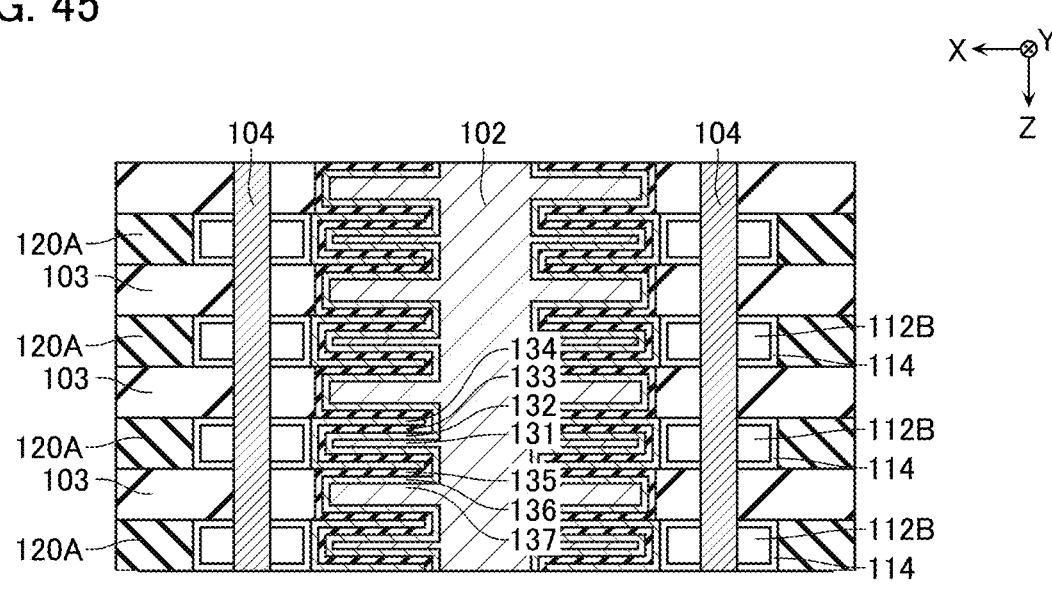
FIG. 45 is a schematic cross-sectional view for explaining the same method of manufacturing.

Next, as shown in FIGS. 44 and 45, for example, the via wiring 104 is formed inside the opening 104A. This step is performed by the likes of ALD and CVD, for example.

Figure 46:
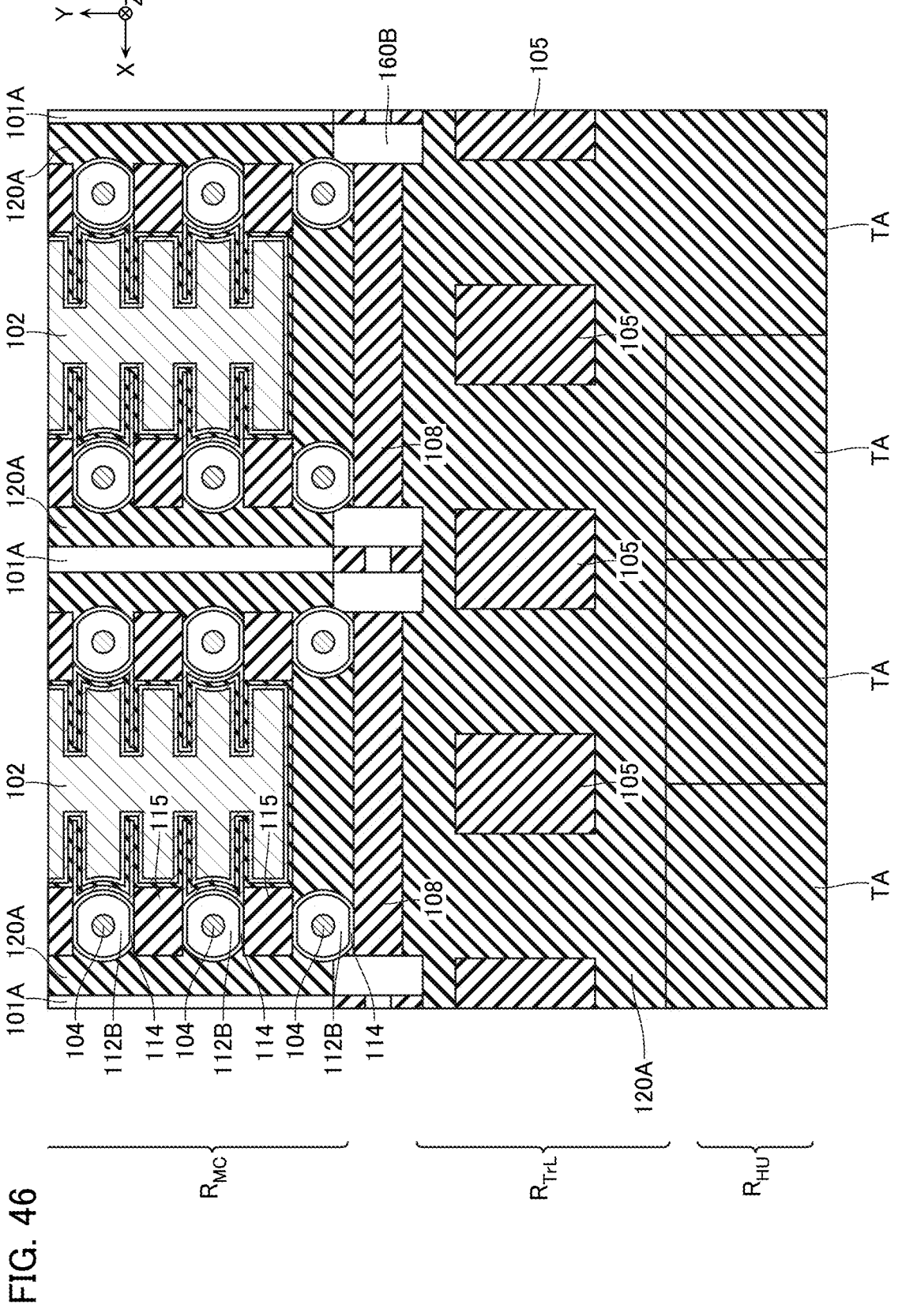
FIG. 46 is a schematic cross-sectional view for explaining the same method of manufacturing.
Figure 47:
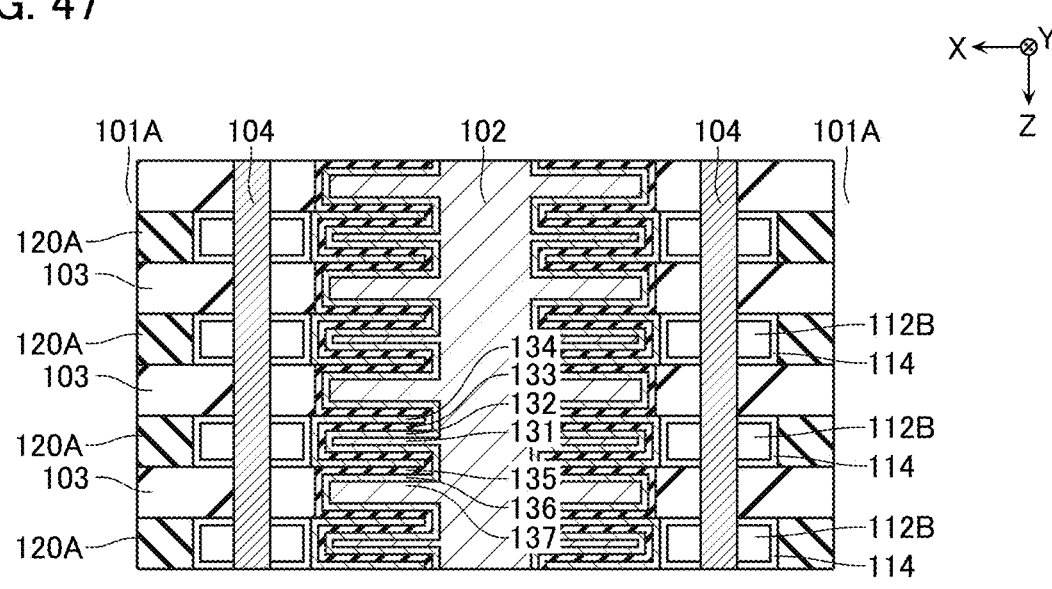
FIG. 47 is a schematic cross-sectional view for explaining the same method of manufacturing.

Next, as shown in FIGS. 46 and 47, for example, an opening 101A is formed in a region within the memory cell region R$_{MC}$, of a position corresponding to the insulating layer 101. The opening 101A extends in the Z-direction and penetrates the plurality of insulating layers 103 and the plurality of sacrifice layers 120A arranged in the Z-direction, to divide these configurations in the X-direction, as shown in FIG. 47. This step is performed by the likes of RIE, for example.

Figure 48:
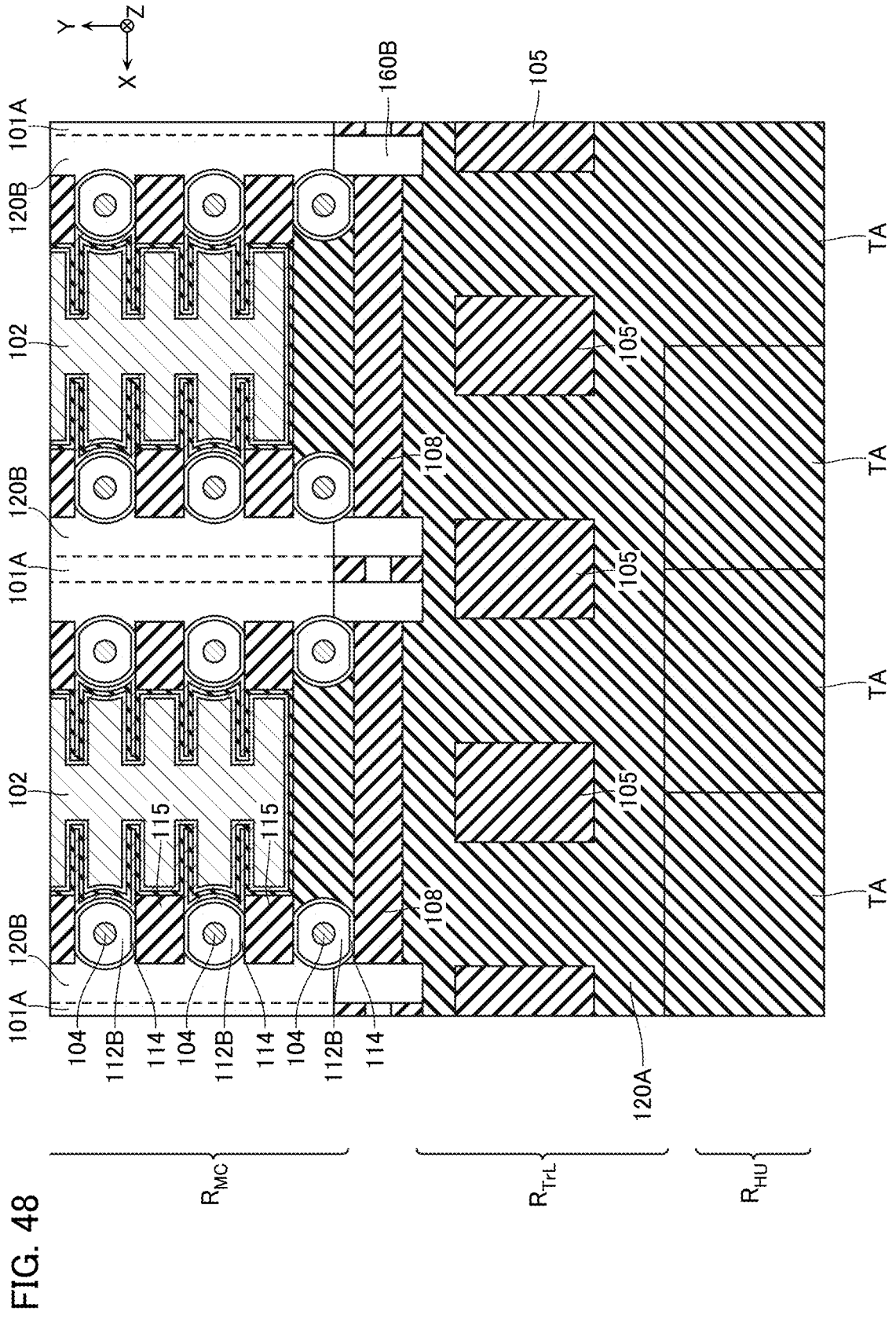
FIG. 48 is a schematic cross-sectional view for explaining the same method of manufacturing.
Figure 49:
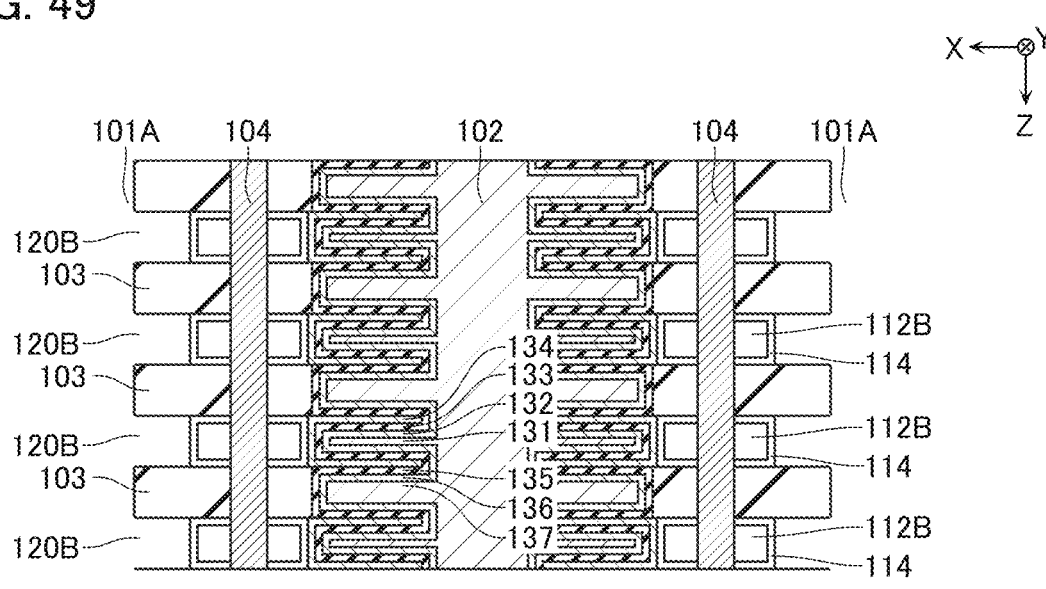
FIG. 49 is a schematic cross-sectional view for explaining the same method of manufacturing.

Next, as shown in FIGS. 48 and 49, for example, the sacrifice layer 120A within the memory cell region R$_{MC}$ is removed via the opening 101A. This step is performed by the likes of wet etching, for example. Note that in the drawings, an opening formed in a portion where the sacrifice layer 120A had been provided, is indicated as an opening 120B.

Figure 50:
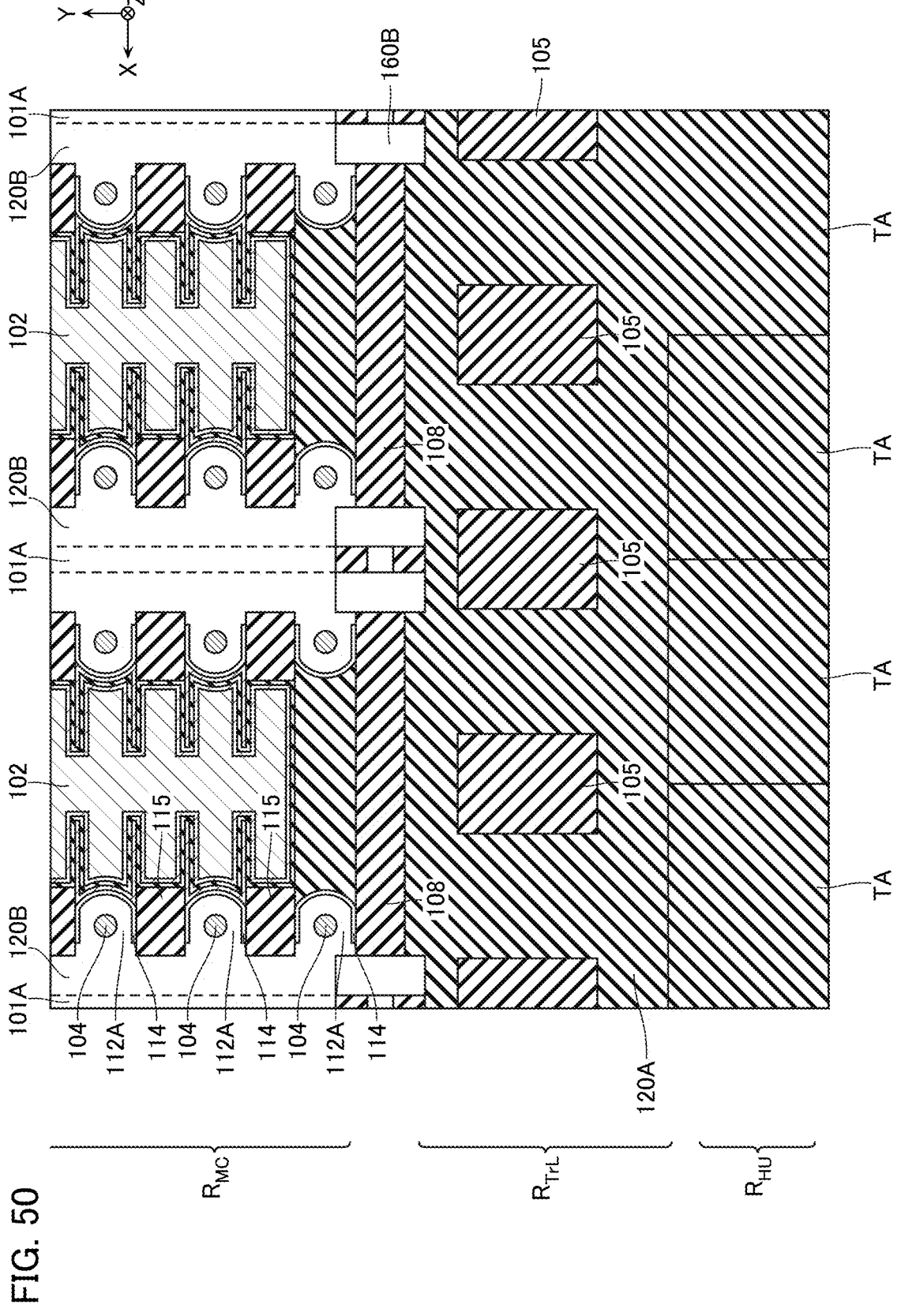
FIG. 50 is a schematic cross-sectional view for explaining the same method of manufacturing.
Figure 51:
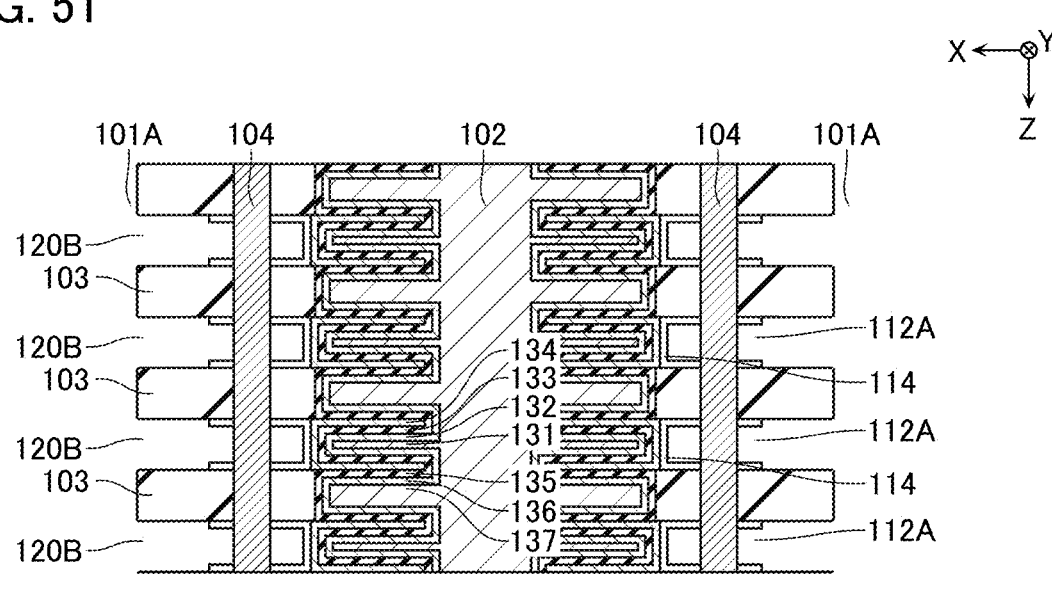
FIG. 51 is a schematic cross-sectional view for explaining the same method of manufacturing.

Next, as shown in FIGS. 50 and 51, for example, a part of the semiconductor layer 114 is removed, and a part of the sacrifice layer 112B is exposed, via the openings 101A, 120B. In addition, the sacrifice layer 112B is removed, and the outer peripheral surface of the via wiring 104 is exposed, via the openings 101A, 120B. This step is performed by the likes of wet etching, for example.

Figure 52:
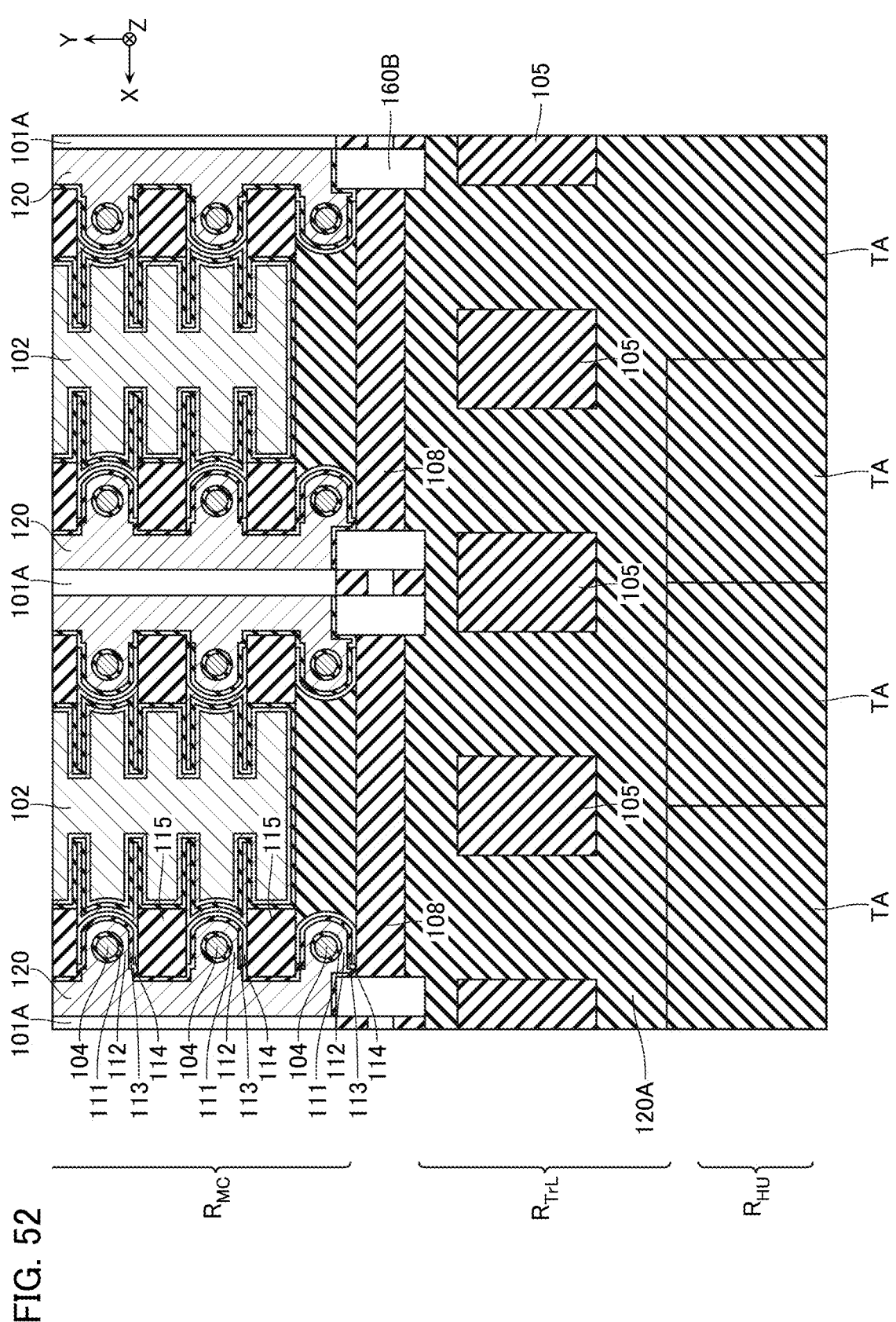
FIG. 52 is a schematic cross-sectional view for explaining the same method of manufacturing.
Figure 53:
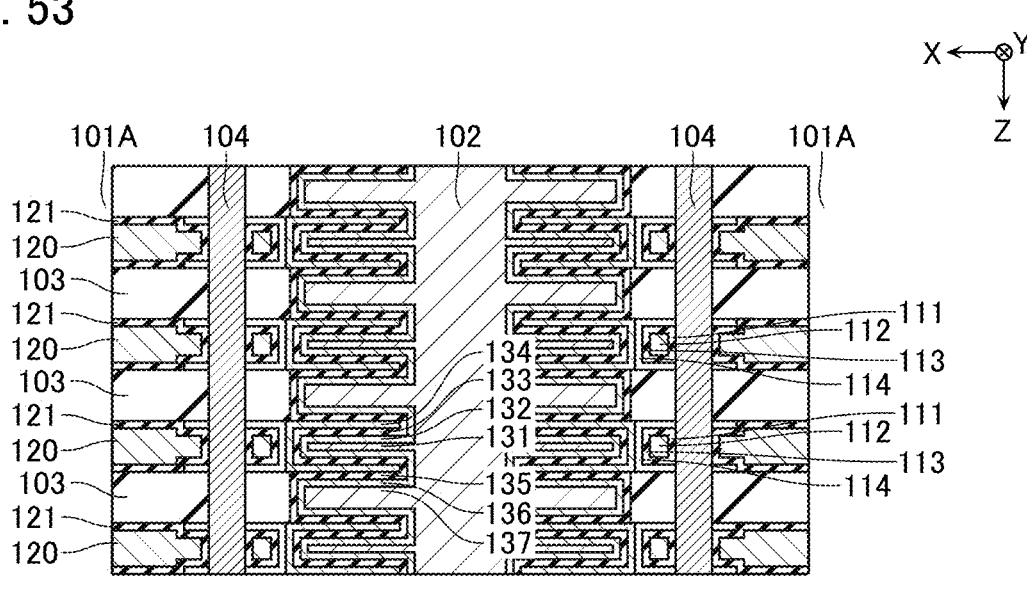
FIG. 53 is a schematic cross-sectional view for explaining the same method of manufacturing.

Next, as shown in FIGS. 52 and 53, for example, the insulating layers 111, 113, 121 are formed, and the conductive layers 112, 120 are formed, inside the opening 120B. In this step, insulating layers and conductive layers are formed in the openings 101A, 120B by the likes of CVD, for example. At this time, the opening 120B is filled in by the conductive layers. On the other hand, the opening 101A is not filled in by the conductive layers. Next, portions provided on a side surface in the X-direction of the insulating layer 103 and a side surface in the Y-direction of the insulating layer 101, of these insulating layers and conductive layers, are removed by the likes of wet etching, for example.

Figures 54, 55:
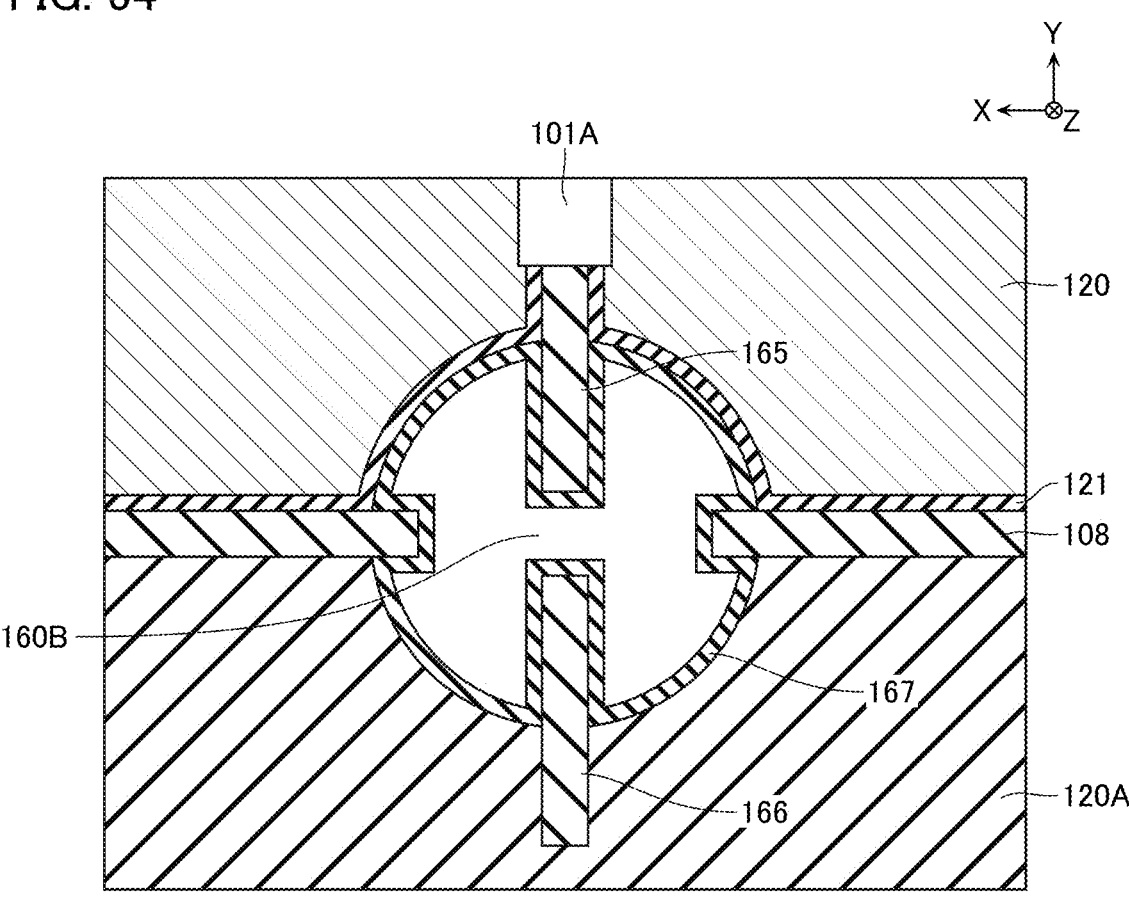
FIG. 54 is a schematic cross-sectional view for explaining the same method of manufacturing.
FIG. 55 is a schematic cross-sectional view for explaining the same method of manufacturing.

Note that as shown in FIGS. 54 and 55, in this step, a part of the insulating layer 121 is formed on a surface exposed to the opening 120B, of the sacrifice layer 167.

Figure 56:
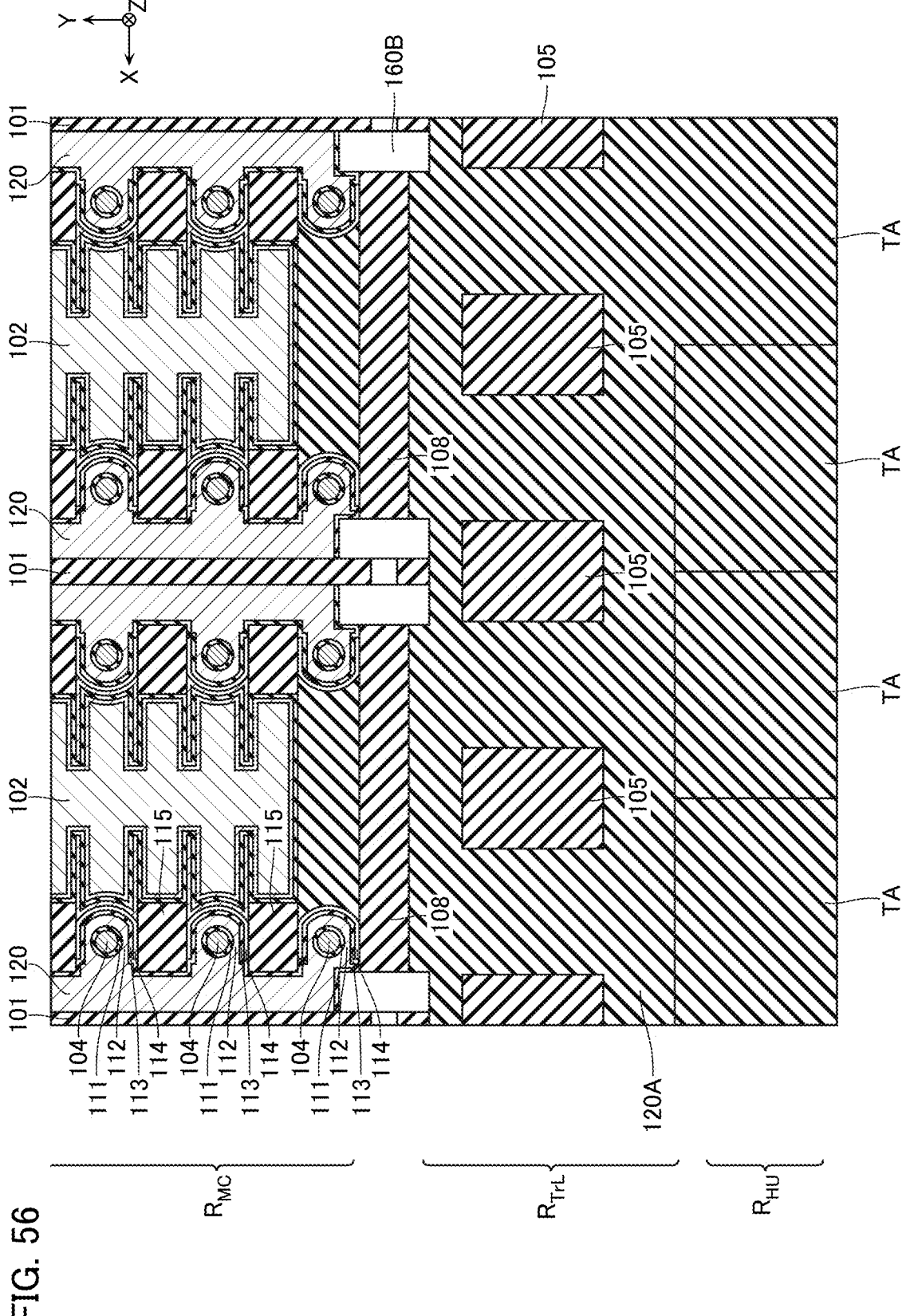
FIG. 56 is a schematic cross-sectional view for explaining the same method of manufacturing.

Next, as shown in FIG. 56, for example, a part of the insulating layer 101 is formed. This step is performed by the likes of CVD, for example.

Figure 57:
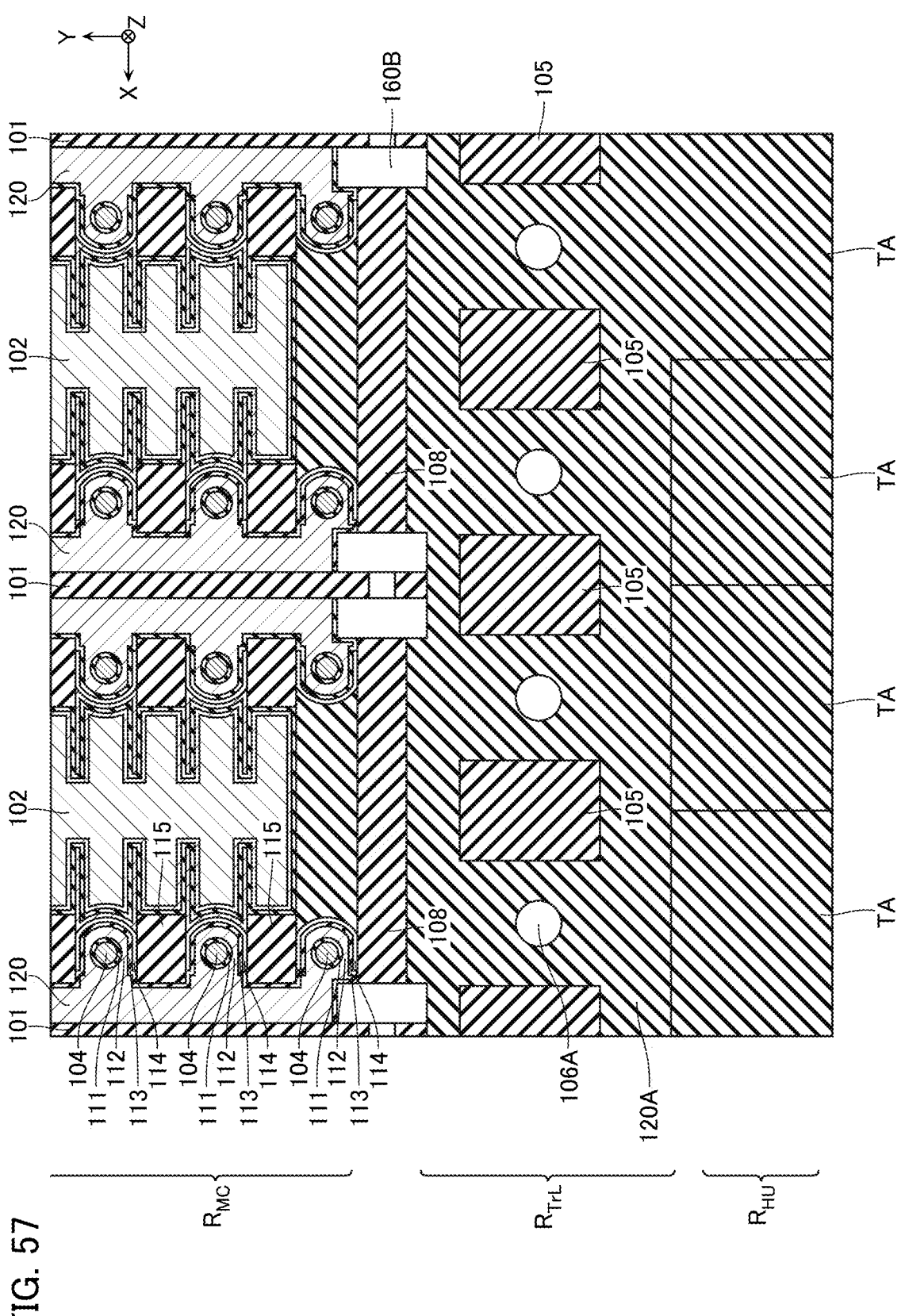
FIG. 57 is a schematic cross-sectional view for explaining the same method of manufacturing.
Figure 58:
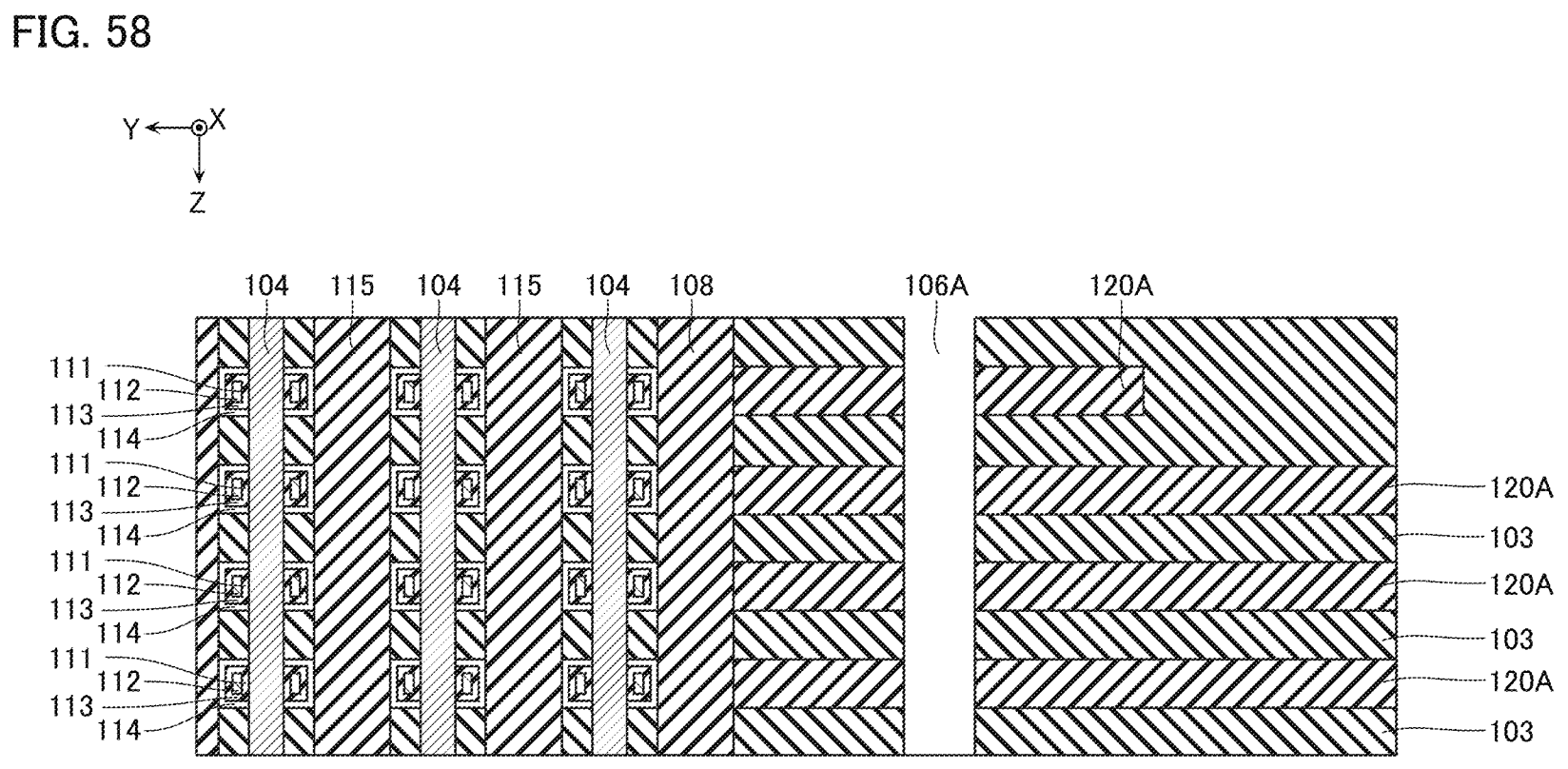

Next, as shown in FIGS. 57 and 58, for example, an opening 106A is formed at a position corresponding to the via wiring 106. The opening 106A extends in the Z-direction and penetrates the plurality of insulating layers 103 and the plurality of sacrifice layers 120A arranged in the Z-direction, as shown in FIG. 58. This step is performed by the likes of RIE, for example.

Figure 59:
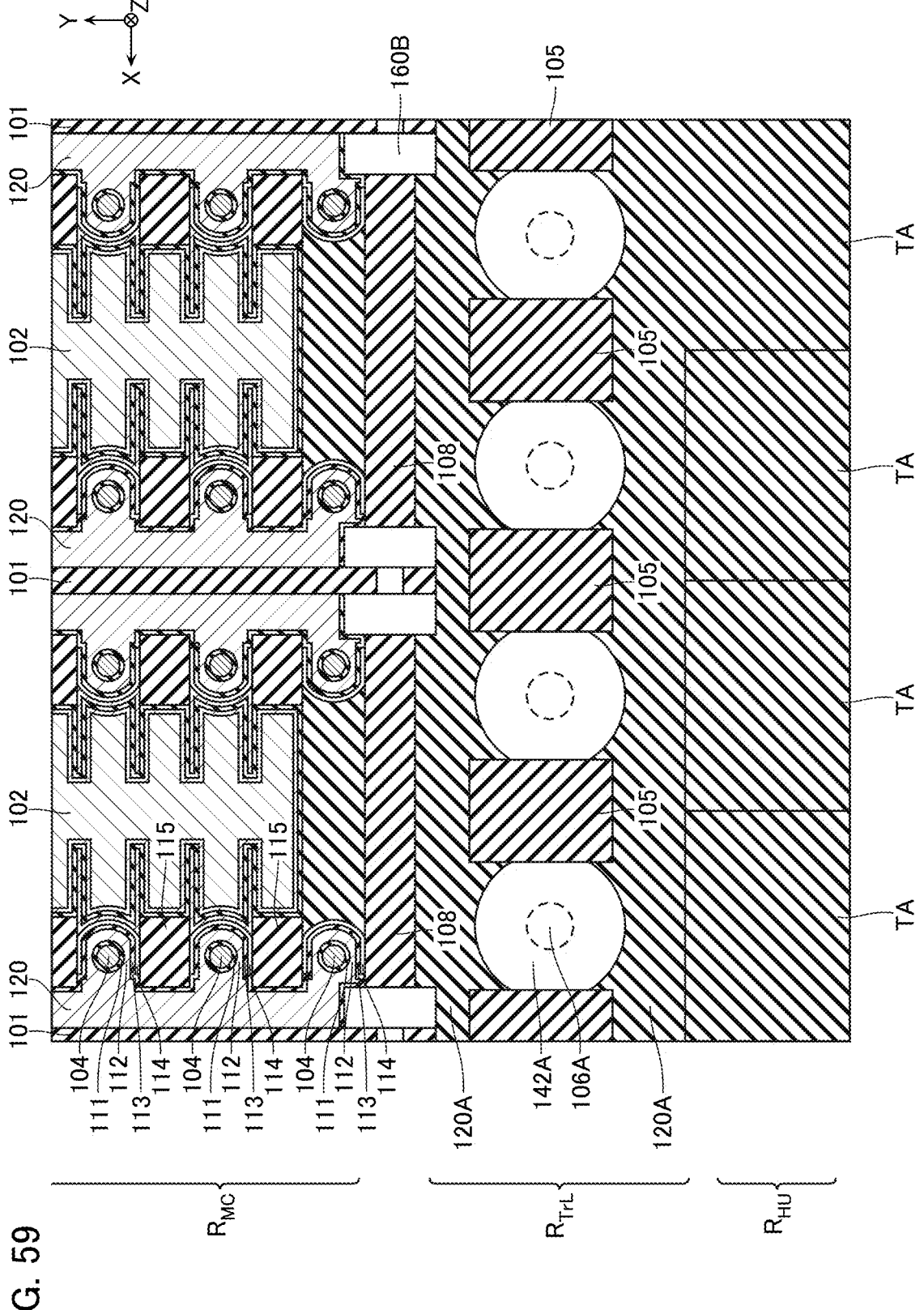
FIG. 59 is a schematic cross-sectional view for explaining the same method of manufacturing.
Figure 60:
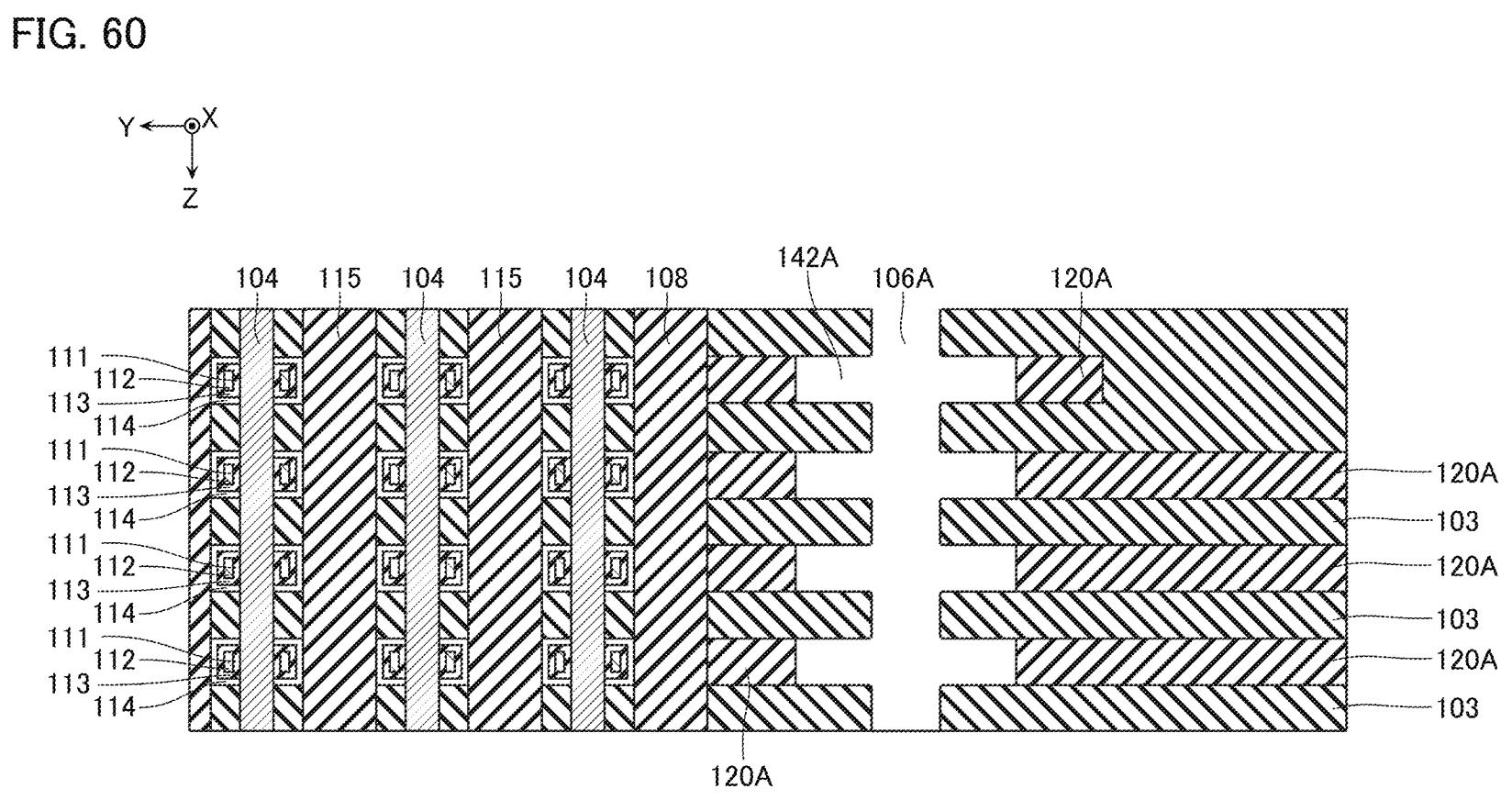

Next, as shown in FIGS. 59 and 60, for example, a part of the sacrifice layer 120A is selectively removed via the opening 106A. In this step, side surfaces in the X-direction of the insulating layers 105 are exposed inside the opening 106A, whereby the sacrifice layer 120A is divided in the Y-direction. This step is performed by the likes of wet etching, for example. Note that in the drawings, an opening formed in a portion where the sacrifice layer 120A had been provided, is indicated as an opening 142A.

Figure 61:
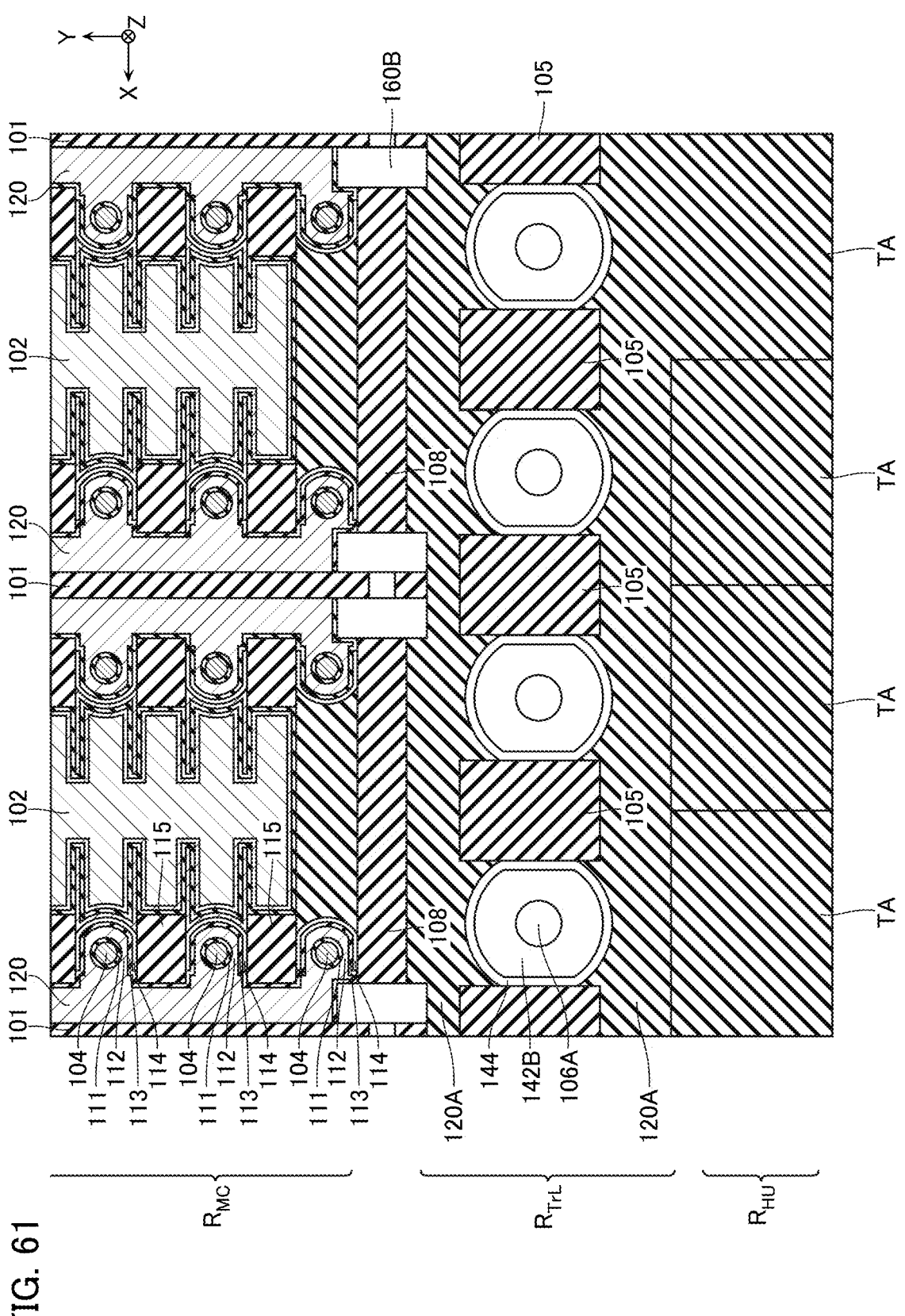
FIG. 61 is a schematic cross-sectional view for explaining the same method of manufacturing.
Figure 62:
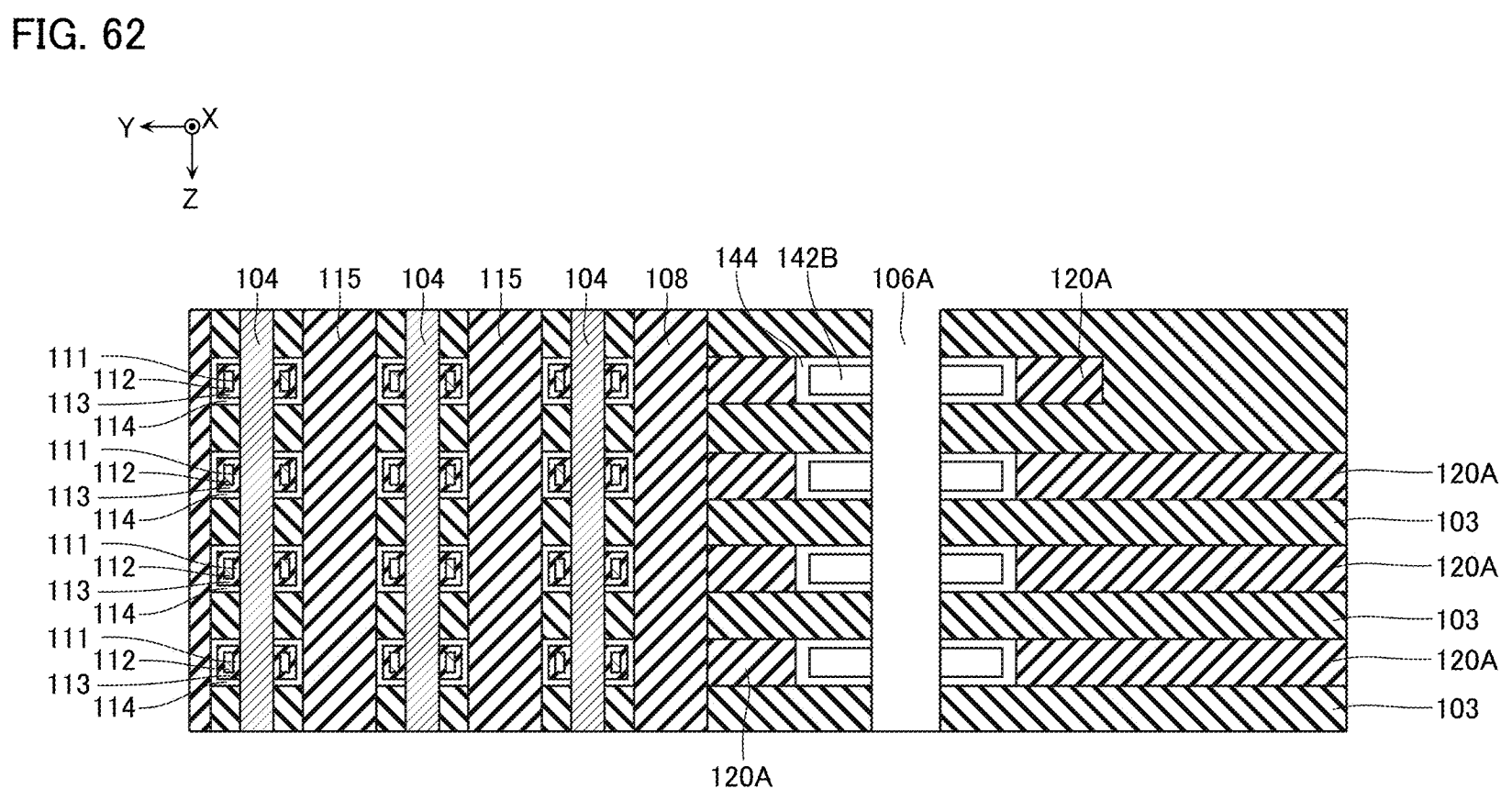

Next, as shown in FIGS. 61 and 62, for example, the semiconductor layer 144 and a sacrifice layer 142B are formed inside the opening 142A.

In this step, the semiconductor layer 144 is formed on a side surface in the Y-direction of the sacrifice layer 120A, side surfaces in the X-direction of the insulating layers 105, and an upper surface, a lower surface, and a side surface of the insulating layer 103, via the openings 106A, 142A. In addition, the sacrifice layer 142B is formed in the opening 142A. In this step, the opening 142A is filled in by the sacrifice layer 142B. On the other hand, the opening 106A is not filled in by the sacrifice layer 142B. This step is performed by the likes of ALD and CVD, for example.

Moreover, in this step, a part of the sacrifice layer 142B is removed via the opening 106A, a portion provided on the side surface of the insulating layer 103, of the semiconductor layer 144 is exposed, and this portion is removed. This step is performed by the likes of wet etching, for example.

Figure 63:
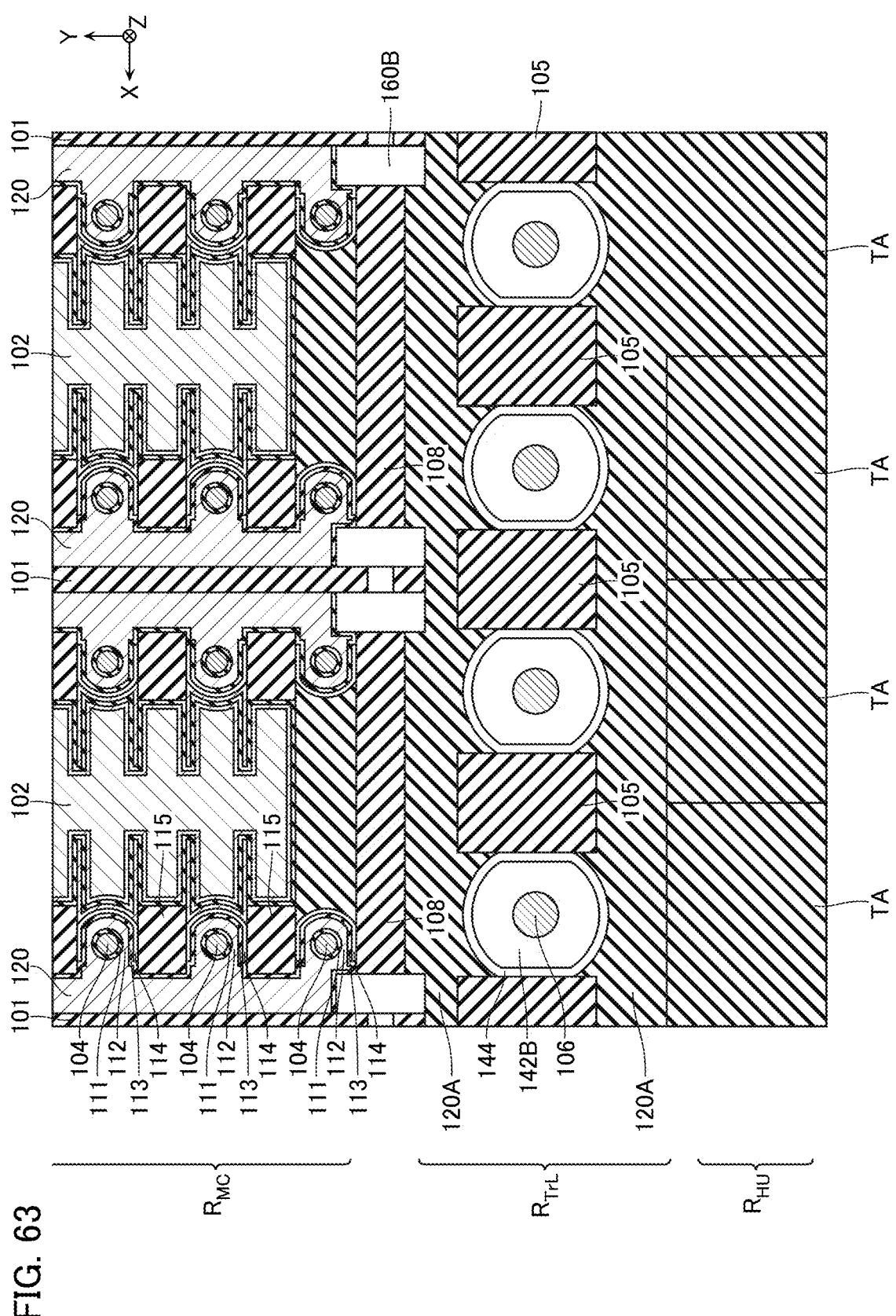
FIG. 63 is a schematic cross-sectional view for explaining the same method of manufacturing.
Figure 64:
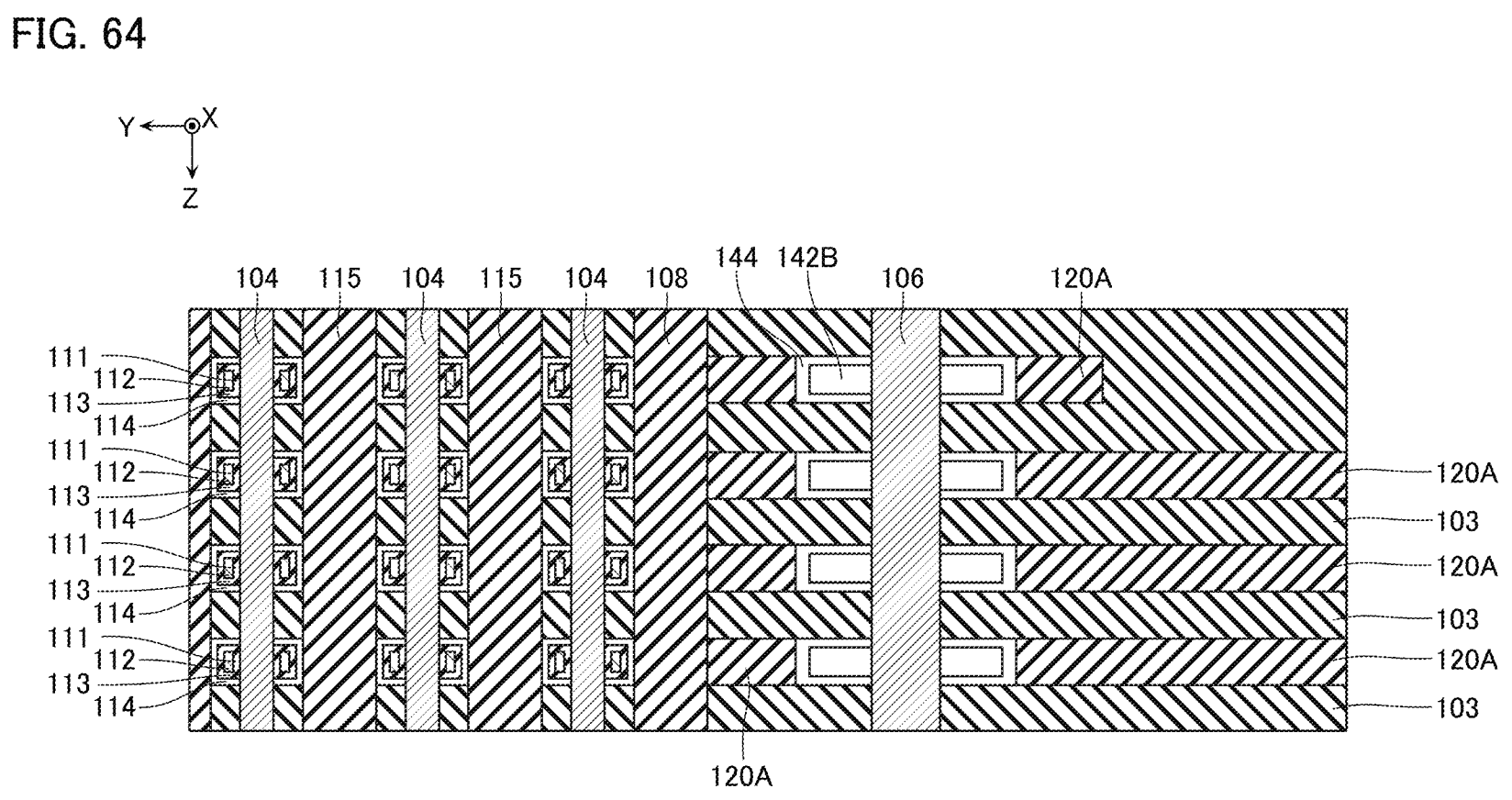

Next, as shown in FIGS. 63 and 64, for example, the via wiring 106 is formed inside the opening 106A. This step is performed by the likes of ALD and CVD, for example.

Figure 65:
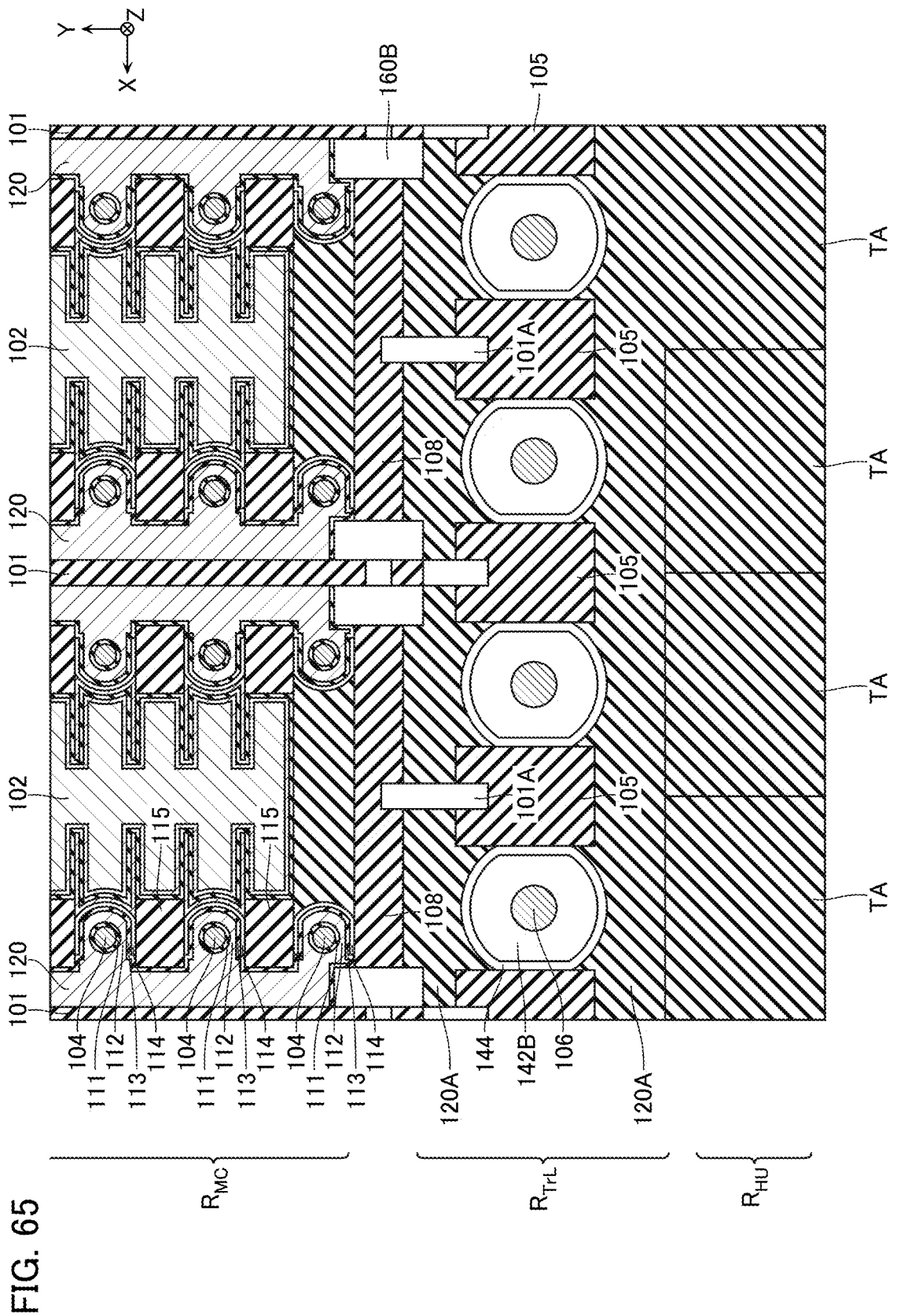
FIG. 65 is a schematic cross-sectional view for explaining the same method of manufacturing.

Next, as shown in FIG. 65, for example, the opening 101A is formed in a region within the transistor region $R_{TrL}$, of the position corresponding to the insulating layer 101. This step is performed by the likes of RIE, for example.

Figure 66:
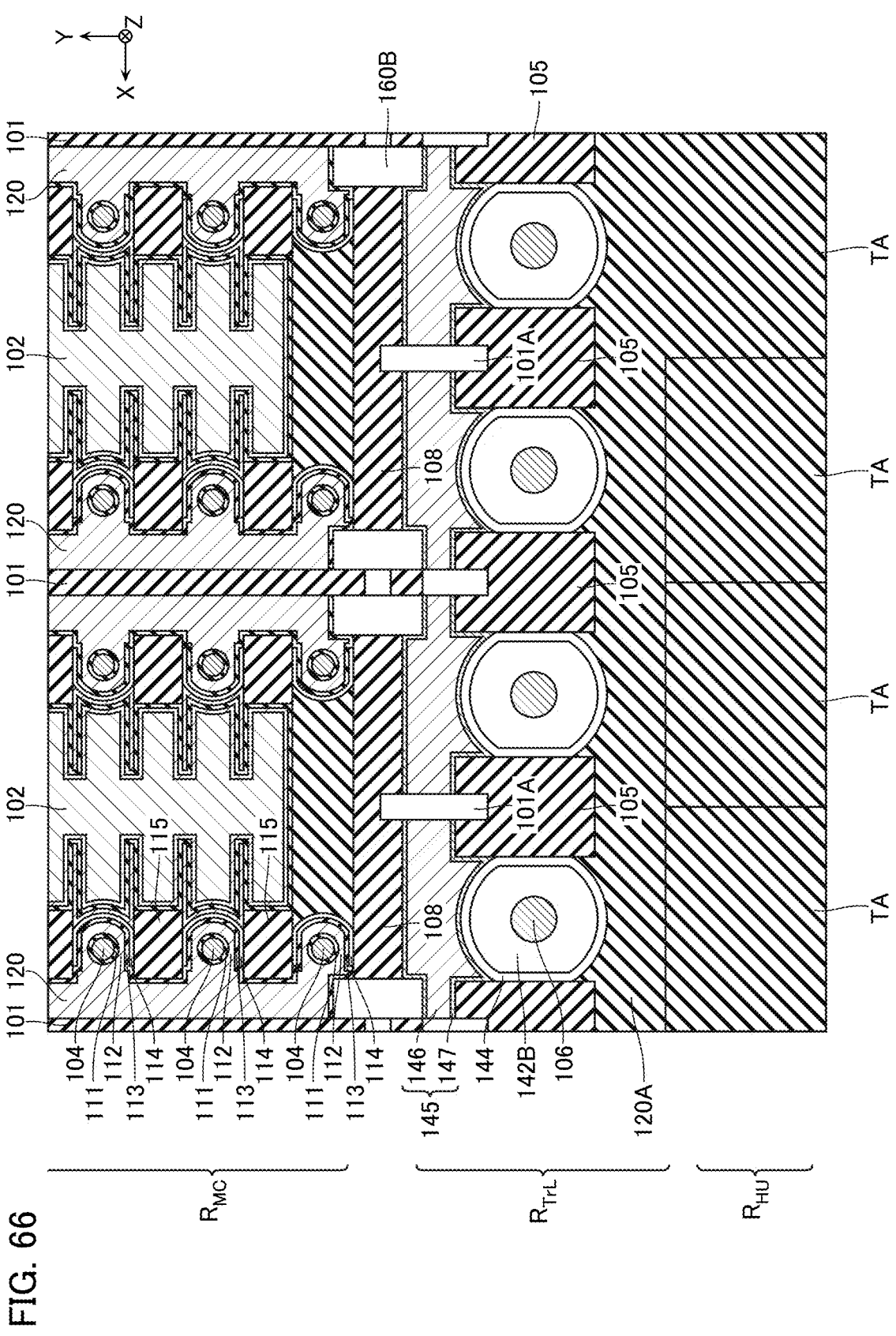
FIG. 66 is a schematic cross-sectional view for explaining the same method of manufacturing.
Figure 67:
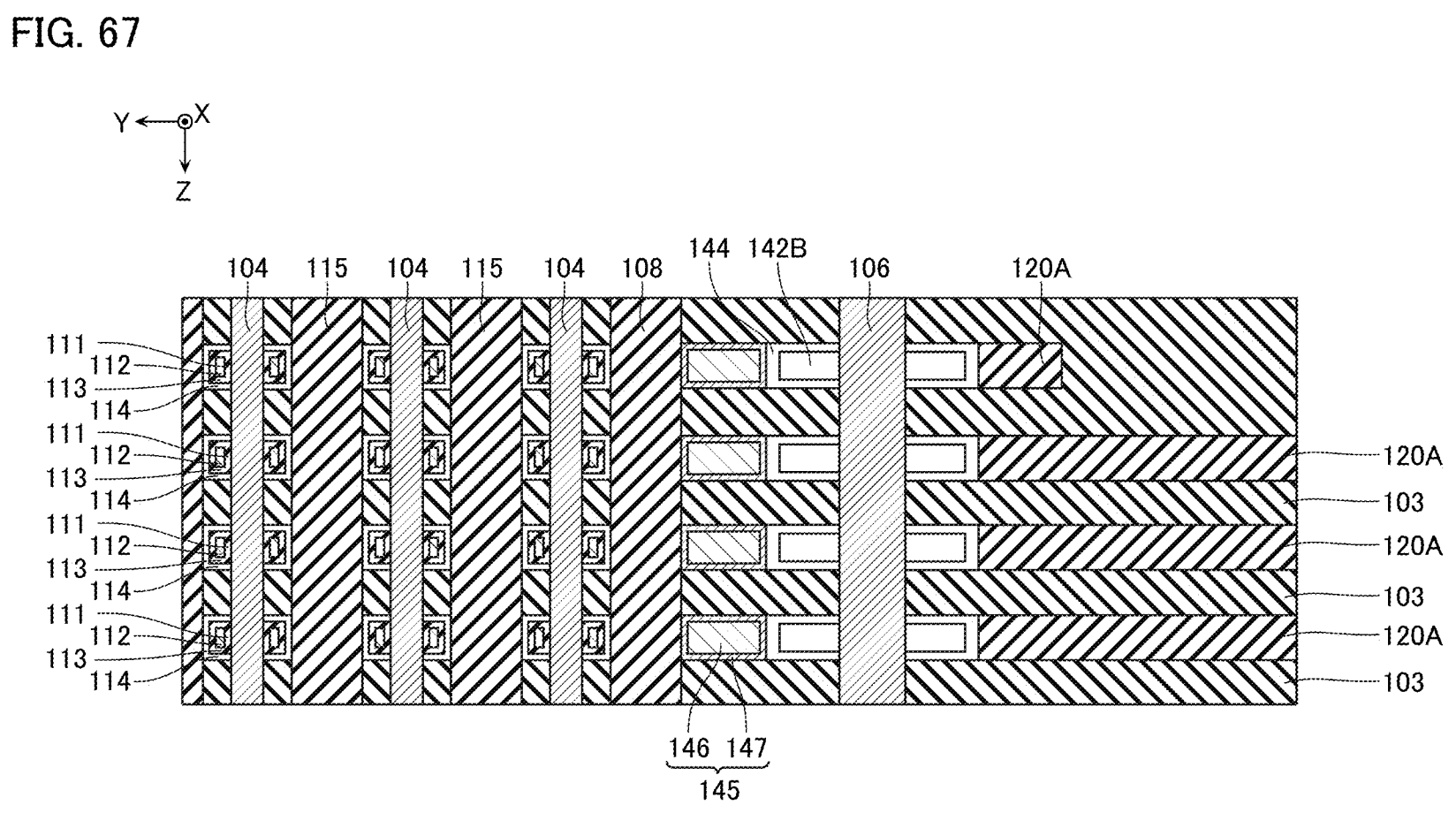

Next, as shown in FIGS. 66 and 67, for example, the conductive layer 145 is formed.

In this step, the sacrifice layer 120A within the transistor region $R_{TrL}$ is removed via the opening 101A. This step is performed by the likes of wet etching, for example.

Moreover, in this step, the conductive layers 147, 146 are formed, via the opening 101A, in a region where the sacrifice layer 120A had been formed. This step is performed by the likes of CVD, for example.

Figures 68, 69:
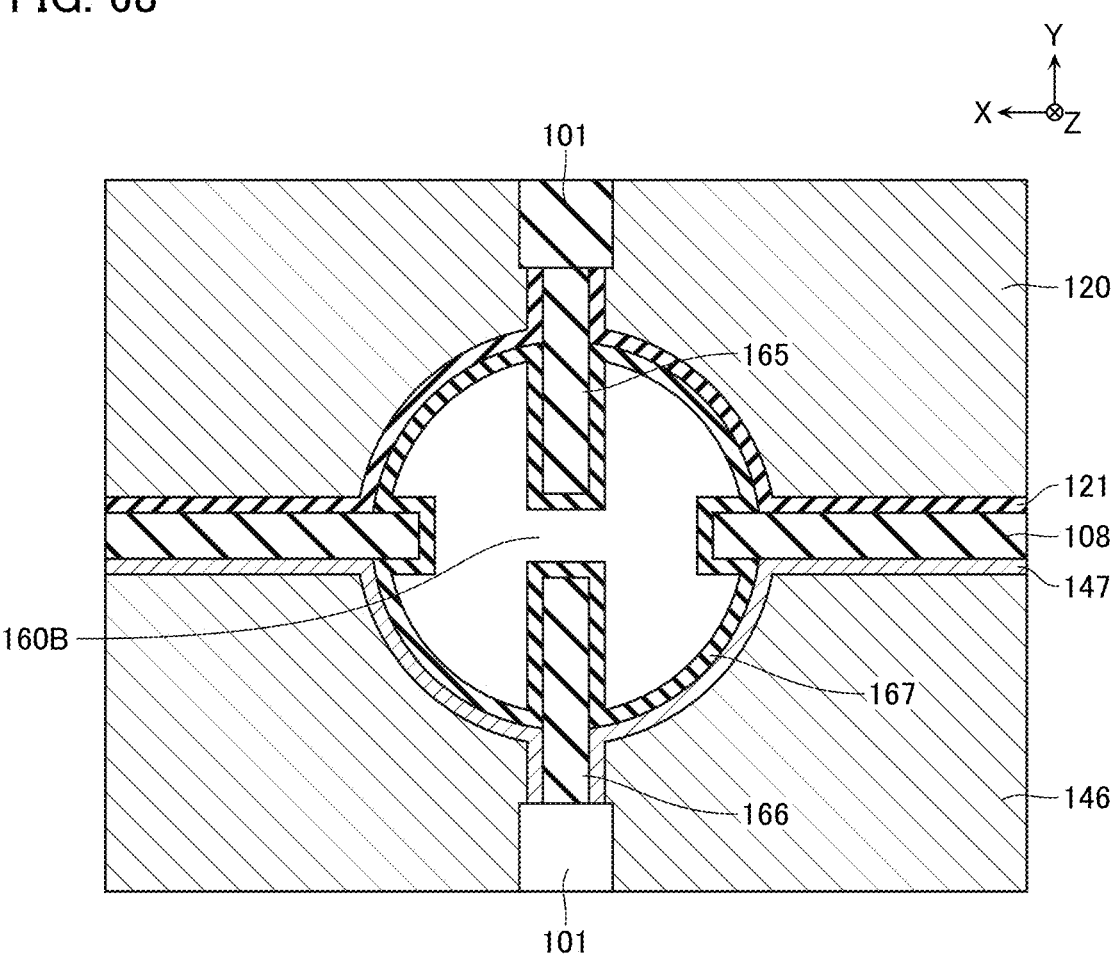
FIG. 68 is a schematic cross-sectional view for explaining the same method of manufacturing.
FIG. 69 is a schematic cross-sectional view for explaining the same method of manufacturing.

Note that as shown in FIGS. 68 and 69, in this step, a part of the conductive layer 147 is formed on a surface exposed to the opening 101A, of the sacrifice layer 167.

Figure 70:
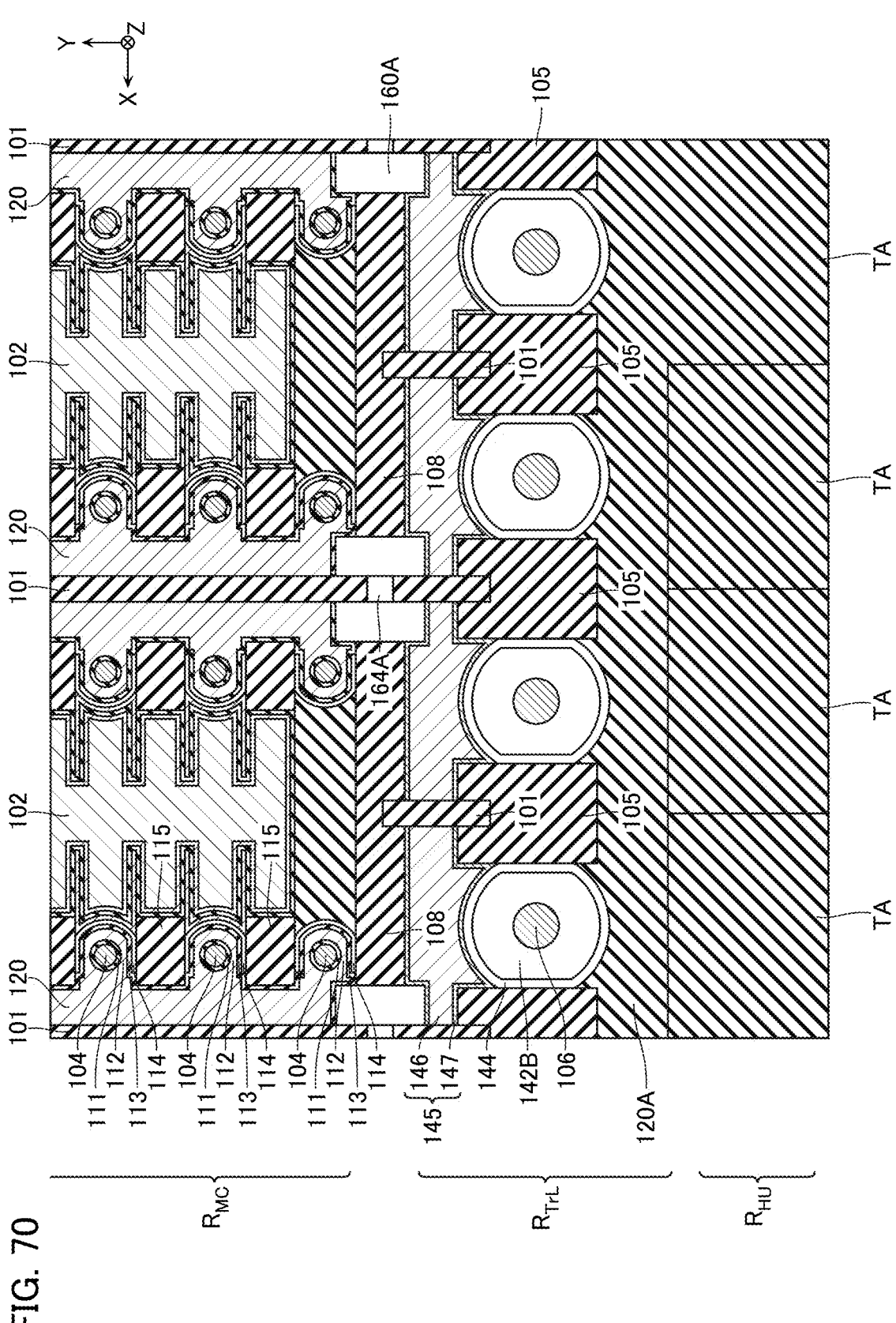
FIG. 70 is a schematic cross-sectional view for explaining the same method of manufacturing.
Figure 71:
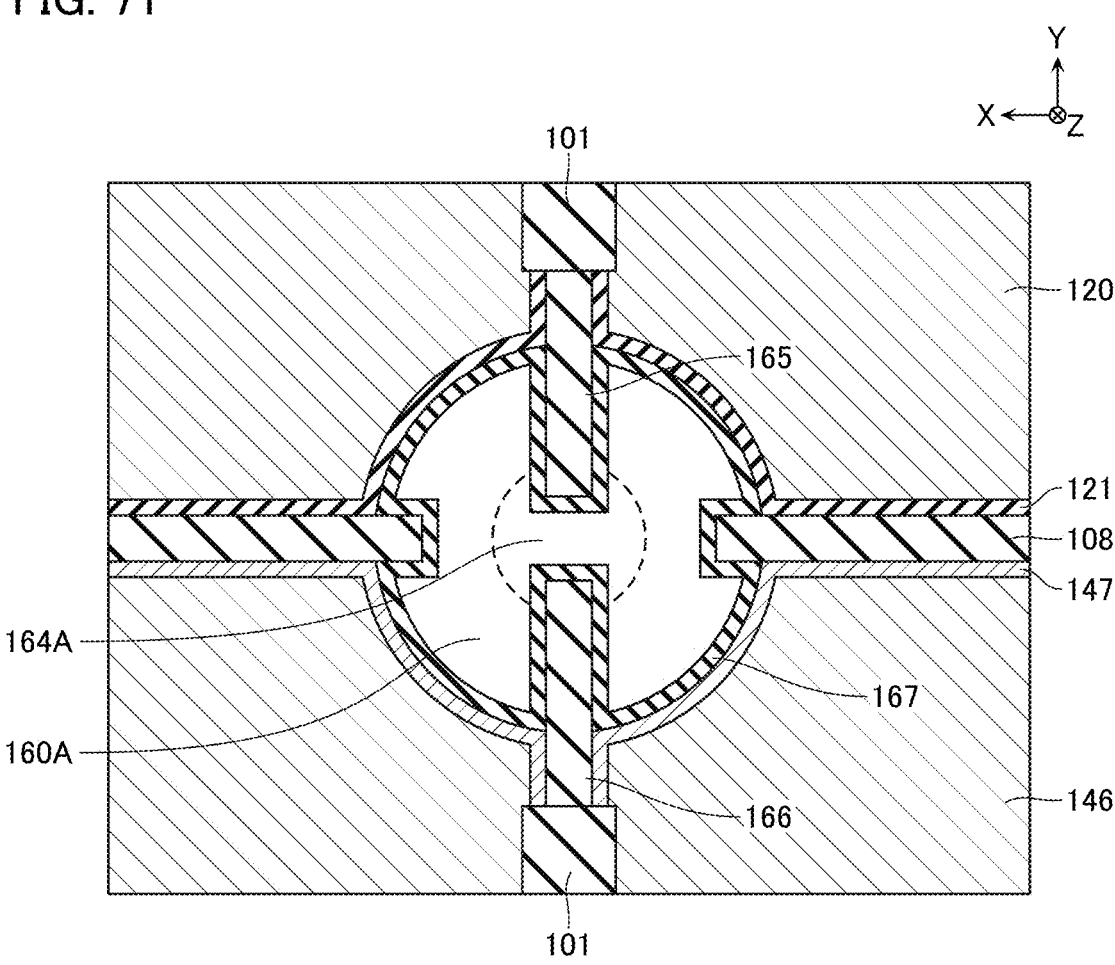
FIG. 71 is a schematic cross-sectional view for explaining the same method of manufacturing.
Figure 72:
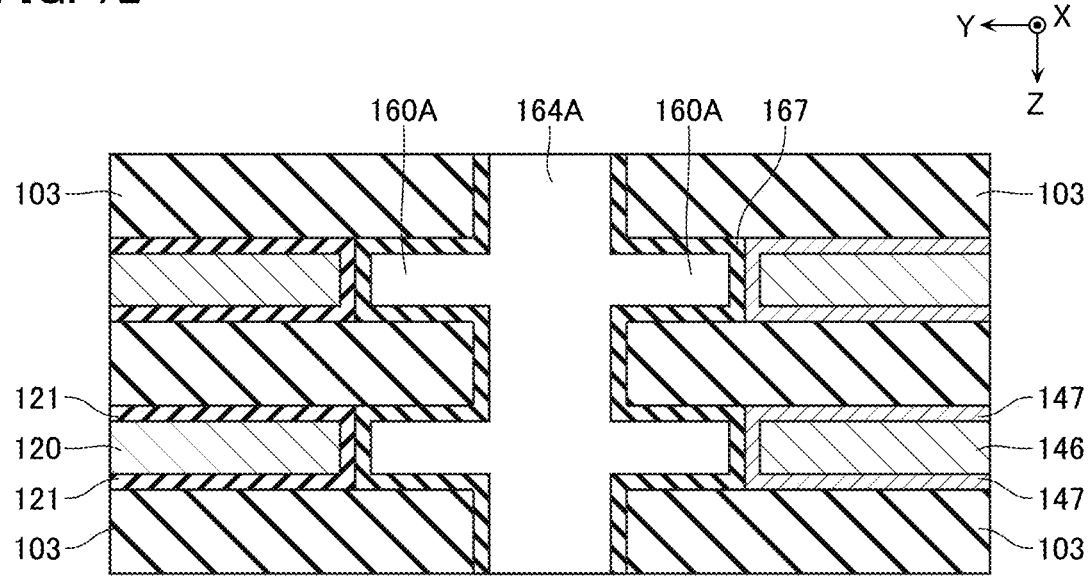
FIG. 72 is a schematic cross-sectional view for explaining the same method of manufacturing.

Next, as shown in FIGS. 70 to 72, for example, the sacrifice layer 160B is removed. This step is performed by the likes of wet etching, for example.

Figure 73:
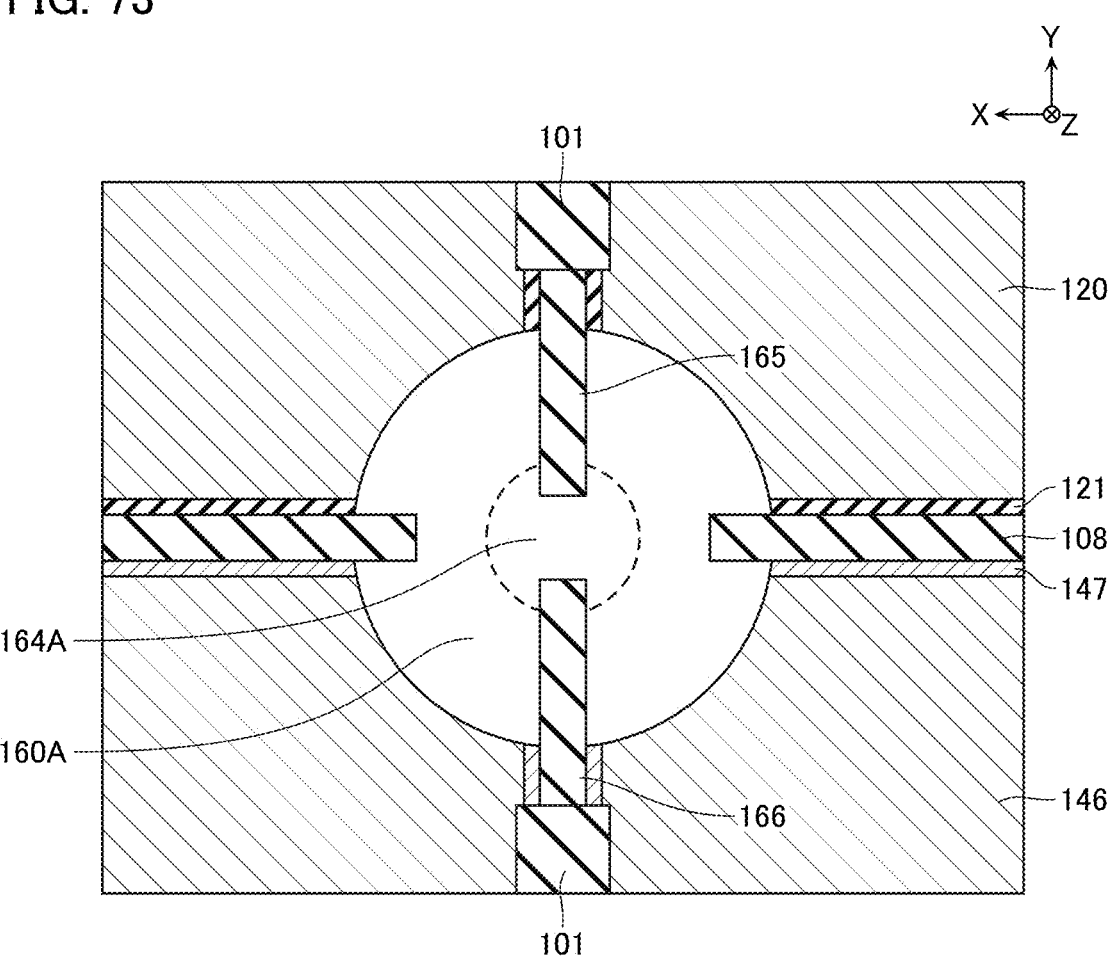
FIG. 73 is a schematic cross-sectional view for explaining the same method of manufacturing.
Figure 74:
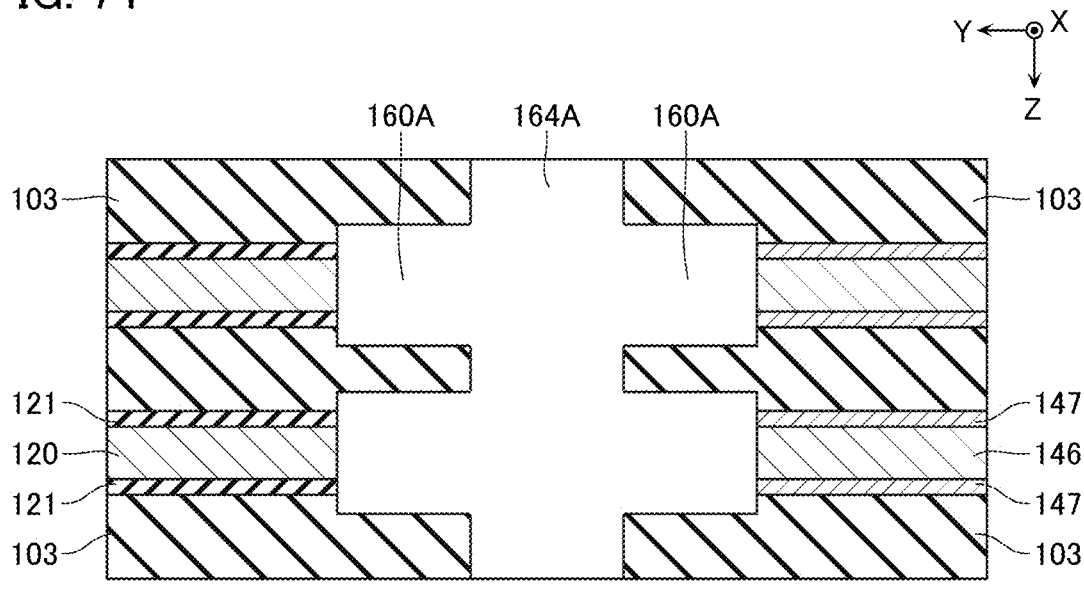
FIG. 74 is a schematic cross-sectional view for explaining the same method of manufacturing.

Next, as shown in FIGS. 73 and 74, for example, the sacrifice layer 167 and parts of the insulating layer 121 and the conductive layer 147 are removed, and parts of the conductive layers 120, 146 are exposed, via the openings 164A, 160A. This step is performed by the likes of wet etching, for example. Note that in the first embodiment, the insulating layers 121, 103 both include silicon oxide ($SiO_2$). As a result, a part of the insulating layer 103 will also be removed during removal of the insulating layer 121. Hence, a length in the Z-direction of the opening 160A (a distance in the Z-direction, of two insulating layers 103 arranged in the Z-direction, at the opening 160A) will be larger than a length in the Z-direction of the conductive layer 120 and the insulating layers 121 provided on its upper and lower surfaces, and a length in the Z-direction of the conductive layer 145.

Figure 75:
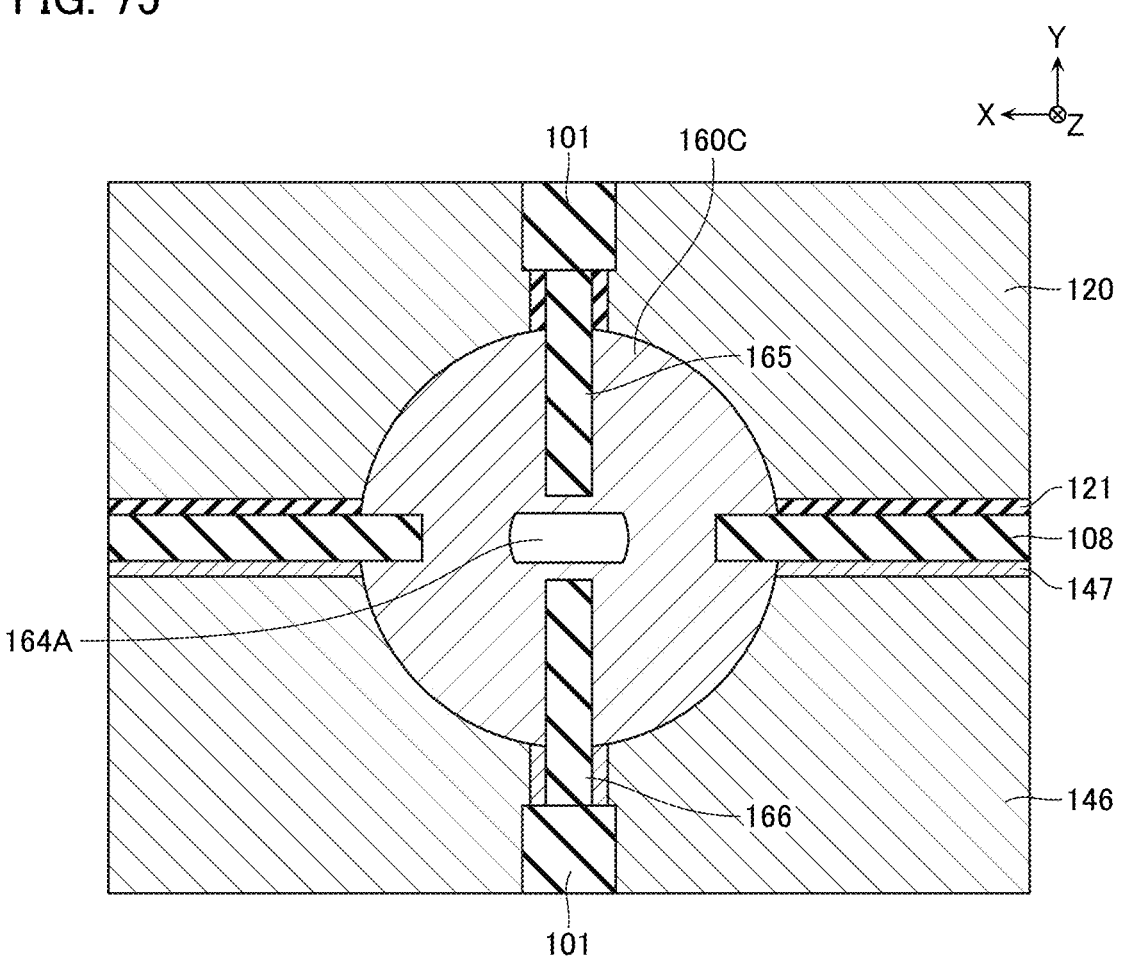
FIG. 75 is a schematic cross-sectional view for explaining the same method of manufacturing.
Figure 76:
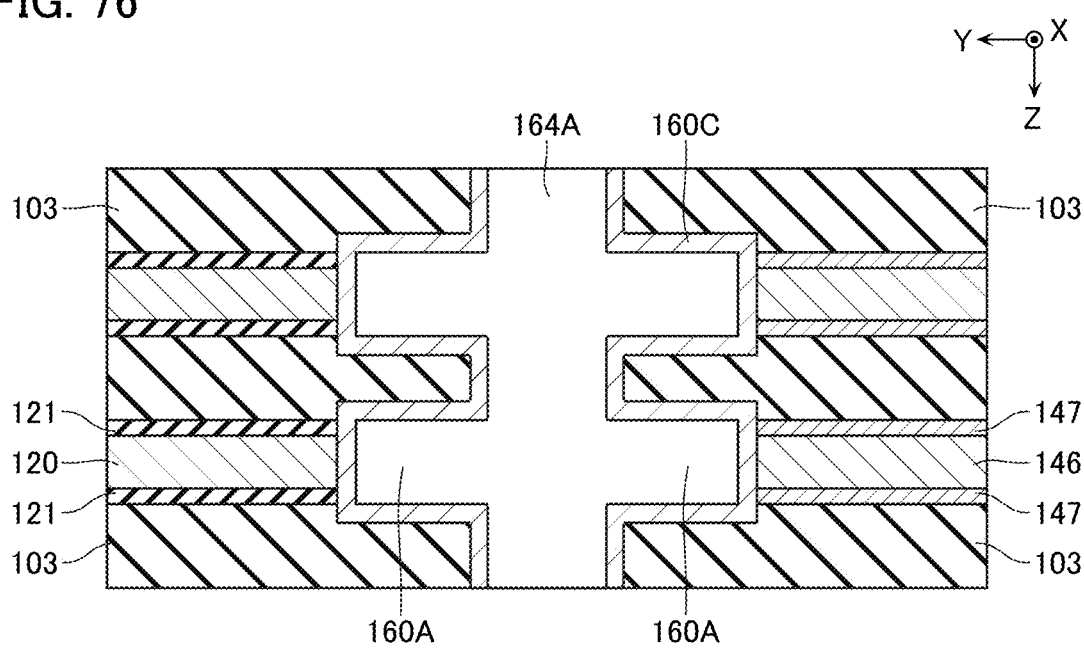
FIG. 76 is a schematic cross-sectional view for explaining the same method of manufacturing.

Next, as shown in FIGS. 75 and 76, a conductive layer 160C is formed on side surfaces of the conductive layers 120, 146, side surfaces in the X-direction and a side surface in the Y-direction of the insulating layer 108, side surfaces in the Y-direction and side surfaces in the X-direction of the insulating layers 165, 166, and an upper surface and a lower surface of the insulating layer 103, via the opening 164A. In this step, the opening 160A may be filled in by the conductive layer 160C, but need not be filled in by the conductive layer 160C. However, the opening 164A is not filled in by the conductive layer 160C. This step is performed by the likes of CVD, for example.

Figure 77:
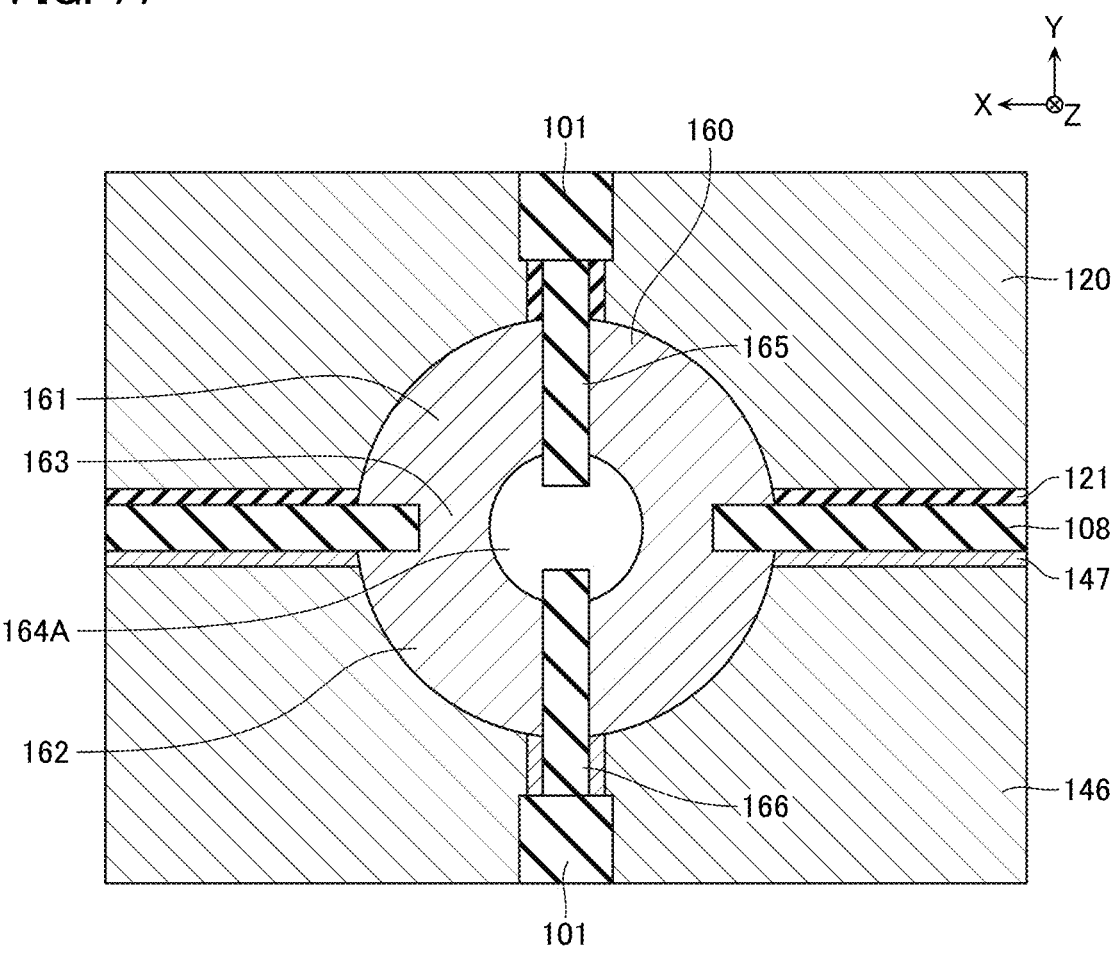
FIG. 77 is a schematic cross-sectional view for explaining the same method of manufacturing.
Figure 78:
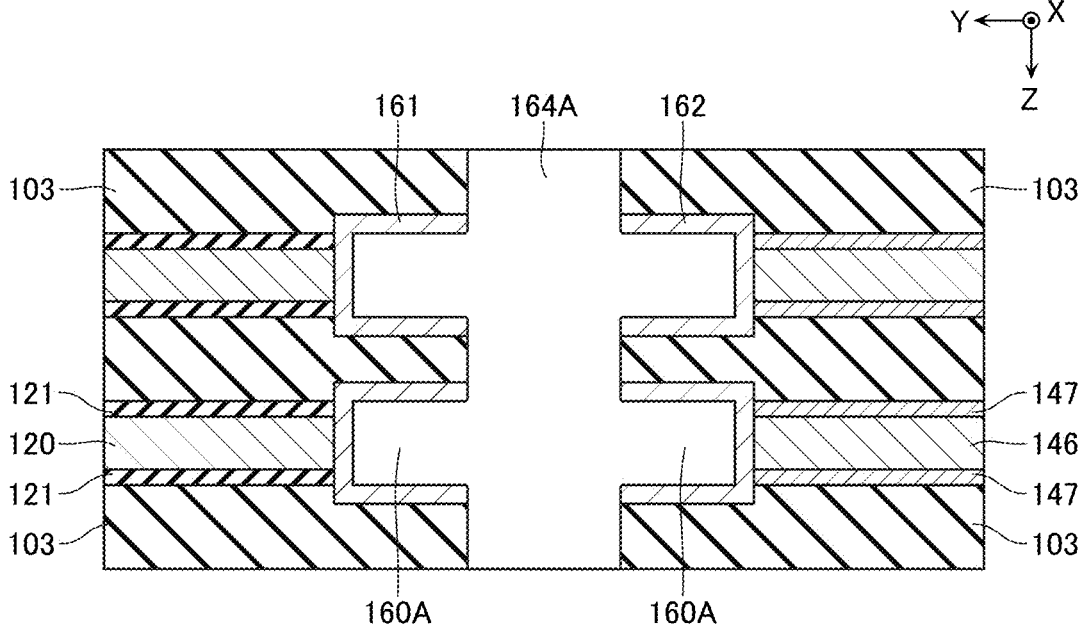
FIG. 78 is a schematic cross-sectional view for explaining the same method of manufacturing.

Next, as shown in FIGS. 77 and 78, for example, a part of the conductive layer 160C is removed, and the connecting electrode 160 is formed, via the opening 164A. In this step, for example, a portion provided on the inner peripheral surface of the insulating layer 103, of the conductive layer 160C, is removed. This step is performed by the likes of RIE, for example.

Next, as shown in FIGS. 8 and 9, for example, the insulating layer 164 is formed inside the opening 164A. This step is performed by the likes of CVD, for example.

Figure 79:
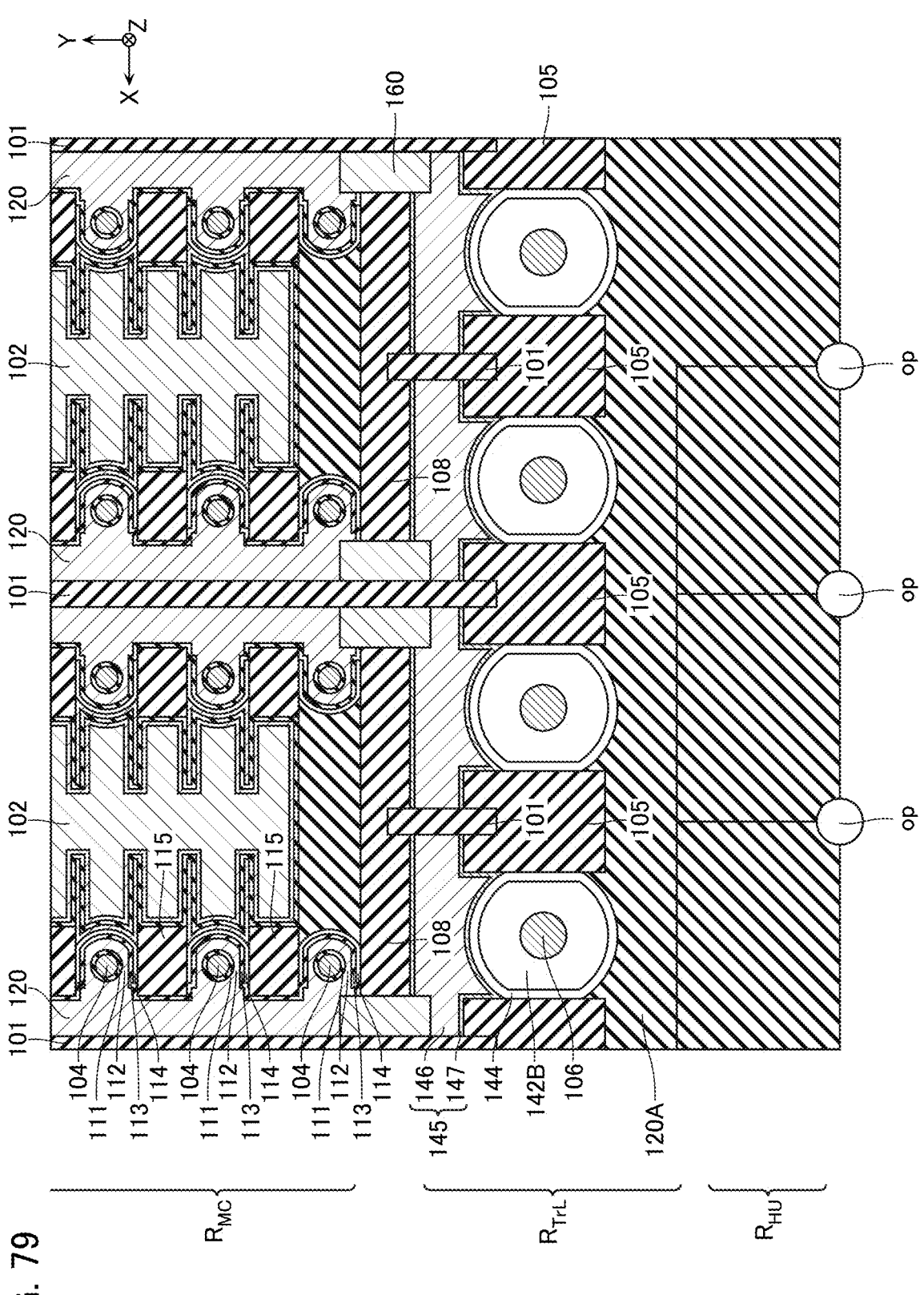
FIG. 79 is a schematic cross-sectional view for explaining the same method of manufacturing.

Next, as shown in FIG. 79, for example, a plurality of openings op arranged in the X-direction, are formed in the hook-up region $R_{HU}$. The opening op extends in the Z-direction and penetrates the plurality of insulating layers 103 and the plurality of sacrifice layers 120A arranged in the Z-direction. This step is performed by the likes of RIE, for example.

Figure 80:
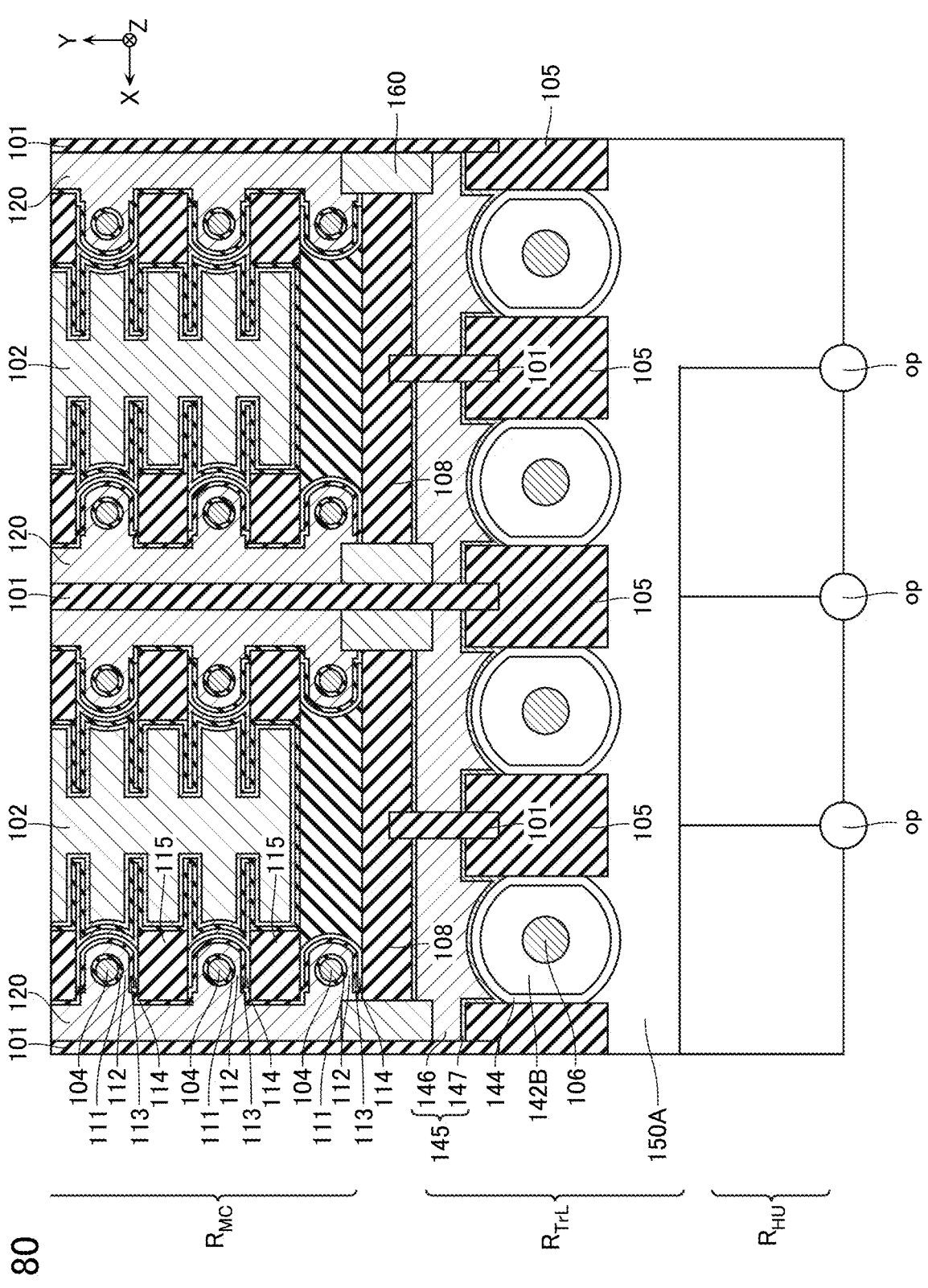
FIG. 80 is a schematic cross-sectional view for explaining the same method of manufacturing.
Figure 81:
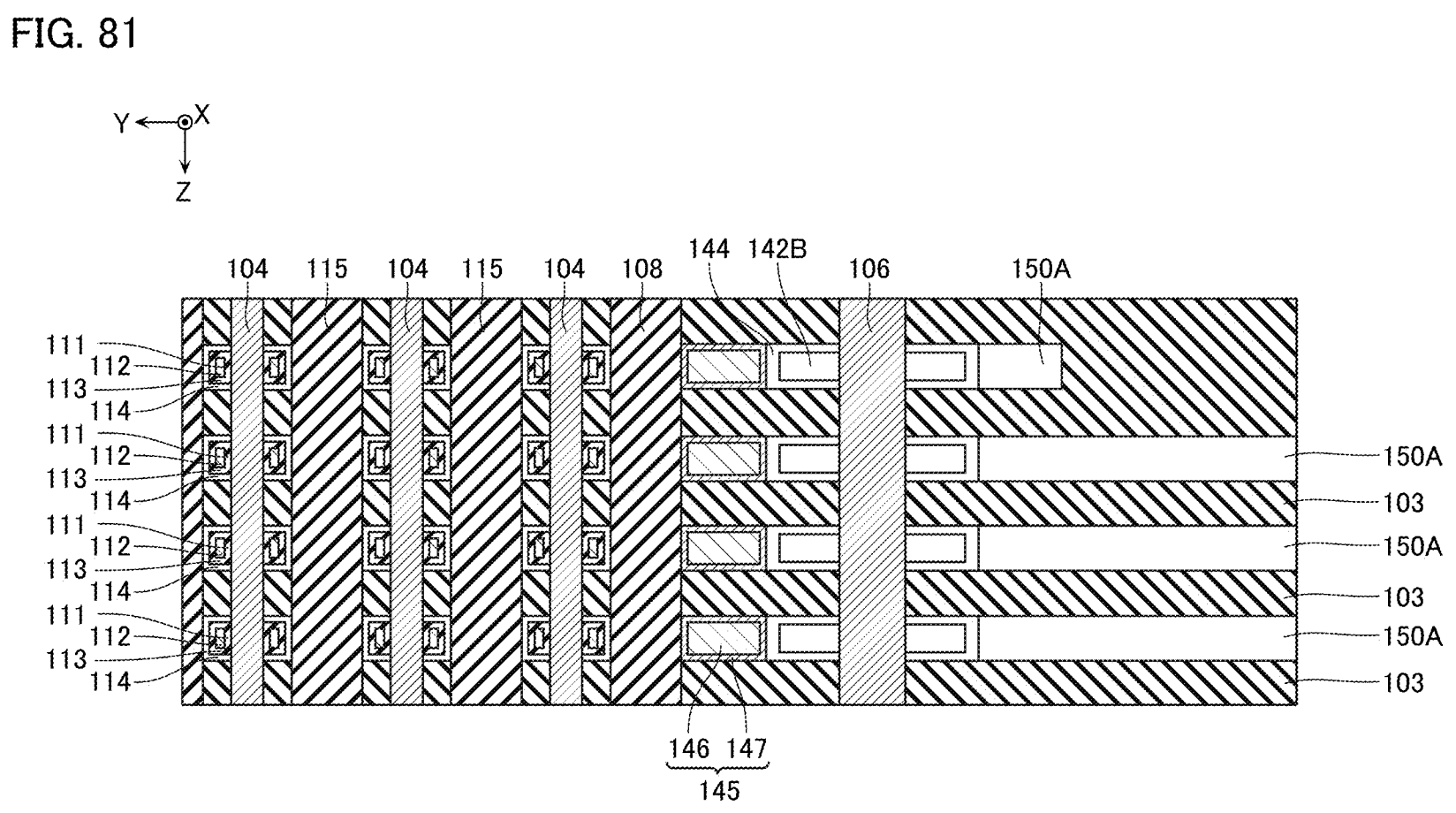

Next, as shown in FIGS. 80 and 81, for example, the sacrifice layer 120A is removed via the opening op. This step is performed by the likes of wet etching, for example. Note that in the drawings, an opening formed in a portion where the sacrifice layer 120A had been provided, is indicated as an opening 150A.

Figure 82:
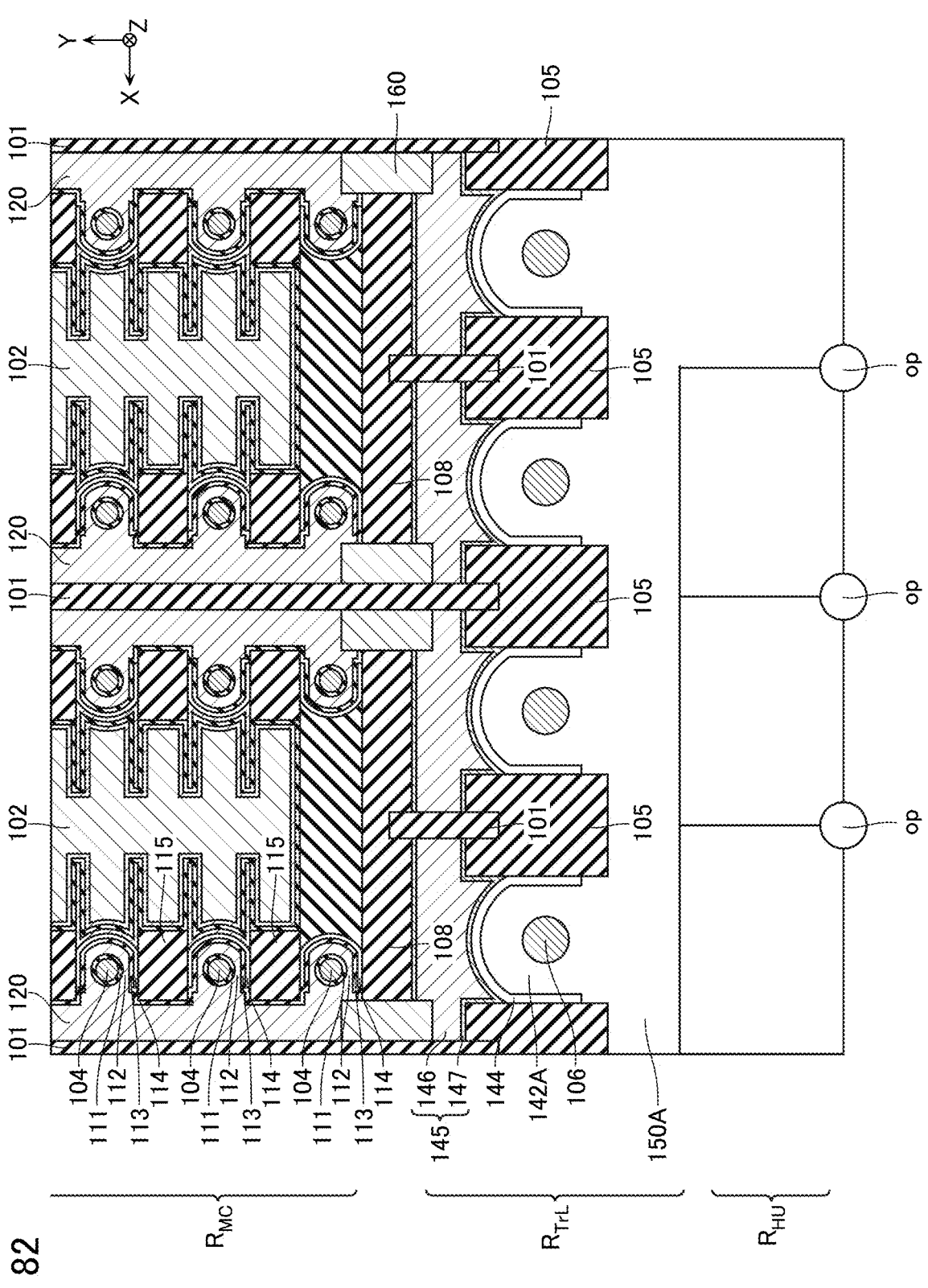
FIG. 82 is a schematic cross-sectional view for explaining the same method of manufacturing.
Figure 83:
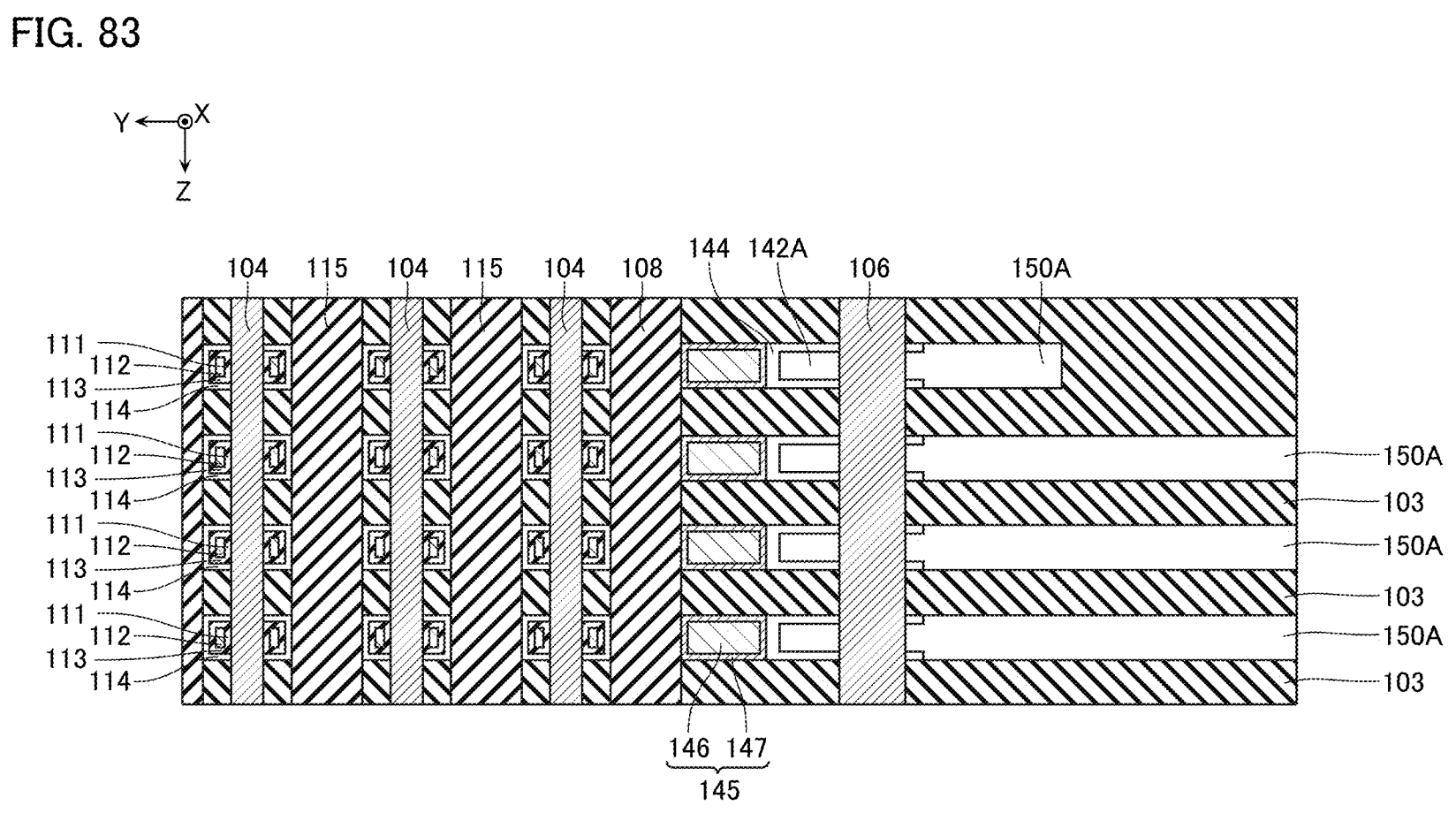

Next, as shown in FIGS. 82 and 83, for example, a part of the semiconductor layer 144 is removed, and a part of the sacrifice layer 142B is exposed, via the openings op, 150A. In addition, the sacrifice layer 142B is removed, and the outer peripheral surface of the via wiring 106 is exposed, via the openings op, 150A. This step is performed by the likes of wet etching, for example.

Figure 84:
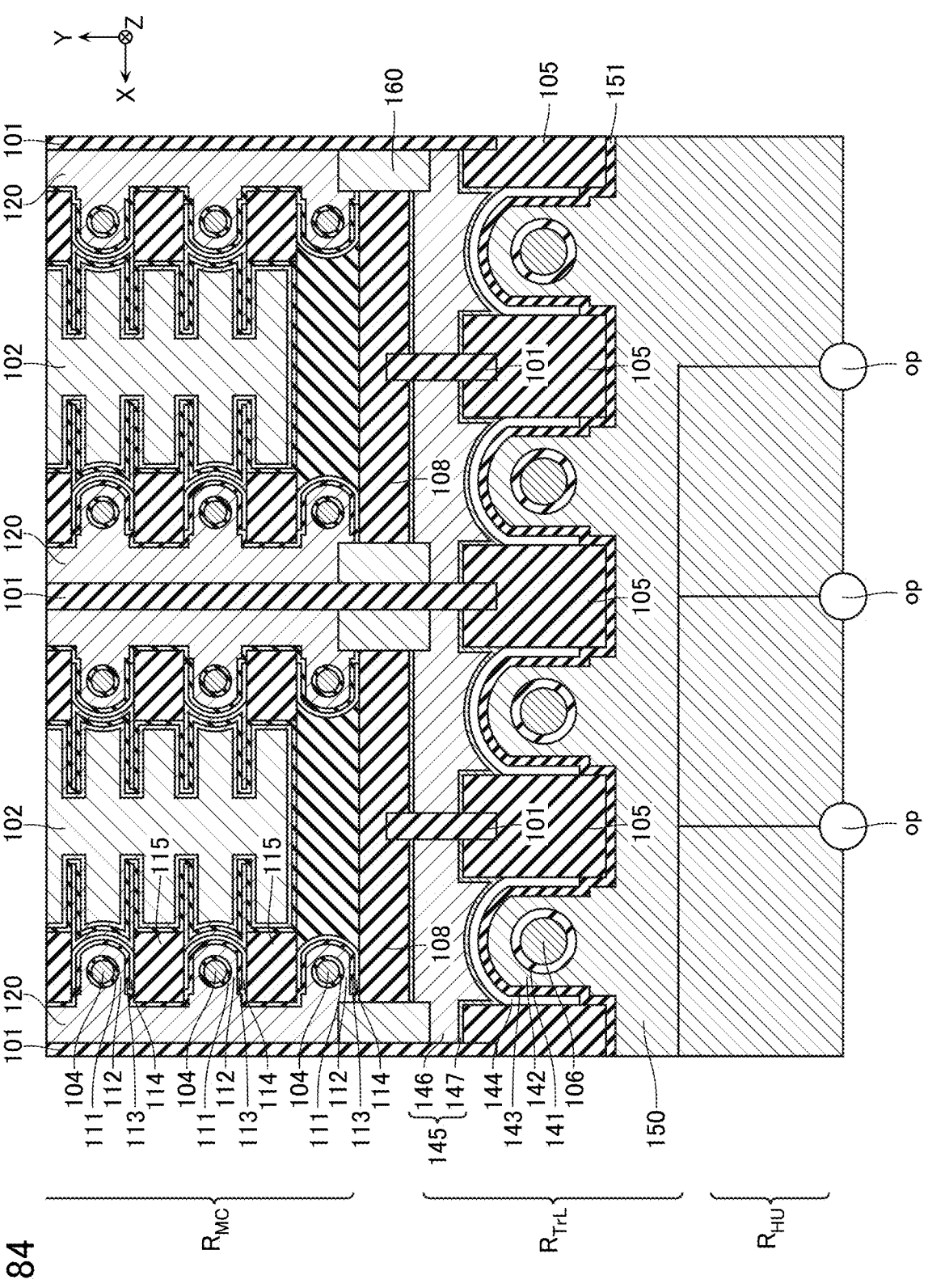
FIG. 84 is a schematic cross-sectional view for explaining the same method of manufacturing.

Next, as shown in FIGS. 84 and 85, for example, the insulating layers 141, 143, 151 are formed, and the conductive layers 142, 150 are formed, in the opening 150A. In this step, insulating layers and conductive layers are formed in the openings op, 150A by the likes of CVD, for example. At this time, the opening 150A is filled in by the conductive layers. On the other hand, the opening op is not filled in by the conductive layers. Next, portions provided on the inner peripheral surface of the insulating layer 103, of these insulating layers and conductive layers, are removed by the likes of wet etching, for example. Then, an insulating layer is formed inside the opening op.

[Advantages]

In the step described with reference to FIGS. 52 and 53, the insulating layer 121 is formed before the conductive layer 120 is formed. Hence, as shown in FIGS. 54 and 55, side surfaces in the Y-direction and the X-direction, of the conductive layer 120 are covered by the insulating layer 121.

Moreover, in the step described with reference to FIGS. 66 and 67, the conductive layer 147 which includes a material whose resistivity is larger than that of the conductive layer 146, is formed before the conductive layer 146 is formed. Hence, as shown in FIGS. 68 and 69, side surfaces in the Y-direction and the X-direction, of the conductive layer 146 are covered by the conductive layer 147.

Moreover, during manufacturing of the semiconductor memory device according to the present embodiment, in the step described with reference to FIGS. 73 and 74, a part of the insulating layer 121 and a part of the conductive layer 147 are removed, and the conductive layer 120 and the conductive layer 146 are exposed. Moreover, in the step described with reference to FIGS. 75 to 78, the connecting electrode 160 that contacts the conductive layer 120 without via the insulating layer 121 and contacts the conductive layer 146 without via the conductive layer 147, is formed.

Such a method enables the conductive layer 120 and the conductive layer 146 to be made suitably electrically continuous due to removal of the insulating layer 121. Moreover, such a method enables a resistance value between the conductive layer 120 and the conductive layer 146 to be suppressed due to removal of the conductive layer 147.

Second Embodiment

Figure 86:
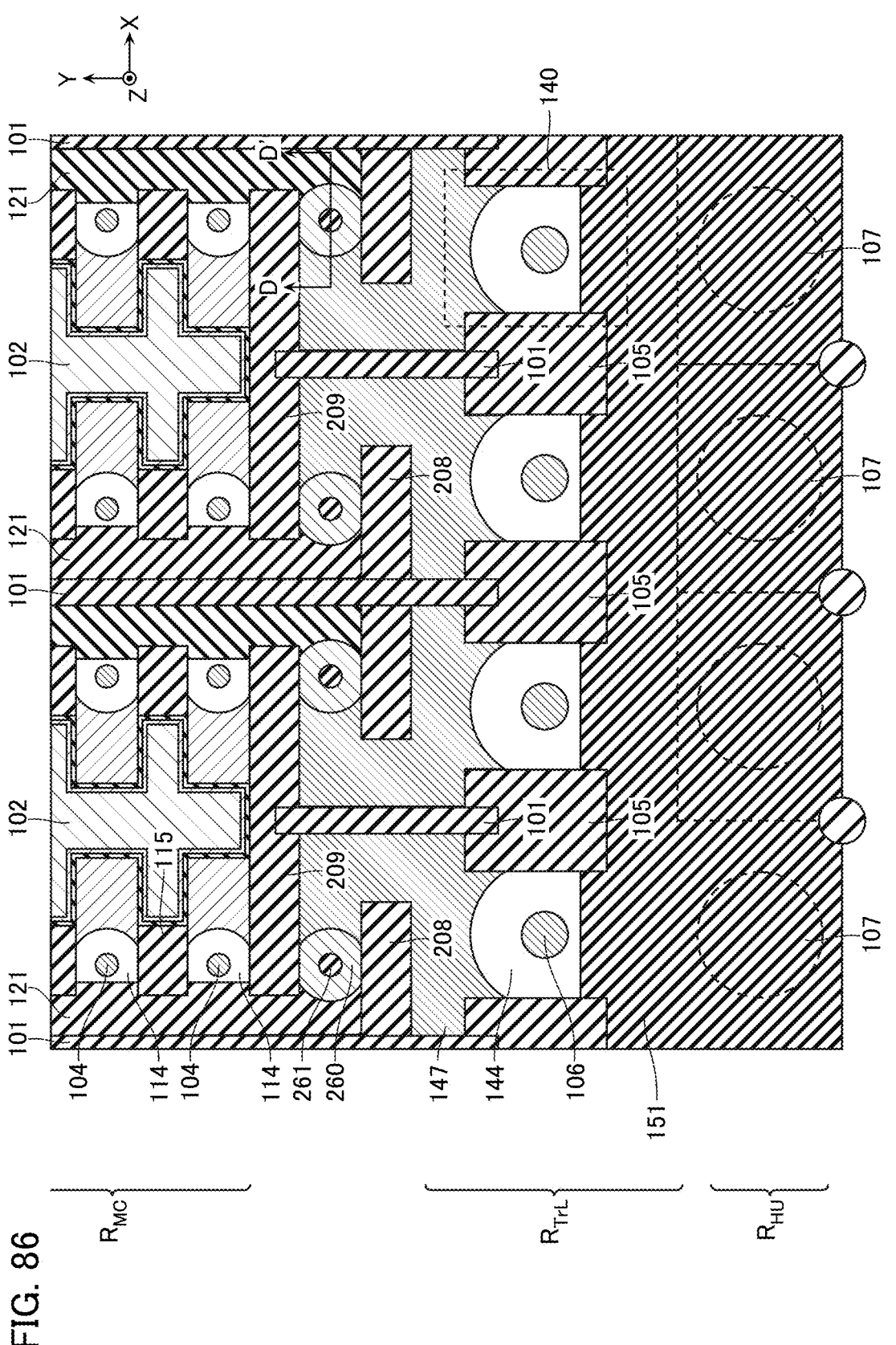
FIG. 86 is a schematic cross-sectional view showing configurations of a semiconductor memory device according to a second embodiment.
Figure 87:
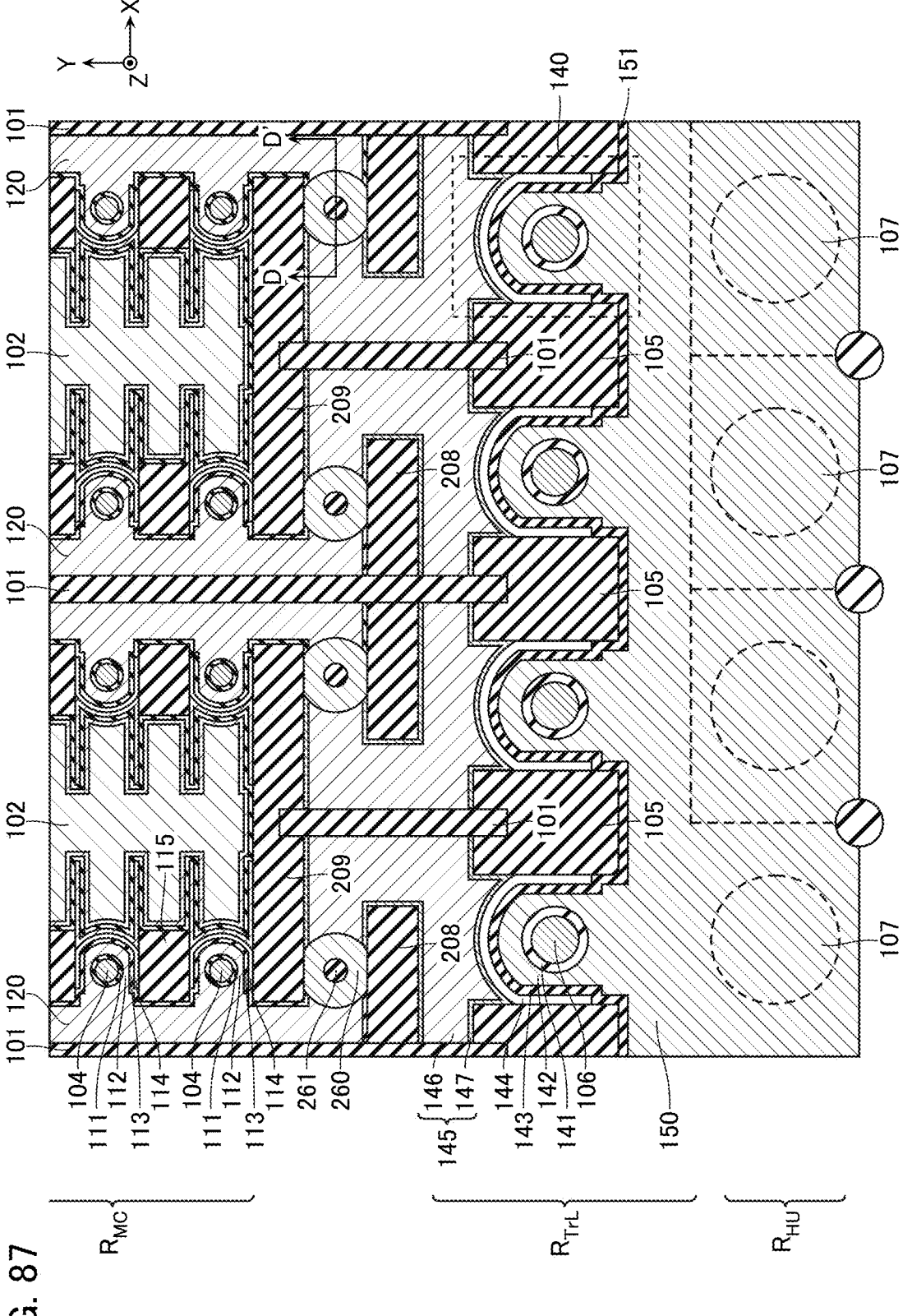
FIG. 87 is a schematic cross-sectional view showing configurations of the semiconductor memory device according to the second embodiment.

FIGS. 86 and 87 are schematic XY cross-sectional views showing configurations of a semiconductor memory device according to a second embodiment. Note that FIGS. 86 and 87 show XY cross sections at different height positions from each other. In the following description, configurations similar to in the first embodiment will be assigned with the same symbols as in the first embodiment, and descriptions thereof will sometimes be omitted.

The semiconductor memory device according to the second embodiment is basically configured similarly to the semiconductor memory device according to the first embodiment. However, a structure between the memory cell region $R_{MC}$ and the transistor region $R_{TrL}$ differs between the semiconductor memory device according to the first embodiment and the semiconductor memory device according to the second embodiment.

As shown in FIG. 87, for example, in the semiconductor memory device according to the second embodiment, insulating layers 208, 209 of the likes of silicon oxide (SiO$_2$) that extend in the X-direction and are arranged in the Y-direction, and an insulating layer 261 of the likes of silicon oxide (SiO$_2$) that is provided between these insulating layers 208, 209, are provided between the memory cell region $R_{MC}$ and the transistor region $R_{TrL}$. The insulating layers 208, 209 each extend in the X-direction and the Z-direction, and divide the memory layers ML0 to ML3 in the Y-direction. The insulating layer 261 extends in the Z-direction penetrating the plurality of memory layers ML0 to ML3.

Moreover, in this region, the memory layers ML0 to ML3 comprise a connecting electrode 260 which is provided between the insulating layers 208, 209.

In the example illustrated, the connecting electrode 260 is provided in a portion where the insulating layers 208, 209, 261 are not provided, within a range of a circle centered on a center position of the insulating layer 261. Note that a radius of this circle is large enough to reach the insulating layers 208, 209.

The connecting electrode 260 contacts the conductive layers 120, 146. A contact surface between the connecting electrode 260 and the conductive layer 120 comprises a shape along the above-described circle. A contact surface between the connecting electrode 260 and the conductive layer 146 comprises a shape along the above-described circle.

Moreover, when the structure shown in FIGS. 86 and 87 is cut along the line D-D' and viewed along a direction of the arrows, then the structure described with reference to FIG. 9 is observed. However, the semiconductor memory device according to the second embodiment comprises the connecting electrode 260, instead of the connecting electrode 160. Moreover, the semiconductor memory device according to the second embodiment comprises the insulating layer 261, instead of the insulating layer 164. Moreover, the line D-D' of FIGS. 86 and 87 extends in the X-direction.

That is, a length in the Z-direction of the connecting electrode 260 (a distance from an upper surface to a lower surface of the connecting electrode 260) is larger than the length Z 120 in the Z-direction of the conductive layer 120 (the distance from the upper surface to the lower surface of the conductive layer 120). Moreover, the length in the Z-direction of the connecting electrode 260 is larger than the length 2146 in the Z-direction of the conductive layer 146 (the distance from the upper surface to the lower surface of the conductive layer 146). Furthermore, the length in the Z-direction of the connecting electrode 260 may be larger than the length 2145 in the Z-direction of the conductive layer 145 (the distance from the upper surface to the lower surface of the conductive layer 147).

[Method of Manufacturing]

The semiconductor memory device according to the second embodiment is basically able to be manufactured similarly to the semiconductor memory device according to the first embodiment.

However, during manufacturing of the semiconductor memory device according to the second embodiment, in the step described with reference to FIGS. 12 and 13, openings are formed at positions corresponding to the insulating layers 208, 209, instead of at positions corresponding to the insulating layers 108, 165, 166.

Moreover, the steps described with reference to FIGS. 16 to 23 are not executed.

Moreover, in the step described with reference to FIG. 24, an opening is formed not only at the position corresponding to the via wiring 104, but also at a position corresponding to the insulating layer 261.

Moreover, in the step described with reference to FIG. 41, the sacrifice layer 104B that has been provided at the position corresponding to the insulating layer 261 is protected by a formation of a mask, and so on, and thereby prevented from being removed.

Moreover, in the step described with reference to FIGS. 70 to 72, the likes of the above-described mask are removed, and the sacrifice layer 104B is removed, instead of the sacrifice layer 160B.

[Advantages]

The semiconductor memory device according to the second embodiment enables similar advantages to those of the semiconductor memory device according to the first embodiment to be achieved.

Moreover, during the manufacturing of the semiconductor memory device according to the second embodiment, the steps described with reference to FIGS. 16 to 23 can be omitted. As a result, manufacturing costs can be reduced.

Other Embodiments

That concludes description of the semiconductor memory devices according to the first embodiment and the second embodiment. However, the semiconductor memory devices according to these embodiments are merely exemplifications, and their specific configurations, and so on, may be appropriately adjusted.

For example, in the semiconductor memory devices according to the first embodiment and the second embodiment, the global bit line GBL is provided below the memory layers ML0 to ML3. However, such a configuration is merely an exemplification, and the specific configuration may be appropriately adjusted. The global bit line GBL may be provided above the memory layers ML0 to ML3.

Moreover, the semiconductor memory devices according to the first embodiment and the second embodiment are assumed to have structures of the kind formed by having their memory cell array MCA and their peripheral circuit which is connected to the memory cell array MCA, manufactured on separate wafers, and by having these wafers bonded. However, it is possible too for the semiconductor memory devices according to the first embodiment and the second embodiment to be manufactured on a single wafer.

Moreover, in the semiconductor memory devices according to the first embodiment and the second embodiment, the via wiring 104 functioning as the bit line BL includes a conductive oxide such as indium tin oxide (ITO). However, such a conductive oxide may be included in the transistor structure 110, rather than in the via wiring 104 extending in the Z-direction. Moreover, the via wiring 104 and the transistor structure 110 may include another material, and so on.

Similarly, in the semiconductor memory devices according to the first embodiment and the second embodiment, the via wiring 106 functioning as the word line select line LW includes a conductive oxide such as indium tin oxide (ITO). However, such a conductive oxide may be included in the transistor structure 140, rather than in the via wiring 106 extending in the Z-direction. Moreover, the via wiring 106 and the transistor structure 140 may include another material, and so on.

Similarly, in the semiconductor memory devices according to the first embodiment and the second embodiment, the conductive layer 145 functioning as the drain electrode of the transistor TrL comprises the conductive layer 147 including a conductive oxide. However, such a conductive oxide may be included in the transistor structure 140, rather than in the conductive layer 145. Moreover, the conductive layer 145 and the transistor structure 140 may include another material, and so on.

Moreover, in the semiconductor memory devices according to the first embodiment and the second embodiment, the semiconductor layer 114 functioning as the channel region of the transistor TrC and the semiconductor layer 144 functioning as the channel region of the transistor TrL are provided facing both an upper surface and a lower surface of the gate electrode of these transistors. However, the semiconductor layers 114, 144 are not limited to this configuration, and may be provided facing either one of the upper surface and the lower surface of the gate electrode of these transistors.

Moreover, in the semiconductor memory devices according to the first embodiment and the second embodiment, lengths in the Z-direction of the connecting electrodes 160, 260 are larger than both of the length in the Z-direction of the conductive layer 120 and the length in the Z-direction of the conductive layer 146. However, in such cases as where, for example, the insulating layer 121 is not provided on upper and lower surfaces of the conductive layer 120, the lengths in the Z-direction of the connecting electrodes 160, 260 need not be larger than the length in the Z-direction of the conductive layer 120. Moreover, in such cases as where, for example, the conductive layer 147 is not provided on upper and lower surfaces of the conductive layer 146, the lengths in the Z-direction of the connecting electrodes 160, 260 need not be larger than the length in the Z-direction of the conductive layer 146.

Moreover, in the semiconductor memory devices according to the first embodiment and the second embodiment, both the insulating layer 121 provided on the upper and lower surfaces of the conductive layer 120 and the insulating layer 103 include silicon oxide ($SiO_2$). In such a case, in the step described with reference to FIGS. 73 and 74, the length in the Z-direction of the opening 160A (the distance in the Z-direction, of the two insulating layers 103 arranged in the Z-direction, at the opening 160A) will be larger than the lengths in the Z-direction of the conductive layer 120 and the insulating layers 121 provided on its upper and lower surfaces, and the length in the Z-direction of the conductive layer 145. However, for example, the insulating layer 121 and the insulating layer 103 may include different materials. In such a case, lengths in the Z-direction of the connecting electrodes 160, 260 need not be larger than the length in the Z-direction of the conductive layer 120 and the insulating layers 121 provided on its upper and lower surfaces, and the length in the Z-direction of the conductive layer 145.

Moreover, in the above description, there has been described an example where the capacitor CpC is adopted as the memory portion connected to the transistor structure 110. However, the memory portion need not be the capacitor CpC. For example, the memory portion may include a ferroelectric material, a ferromagnetic material, a chalcogen material of the likes of GeSbTe, or other materials, and may utilize characteristics of these materials to store data. For example, any of these materials may be included in an insulating layer between the electrodes forming the capacitor CpC, in any of the structures described above.

Moreover, the methods of manufacturing the semiconductor memory devices according to the first embodiment and the second embodiment, too, may be appropriately adjusted. For example, an order of any two of the above-mentioned steps may be switched, or any two of the above-mentioned steps may be simultaneously executed.

OTHERS

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a first memory layer separated from the substrate in a first direction intersecting a surface of the substrate; and
   a first via wiring and a second via wiring that extend in the first direction, and have different positions from each other in a second direction intersecting the first direction, wherein
   the first memory layer comprises:
   a first transistor which is electrically connected to the first via wiring;
   a memory portion which is electrically connected to the first transistor;
   a first wiring which is electrically connected to the first transistor, and extends in the second direction;
   a second transistor which is electrically connected to the second via wiring, and is electrically connected to the first wiring;
   a first electrode which is electrically connected to the second transistor; and
   a second electrode which is electrically connected to the first wiring and the first electrode, the first electrode includes a first conductive layer and a second conductive layer that are arranged in the first direction, the second conductive layer includes a conductive oxide, and a length of the second electrode in the first direction is larger than one or both of a length of the first wiring in the first direction and a length of the first conductive layer in the first direction.

2. The semiconductor memory device according to claim 1, wherein the memory portion is a capacitor.

3. The semiconductor memory device according to claim 1, wherein the first transistor comprises:

a first semiconductor layer which is electrically connected to the memory portion and the first via wiring;

a first gate electrode which is connected to the first wiring, and faces the first semiconductor layer; and a first gate insulating film which is provided between the first semiconductor layer and the first gate electrode, and the first semiconductor layer faces at least one of surfaces on one side or the other side in the first direction of the first gate electrode.

4. The semiconductor memory device according to claim 3, wherein the first semiconductor layer includes an oxide semiconductor.

5. The semiconductor memory device according to claim 3, wherein the first semiconductor layer includes: at least one element of gallium (Ga) or aluminum (Al); indium (In); zinc (Zn); and oxygen (O).

6. The semiconductor memory device according to claim 1, wherein the second transistor comprises:

a second semiconductor layer which is electrically connected to the first electrode and the second via wiring;

a second gate electrode which faces the second semiconductor layer; and a second gate insulating film which is provided between the second semiconductor layer and the second gate electrode, and the second semiconductor layer faces at least one of surfaces on one side or the other side in the first direction of the second gate electrode.

7. The semiconductor memory device according to claim 6, wherein the second semiconductor layer includes an oxide semiconductor.

8. The semiconductor memory device according to claim 6, wherein the second semiconductor layer includes: at least one element of gallium (Ga) or aluminum (Al); indium (In); zinc (Zn); and oxygen (O).

9. The semiconductor memory device according to claim 1, wherein the length of the second electrode in the first direction is larger than a length of first electrode in the first direction.

10. The semiconductor memory device according to claim 1, wherein the second electrode contacts the first conductive layer.

11. The semiconductor memory device according to claim 1 comprising:

a first connecting surface which is a connecting surface between the second electrode and the first wiring; and a second connecting surface which is a connecting surface between the second electrode and the first electrode, wherein the first connecting surface and the second connecting surface are arranged in the second direction.

12. The semiconductor memory device according to claim 1, wherein the second electrode comprises:

a first portion which is connected to the first wiring;

a second portion which is connected to the first electrode; and a third portion which is provided between the first portion and the second portion, and is connected to the first portion and the second portion, and a length of the third portion in a third direction intersecting the first direction and the second direction, is smaller than a length of the first portion in the third direction and a length of the second portion in the third direction.

13. The semiconductor memory device according to claim 1 comprising:

a first connecting surface which is a connecting surface between the second electrode and the first wiring; and a second connecting surface which is a connecting surface between the second electrode and the first electrode, wherein the first connecting surface and the second connecting surface are arranged in a third direction intersecting the first direction and the second direction.

14. The semiconductor memory device according to claim 1, wherein the conductive oxide is one of indium tin oxide, indium zinc oxide, ruthenium oxide, and iridium oxide.

15. A semiconductor memory device comprising:

a substrate;

a plurality of memory layers arranged in a first direction intersecting a surface of the substrate; and a first via wiring and a second via wiring that extend in the first direction, and have different positions from each other in a second direction intersecting the first direction, wherein the plurality of memory layers each comprise:

a first transistor which is electrically connected to the first via wiring;

a memory portion which is electrically connected to the first transistor;

a first wiring which is electrically connected to the first transistor, and extends in the second direction;

a second transistor which is electrically connected to the second via wiring, and is electrically connected to the first wiring;

a first electrode which is electrically connected to the second transistor; and a second electrode which is electrically connected to the first wiring and the first electrode, the first electrode includes a first conductive layer and a second conductive layer that are arranged in the first direction, the second conductive layer includes a conductive oxide, and a length of the second electrode in the first direction is larger than one or both of a length of the first wiring in the first direction and a length of the first conductive layer in the first direction.

16. The semiconductor memory device according to claim 15, wherein the length of the second electrode in the first direction is larger than a length of the first electrode in the first direction.

17. The semiconductor memory device according to claim 15, wherein the second electrode contacts the first conductive layer.

18. The semiconductor memory device according to claim 15, wherein the conductive oxide is one of indium tin oxide, indium zinc oxide, ruthenium oxide, and iridium oxide.

19. A semiconductor memory device comprising:

a substrate;

a first memory layer separated from the substrate in a first direction intersecting a surface of the substrate; and a first via wiring and a second via wiring that extend in the first direction, and have different positions from each other in a second direction intersecting the first direction, wherein the first memory layer comprises:

a first transistor which is electrically connected to the first via wiring;

a memory portion which is electrically connected to the first transistor;

a first wiring which is electrically connected to the first transistor, and extends in the second direction;

a second transistor which is electrically connected to the second via wiring, and is electrically connected to the first wiring; and an electrode which is electrically connected to the first wiring, and is electrically connected to the second transistor, and a length of the electrode in the first direction is larger than a length of the first wiring in the first direction.

20. The semiconductor memory device according to claim 19, wherein the conductive oxide is one of indium tin oxide, indium zinc oxide, ruthenium oxide, and iridium oxide.

* * * * *